US012787174B2

(12) United States Patent
Zeng et al.

(10) Patent No.: US 12,787,174 B2
(45) Date of Patent: Nov. 3, 2026

(54) INTEGRATED ASSEMBLY AND INTEGRATED POWER CONVERTER MODULE

(71) Applicant: MetaPWR Electronics Co., Ltd., Shanghai (CN)

(72) Inventors: Jianhong Zeng, Shanghai (CN); Mingzhun Zhang, Shanghai (CN); Qingdong Chen, Shanghai (CN); Xiaoni Xin, Shanghai (CN)

(73) Assignee: MetaPWR Electronics Co., Ltd., Shanghai (CN)

( * ) Notice: Subject to any disclaimer, the term of this patent is extended or adjusted under 35 U.S.C. 154(b) by 276 days.

(21) Appl. No.: 18/754,102

(22) Filed: Jun. 25, 2024

(65) Prior Publication Data

US 2024/0431029 A1 Dec. 26, 2024

(30) Foreign Application Priority Data

Jun. 26, 2023 (CN) ......................... 202310755049.7
Oct. 25, 2023 (CN) ......................... 202311388493.6

(51) Int. Cl.
*H05K 1/16* (2006.01)
*H05K 1/181* (2026.01)

(52) U.S. Cl.
CPC ............ *H05K 1/162* (2013.01); *H05K 1/181* (2013.01); *H05K 2201/10015* (2013.01); *H05K 2201/1003* (2013.01)

(58) Field of Classification Search
CPC .................... H05K 1/62; H05K 1/181; H05K 2201/10015; H05K 2201/1003
See application file for complete search history.

(56) References Cited

U.S. PATENT DOCUMENTS

2005/0024838 A1* 2/2005 Maxwell .............. H05K 1/0203 257/691
2009/0146760 A1* 6/2009 Reefman .............. H10D 84/212 333/184
2022/0132668 A1* 4/2022 Jin ......................... H05K 1/115

* cited by examiner

*Primary Examiner* — Rafael O Leon De Domenech
(74) *Attorney, Agent, or Firm* — JCIPRNET

(57) ABSTRACT

An integrated assembly and an integrated power converter module are disclosed. The integrated assembly includes an inductor assembly and a first capacitor assembly. The top surface of the integrated assembly is provided with an upper surface pin, and the bottom surface is provided with a lower surface pin; the inductor assembly includes a magnetic core and a main winding penetrating through the magnetic core from the top surface to the bottom surface thereof, the main winding is electrically connected with the upper and the lower surface pins, the surface of the magnetic core is provided with a capacitor setting area where the first capacitor assembly is arranged; the bottom surface of the electrode of the first capacitor assembly and the pin of the lower surface of the inductor assembly are coplanar, and the top surface of the first capacitor assembly and the surface of the magnetic core are electrically isolated.

24 Claims, 51 Drawing Sheets

INTEGRATED ASSEMBLY AND INTEGRATED POWER CONVERTER MODULE

CROSS-REFERENCE TO RELATED APPLICATION

This application claims the priority benefit of China application no. 202310755049.7, filed on Jun. 26, 2023, and China application no. 202311388493.6, filed on Oct. 25, 2023. The entirety of the above-mentioned patent application is hereby incorporated by reference herein and made a part of this specification.

BACKGROUND

Technical Field

In recent years, with the development of technologies such as data centers, artificial intelligence, supercomputers and the like, more and more ASIC with powerful functions are applied, such as a CPU, a GPU, a machine learning accelerator, a network switch, a server and the like, which consume a large amount of current, for example, the current reaches thousands of amperes, and the current requirements thereof rapidly jump. A voltage regulator module (VRM, Voltage Regulator Modules, ie, a power converter module according to the present application), comprising a buck circuit (Buck), is conventionally used to supply such a load.

Along with the progress of semiconductor technology, the voltage of these loads is lower and lower, and is now as low as 0.65V, and the current of the load is continuously increased. In the VRM module of low-voltage and high-current, how to improve the efficiency, how to improve the transient response capability and improve the power density to meet ASIC requirements is also a core problem designed by the VRM module.

Along with the continuous increase of the load current, the heat dissipation problem of the VRM module is a key problem needing to be considered at present. In the prior art, the VRM module shares the radiator with the load ASIC, so that the upward thermal resistance to the top surface is small. The switch device serving as a heat source is arranged on the top surface, and the filter inductor is arranged on the bottom surface; the input power current and the control signal need to be transmitted from the mainboard of the bottom surface to the switching device on the top surface, and the current sampling data of the working state of the top surface switching device and signals such as temperature sampling need to be transmitted to the mainboard of the bottom surface from the top surface; therefore, the output filtering inductance in the VRM module needs to integrate the power connector and the signal connector;

In the traditional power supply mode, the VRM module and the load CPU are arranged on the same side of the load mainboard and horizontally and adjacently placed, namely the horizontal power supply mode. In the power supply mode, the distance between the VRM module and the load CPU is long, and the impedance of the power distribution network PDN is large. When the load current becomes larger and larger, for example, when the load current is up to thousands of amperes, the loss on the PDN network is not ignored. In order to further improve the efficiency, the impedance of the PDN network needs to be reduced, and therefore, the other power supply mode is a vertical power supply mode. The vertical power supply mode is that the VRM module and the load CPU are vertically stacked on the front face and the back face of the load mainboard. The PDN path is greatly reduced, the efficiency is greatly improved, but the problem of vertical power supply is that the output voltage is directly connected with the load, and there is no space to arrange the output capacitor, so that the dynamic performance of the VRM module is seriously influenced;

Therefore, how to integrate the output capacitor in the VRM module and optimize the parasitic parameters of the circuit formed between the output capacitor and the load as much as possible, thereby improving the dynamic performance and reliability of the module is an urgent problem to be solved.

SUMMARY

According to the integrated power converter module, the output capacitor is integrated in the module, meanwhile, the parasitic parameters of the circuit formed between the output capacitor and the load are optimized, the height of the module is reduced as much as possible, and therefore the dynamic performance and reliability of the module are improved.

An integrated assembly comprises an inductor assembly and a first capacitor assembly;

- wherein a top surface pin is arranged on the top surface of the integrated assembly, a bottom surface pin is arranged on the bottom surface of the integrated assembly;
- wherein the inductor assembly comprises a magnetic core and a main winding passing through the magnetic core from the top surface to the bottom surface of the magnetic core; wherein one surface of the magnetic core is provided with a capacitor setting area. The first capacitor assembly is arranged in the capacitor setting area. The bottom surface of the electrode of the first capacitor assembly is coplanar with the bottom surface pin of the inductor assembly, and the top surface of the first capacitor assembly is electrically isolated from the surface of the magnetic core.

Preferably, wherein the capacitor setting area is arranged on the bottom surface of the magnetic core, the bottom surface of the electrode of the first capacitor assembly is coplanar with the bottom surface pin of the inductor assembly.

Preferably, wherein the integrated assembly further comprises a second capacitor assembly, the top surface of the magnetic core is provided with another capacitor arrangement area, and the second capacitor assembly is arranged in the capacitor arrangement area at the top surface of the magnetic core; the top surface of the electrode of the second capacitor component and the top surface pin of the inductor assembly are coplanar, the bottom surface of the second capacitor component is electrically isolated from the magnetic core, and the second capacitor component is electrically isolated from the main winding.

Preferably, wherein at least one first capacitor assembly is a layered capacitor, the layered capacitor comprises a first electrical pole plate, a second electrical pole plate and a dielectric layer which are stacked layer by layer, a hole groove is formed in the position, corresponding to the main winding, of the layered capacitor, the first electrical pole plate is electrically connected with a first electrical bonding pad arranged around the hole groove, the second electrical pole plate is electrically connected with a second electrical bonding pad arranged on at least one side face of the layered capacitor, and the dielectric layer is arranged between the first electrical pole plate and the second electrical pole plate.

Preferably, wherein the layered capacitor is arranged in the capacitor setting area in a manner of firstly sintering and forming and then assembling.

Preferably, wherein the layered capacitor is formed by in-situ sintering forming through a capacitor blank.

Preferably, the integrated assembly further comprises an integrated substrate, wherein the inductor assembly and the first capacitor assembly are buried in the integrated substrate, and the top surface pin and the bottom surface pin are arranged on the top surface and the bottom surface of the integrated substrate respectively.

Preferably, wherein the integrated substrate comprises a bottom wiring layer;

wherein the bottom wiring layer is used for rearranging bottom surface pins of the integrated assembly;

wherein the integrated substrate further comprises a vertical electrical connector, and/or a vertical electrical connector is arranged on the side face of the inductor assembly;

wherein one end of the vertical electrical connector is electrically connected to the bottom wiring layer;

at least a part of the vertical electrical connector is a power electrical connector; and at least a part of the vertical electrical connector is a signal electrical connector.

Preferably, wherein the first capacitor assembly is the output assembly, the output capacitor assembly is arranged on the bottom surface of the magnetic core, one electrode of the output capacitor assembly is electrically connected with the main windings through the bottom wiring layer.

Preferably, the integrated substrate comprises a top wiring layer and a bottom wiring layer; the integrated assembly further comprises a top assembly, the top assembly comprises a top plate and IPM unit;

wherein the top wiring layer is electrical connected with the top assembly, the bottom wiring layer is used for rearranging bottom surface pins of the integrated assembly;

wherein the integrated assembly further comprises a vertical electrical connector, and/or a vertical electrical connector is arranged on the side face of the inductor assembly;

wherein two ends of the vertical electrical connector are electrically connected to the top wiring layer and the bottom wiring layer.

Preferably, the integrated assembly comprises an insulated substrate, wherein one surface of the insulated substrate is adjacent to the capacitor setting area, the first capacitor assembly is arranged on the other surface of the insulated substrate; the insulated substrate comprises two holes, wherein the main winding penetrate the two holes; the insulated substrate is used for electrical insulation between the first capacitor assembly and the magnetic core.

Preferably, wherein the capacitor setting area is a concave, the concave is connected with one side surface of the magnetic core.

Preferably, wherein the concave is connected with two opposite surfaces of the magnetic core.

Preferably, the integrated substrate further comprises a vertical electrical connector, and/or a vertical electrical connector is arranged on the side face of the inductor assembly;

wherein the two ends of the vertical electrical connector have a top surface pin on the top surface of the magnetic core, and a bottom pin on the bottom surface of the magnetic core;

at least a part of the vertical electrical connector is a power electrical connector; and at least a part of the vertical electrical connector is a signal electrical connector.

Preferably, wherein the first capacitor assembly and the magnetic core are fixedly connected through adhesive glue.

Preferably, the integrated assembly further comprises at least one middle plastic package, wherein the middle plastic package covers at least a part of the surface of the inductor assembly and at least one first capacitor assembly, and the middle plastic package is provided with an electrical connection window at a position corresponding to an electrode of the inductor assembly and an electrode of the first capacitor assembly.

Preferably, the first capacitor assembly comprises an integrated silicon capacitor.

Preferably, the first capacitor assembly comprises a plurality of capacitor elements, and electrodes of the plurality of capacitor elements are arranged in a triangle staggered array.

Preferably, wherein the inductor assembly further comprises an auxiliary winding corresponding to the main winding, the auxiliary winding is arranged adjacent to the corresponding main winding side by side, the auxiliary winding is electrically isolated from the corresponding main winding and has magnetic coupling, and the auxiliary winding is used for realizing a TLVR technology.

Preferably, wherein the auxiliary winding and the main winding are respectively provided with a transverse detouring section, the auxiliary winding and the corresponding main winding have magnetic coupling in the transverse detour section, and the two ends of the auxiliary winding are arranged on the bottom surface of the magnetic core.

Preferably, wherein the end surface of the main winding located on the bottom face of the magnetic core is provided with a chamfer or a corner notch, and one end face of the corresponding auxiliary winding is arranged at the position close to the chamfer or the corner notch.

Preferably, a wiring conversion layer is further arranged on the bottom surface of the integrated assembly, and the wiring conversion layer is used for rearranging bottom pins of the integrated assembly; and the number of the main windings is two, and the auxiliary windings are connected in series through the wiring conversion layer to form a two-phase TLVR loop.

Preferably, the number of the main windings is two, the main windings are respectively provided with a transverse detour section, and when the direction from the top surface to the bottom surface of the magnetic core is the positive direction of the current, the current directions in the two transverse detour sections are opposite; the inductor assembly further comprises an auxiliary winding, the auxiliary winding is in a loop shape, at least two parts of the auxiliary winding are arranged adjacent to the two transverse winding sections side by side respectively, and the auxiliary winding is used for realizing a TLVR technology.

Preferably, further comprising a metal shielding layer, and the metal shielding layer is arranged on a side surface of the integrated assembly.

An integrated assembly comprises an inductor assembly and a bottom substrate unit; wherein a top surface pin is arranged on the top surface of the integrated assembly, a bottom surface pin is arranged on the bottom surface of the integrated assembly; the bottom substrate unit comprises a bottom substrate, a metal column and a first capacitor assembly;

wherein the inductor assembly comprises a magnetic core and a main winding passing through the magnetic core from the top surface to the bottom surface of the magnetic core; the inductor assembly is arranged on the top surface of the bottom substrate; the two electrodes of the first capacitor assembly are electrically connected with the metal column through the bottom substrate; the wiring in the bottom substrate enables the electrical network of the local or all of the pads on the lower surface of the bottom substrate to meet the up-down and one-to-one correspondence of the positions of the electrical network of the lower surface of the integrated substrate assembly.

Preferably, the metal column and the first capacitor assembly are arranged on the bottom surface of the bottom substrate, the plastic package covers the metal column and at least a part of the bottom surface of the bottom substrate; wherein bottom surface pins are formed by opening windows on a bottom surface of the plastic package and electric plating.

Preferably, the metal column and the first capacitor assembly are embedded in the bottom substrate, the bottom surface pins are respectively connected with the positive electrode and the negative electrode of the first capacitor and the metal column.

Preferably, the integrated assembly, further comprises a top assembly, wherein the top assembly comprises an intelligent power module (IPM) unit and a top plate, the top assembly is arranged on the top of the integrated assembly, the IPM unit is electrically connected with the main winding.

Preferably, the integrated assembly comprises a top plastic package, the top plastic package covers at least a part of the top surface of the top plate and the IPM unit.

Preferably, the top assembly further comprises a control unit, and the control unit is electrically connected with the IPM unit.

Preferably, a solder pad is arranged at the bottom of the integrated assembly, and at least a part of the solder pads corresponding to different electrical electrodes are alternately arranged in an array.

Preferably, the top assembly further comprises an second capacitor assembly and a top plastic package; the second capacitor assembly is arranged on the bottom surface of the top plate; the top plastic package wraps the top plate and the second capacitor assembly; and the second capacitor assembly and the IPM unit are electrically connected through a top plate.

Preferably, wherein the IPM unit is arranged on the top surface of the top plate, and the top plastic package covers the IPM unit.

Preferably, the IPM unit is embedded in the top plate.

Preferably, the bottom surface of the top plate is further provided with a power column pin, and the top plastic package further covers the power column pin; the bottom surface of the power column pin is exposed out of the plastic package, and the power column pin is used for electrical connection between the IPM unit and the integrated component.

Preferably, an electrical connection hole is formed in the plastic package, one end of the electrical connection hole is located on the bottom surface of the top plate, the other end of the electrical connection hole is located on the lower surface of the plastic package, a power electroplating pin is arranged in the electrical connection hole, and the power electroplating pin is used for electrical connection between the IPM unit and the integrated component.

Preferably, the second capacitor assembly comprises a plurality of ceramic capacitors.

Preferably, the second capacitor assembly comprises a plurality of semiconductor capacitors; the IPM unit is arranged on the top surface of the top plate, and the top plastic package further covers the IPM unit; and the IPM unit is a bare chip.

Preferably, the top assembly further comprises a top plate, an second capacitor assembly, an intelligent power module (IPM) unit and a top plastic package; wherein the second capacitor assembly comprises a ceramic capacitor and a semiconductor capacitor; the IPM unit and the semiconductor capacitor are arranged on the top surface of the top plate, and the ceramic capacitor is arranged on the bottom surface of the top plate; the top plastic package wraps the top plate, the IPM unit and the second capacitor assembly; the second capacitor assembly and the IPM unit are electrically connected through the top plate; and the ceramic capacitor and the semiconductor capacitor are used for forming multi-stage decoupling.

Preferably, the top assembly further comprises a top plate, an intelligent power module (IPM) unit and an second capacitor assembly; wherein the IPM unit is embedded in the upper portion of the top plate, and the second capacitor assembly is embedded in the lower portion of the top plate; the second capacitor assembly and the IPM unit are electrically connected by means of the top plate; and the IPM unit and the integrated assembly are electrically connected by means of the top plate.

An integrated power converter module is applied to a vertical power supply mode and comprises a top assembly, a middle assembly and a bottom assembly;

wherein the top assembly comprises an IPM unit;

wherein the middle assembly comprises an inductor assembly; the inductor assembly comprises a magnetic core, a main winding penetrating through the magnetic core from the top surface to the bottom surface of the magnetic core and a side surface electrical connector arranged on the side surface of the magnetic core;

wherein the bottom assembly comprises a bottom substrate, at least one first capacitor element and a plurality of metal conduction paths;

wherein the top surface of the middle assembly is electrically connected to the top assembly;

wherein the bottom surface of the middle assembly is electrically connected with the top surface of the bottom substrate, and the side surface electrical connector is electrically connected with the metal conduction path through a bottom substrate; the main winding is electrically connected with the second capacitor element through a bottom substrate;

wherein the bottom surface of the electrode of the second capacitor element and the bottom surface of one of the metal conduction paths are coplanar.

Preferably, the bottom assembly further comprises a bottom plastic package, wherein the bottom plastic package covers at least a part of the bottom surface of the bottom substrate, one of the metal conduction paths and the output capacitor element, and the bottom surface of the electrode of the first capacitor element and the bottom surface of one of the metal conduction paths are exposed out of the bottom plastic package.

Preferably, the integrated power converter module further comprises a double-sided plastic package, wherein the double-sided plastic package covers at least a part of the top assembly and at least a part of the bottom assembly, and the bottom surface of the first capacitor element and the bottom surface of one of the metal conduction paths are exposed out of the double-sided plastic package.

Preferably, wherein the first capacitor element and one of the metal conduction paths are embedded in the bottom substrate.

Preferably, the integrated power converter module further comprises an integrated substrate, wherein the middle assembly and the bottom assembly are embedded in the integrated substrate, and the top assembly is arranged on the top surface of the integrated substrate.

Preferably, the top assembly further comprises a top plastic package covering at least a part of the top surface of the IPM unit and the integrated substrate.

Preferably, the integrated substrate comprises a top wiring layer, wherein a bottom wiring layer, and a vertical electrical connector;

wherein the top wiring layer is electrically connected to the top assembly, and the bottom wiring layer is used for rearranging the bottom pins of the integrated power converter module; two ends of the vertical electrical connector are respectively electrically connected to the top wiring layer and the bottom wiring layer; and at least a part of the vertical electrical connector is a signal electrical connector.

Preferably, the inductor assembly further comprises an auxiliary winding corresponding to the main winding, wherein the auxiliary winding is arranged adjacent to the corresponding main winding side by side, the auxiliary winding is electrically isolated from the corresponding main winding and has magnetic coupling, and the auxiliary winding is used for realizing a TLVR technology.

Preferably, the auxiliary winding and the main winding are respectively provided with a transverse detouring section, wherein the auxiliary winding and the corresponding main winding have magnetic coupling in the transverse detour section, and the two ends of the auxiliary winding are arranged on the bottom face of the magnetic core; and the number of the main windings is two, and the auxiliary windings are connected in series through the bottom assembly to form a two-phase TLVR loop.

Preferably, the number of the main windings is two, the main windings are respectively provided with a transverse detour section, and when the direction from the top face to the bottom face of the magnetic core is the positive direction of the current, the current directions in the two transverse detour sections are opposite; the inductor assembly further comprises an auxiliary winding, the auxiliary winding is in a loop shape, at least two parts of the auxiliary winding are arranged adjacent to the two transverse winding sections side by side respectively, and the auxiliary winding is used for realizing a TLVR technology.

Preferably, the bottom of the integrated power converter module is provided with a solder pad, and at least a part of the solder pads corresponding to different electrical electrodes are alternately arranged in an array.

Preferably, a metal conduction path is a conductive hole which is formed by plastic packaging on the bottom assembly, drilling a hole and then electroplating on a wall of the hole.

An integrated power converter module comprises a top assembly and a middle assembly:

wherein the top assembly comprises an IPM unit;

wherein the middle assembly comprises an inductor assembly, a plastic package and at least one middle capacitor assembly;

wherein the middle capacitor assembly comprises an capacitor assembly;

wherein the top surface of the middle assembly is electrically connected to the top assembly;

wherein the inductor assembly comprises a magnetic core and a main winding passing through the magnetic core from the top surface to the bottom surface of the magnetic core;

wherein the capacitor assembly is fixed above the inductor assembly through a plastic package body, an electrode of the capacitor assembly is exposed out of the surface of the plastic package, the main winding is electrically connected with the top assembly, and the capacitor assembly is electrically connected with the top assembly.

Preferably, an external electrode is further arranged on the top surface of the inductor assembly, one end of the external electrode is exposed out of the surface of the plastic package and is flush with the electrode of the capacitor assembly, and the main winding is electrically connected with the top assembly through an external electrode.

Preferably, the upper end of the main winding penetrates through the plastic package from the top surface of the magnetic core and is exposed out of the surface of the plastic package, and the upper end of the main winding is flush with the electrode of the capacitor assembly.

Preferably, the capacitor assembly comprises a plurality of capacitor elements, wherein one electrode of the capacitor element is exposed out of the surface of the plastic package, and the other electrode of the capacitor element is led out to the surface of the plastic package through an opening in the plastic package.

Preferably, the capacitor assembly comprises a plurality of capacitor elements, and the capacitor elements are fixedly connected with the magnetic core through glue; and the capacitor assembly is levelled through a carrier before plastic packaging.

Preferably, wherein the capacitor assembly is the second capacitor assembly, the middle capacitor assembly further comprises a first capacitor assembly, the first capacitor assembly is fixed below the inductor assembly through a plastic package, and an electrode of the first capacitor assembly is exposed out of the surface of the plastic package.

Preferably, the second capacitor assembly and the first capacitor assembly respectively comprise a plurality of capacitor elements, and the capacitor elements are fixedly connected with the magnetic core through glue; the second capacitor assembly and the first capacitor assembly are fixed through primary plastic packaging; the second capacitor assembly is levelled through a carrier before plastic packaging; and the first capacitor assembly is levelled through a carrier before plastic packaging.

Compared with the prior art, the application has the following beneficial effects:

1. the output capacitor is integrated in the power converter module, meanwhile, the path length of the output capacitor to an external load circuit is reduced as much as possible, parasitic parameters of the power converter module can be optimized through the structure and layout design, and the dynamic performance of the power converter module in a vertical power supply mode is improved;
2. According to the application, a relatively high input capacitor is moved from the top assembly to the middle assembly, that is, firstly, the input capacitor is integrated with the inductance assembly, so that the IPM unit, the control unit and other devices of the top assembly can use thinner devices under the condition of not losing performance, so that the occupied space is reduced, heat dissipation is facilitated, and under the condition that other conditions are not changed, the height of the module can be reduced, so that the power density of the power converter module is improved, or more height space is provided for the magnetic core under the condition that the overall height is not changed, and the performance of the power converter module is improved; meanwhile, the path length of an electric loop from the input capacitor to the IPM unit is reduced, and the parasitic inductance is reduced, so that the switching loss is reduced;

3. According to the embedded process of the integrated substrate, the welding frequency can be reduced, the process is simplified, meanwhile, the reliability is improved, and the reliability of the plastic package treatment protection welding spot can also be improved.

DESCRIPTION OF THE EMBODIMENTS

Figure 1:
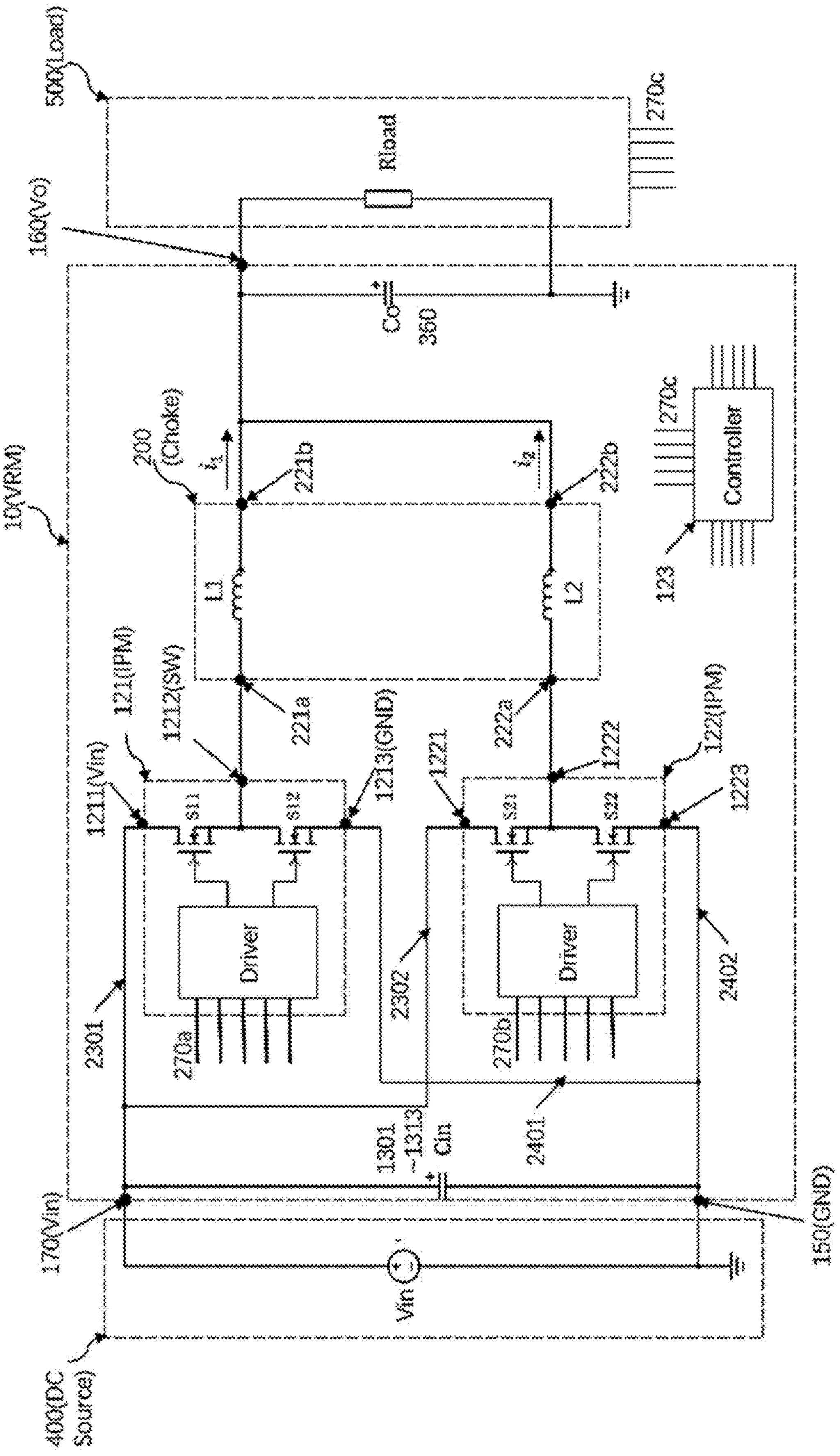
FIG. 1 (Prior art)
FIG. 1 is a circuit diagram of a two-phase VRM module in the prior art.

The present application discloses various embodiments or examples of implementing the thematic technological schemes mentioned. To simplify the disclosure, specific instances of each element and arrangement are described below. However, these are merely examples and do not limit the scope of protection of this application. For instance, a first feature recorded subsequently in the specification formed above or on top of a second feature may include an embodiment where the first and second features are formed through direct contact, or it may include an embodiment where additional features are formed between the first and second features, allowing the first and second features not to be directly connected. Additionally, these disclosures may repeat reference numerals and/or letters in different examples. This repetition is for brevity and clarity and does not imply a relationship between the discussed embodiments and/or structures. Furthermore, when a first element is described as being connected or combined with a second element, this includes embodiments where the first and second elements are directly connected or combined with each other, as well as embodiments where one or more intervening elements are introduced to indirectly connect or combine the first and second elements.

FIG. 1 shows a circuit structure of a two-phase VRM module in the prior art, and a person skilled in the art can also obtain the basic circuit structure of the VRM module with other phases by analogy. A complete two-phase VRM module 10 includes IPM units 121/122; the two-phase inductor 200 (Choke and the two main windings L1/L2 of the two-phase inductor 200 can have magnetic coupling or do not have magnetic coupling); the VIN electrical connector 2301/2302 and the VIN electrical connector 2301/2302 are connected in parallel and then connected to the input positive terminal of the VRM module 10 (in application, the input positive terminal is externally connected to an input power supply 400, (ie, a DC Source), that is, the Vin end 170; the GND electrical connector 2401/2402 and the GND electrical connector 2401/2402 are connected in parallel and then connected to the input negative terminal of the VRM module 10, namely the GND end 150; the input capacitor 1301-1313 (Cin) is bridged between the input positive terminal and the input negative terminal, the input capacitor 1301-1313 is used for bypassing the ripple current of the high-frequency switch, and it is ensured that the input voltage is stable; and the signal electric connector 270*a*/*b c* is used for driving signals such as control and the like; the signal electrical connector 270 A B is used for connecting the control unit 123 (Controller) and the IPM unit 121/122, and the signal electrical connector 270*c* is used for connecting between the control unit 123 and the load (Load, and the equivalent resistance is Rload; and the load is usually a CPU, a GPU and the like, and usually has powerful data processing and communication capability); and the signal electrical connector 270*c* can also be used for communication connection between the control unit 123 and the IC of the upper computer; the IPM unit 121 comprises two switching devices and a driver, the two switching devices are a high-end MOSFET and a low-end MOSFET respectively, and the two MOSFETs are connected in series to form a bridge arm; and one end of the bridge arm is connected with the VIN end 170; and the other end of the bridge arm is connected with the GND end 150. The structure of the IPM unit 122 is the same as that of the IPM unit 121; and the voltage waveform phase difference of bridge arm middle points 1212/1222 (SW, also referred to as a switching point) of the bridge arm of the IPM unit 121/122 satisfies 180 degrees and is respectively connected to the input ends 221*a*/222*a* of the two-phase inductor 200. The output end 221*b*/222*b* of the two-phase inductor 200 is connected in parallel to form the output positive terminal of the VRM module 10, that is, the VO end 160 is electrically connected to the load (in some other embodiments, the output end 221*b*/222*b* may also not be connected in parallel or not in the two-phase VRM module 10) to provide energy to the load; and the output capacitor 360 (Co) is connected in parallel to both ends of the load and is used for filtering the voltage at the two ends of the load and providing transient energy required by the load. In some comparative examples of the prior art, the output capacitor 360 is arranged outside the two-phase VRM module 10; and the integrated power converter module (the phase number is 2) is a two-phase VRM module) the IPM unit 121/122, the two-phase inductor 200, the VIN electrical connector 2301/2302, the GND electrical connector 2401/2402, and the signal electrical connector 270*a*/*b*/*c* are integrated together to form an integrated assembly, and the output capacitor 360 is also integrated therein; in some embodiments of the present application, the input capacitors 1301-1313 or a portion thereof are also integrated together.

Embodiment 1

Figure 2A:
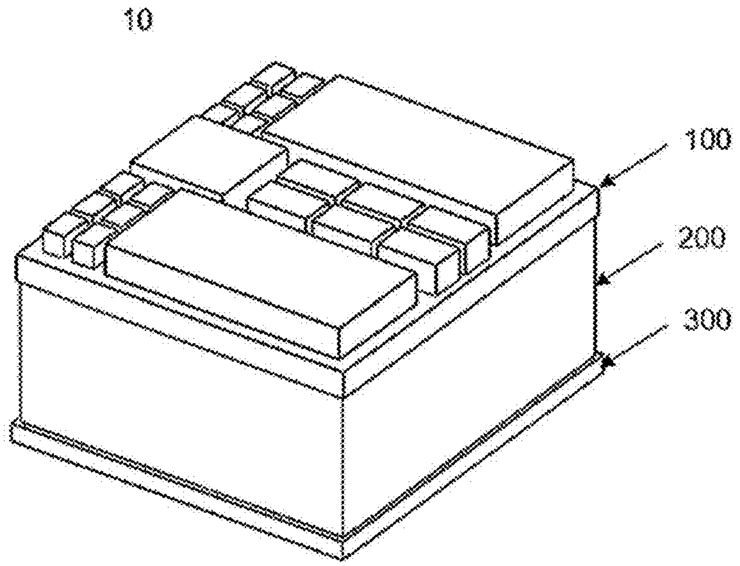
FIG. 2A to FIG. 2K are schematic structural diagrams according to a first Embodiment.
Figure 2B:
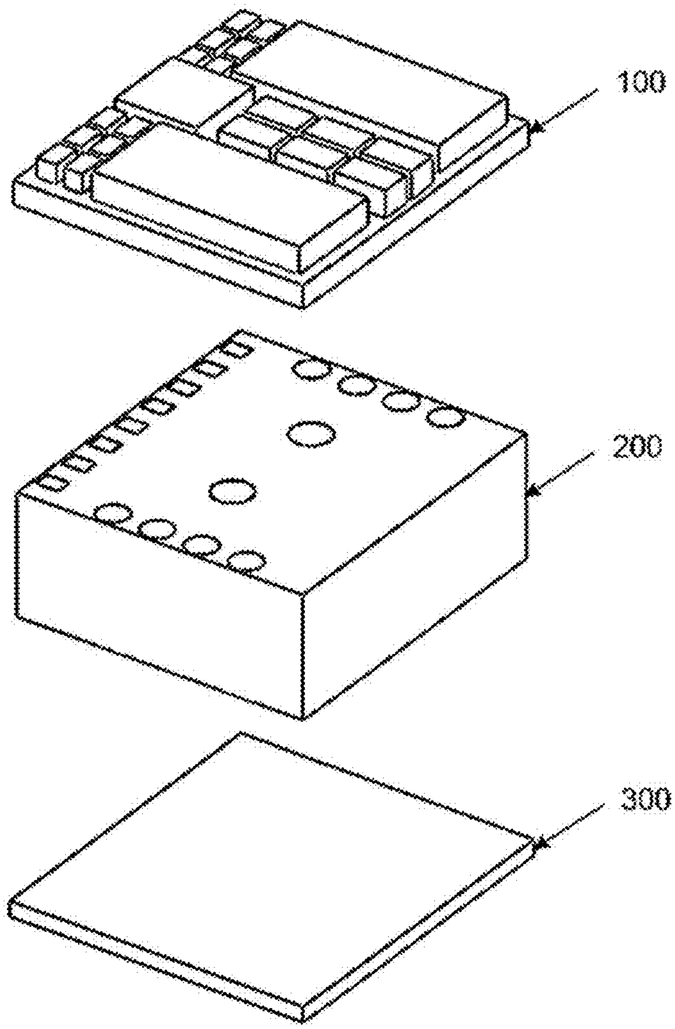
Figure 2C:
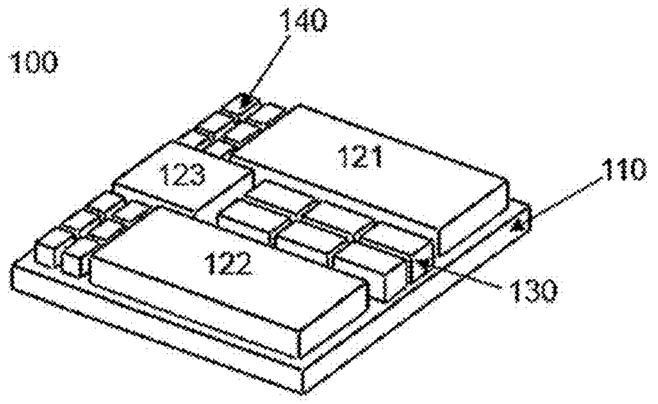

FIG. 2A shows an overall structure of the integrated power converter module according to Embodiment 1 of the present application, and FIG. 2B is an exploded view of FIG. 2A. As shown in FIG. 2A and FIG. 2B, the two-phase VRM module 10 of the embodiment comprises a top assembly 100, a middle assembly 200 and a bottom assembly 300; and FIG. 2C is a schematic structural diagram of the top assembly 100 in FIG. 2B. The top assembly 100 comprises a top plate 110, an IPM unit 121/122, a control unit 123, an input capacitor 130 and other passive elements 140; and the IPM unit 121/122 is arranged at a position close to the first side edge of the top plate 110; and a signal pin of the IPM unit 121/122 is arranged in a direction opposite to the first side edge, that is, a position close to the third side edge (corresponding to a third side surface of the middle assembly 200). The control unit 123 controls the two IPM units 121/122, so that the control unit 123 is arranged at a position close to the intersection of the middle line between the IPM units 121/122 and the third side edge (in some other embodiments, the control unit can also control more IPM units and is arranged at the layout center position of the corresponding IPM unit). The input capacitor 130 and the other passive elements 140 need to be close to the IPM unit 121/122 to achieve a good filtering effect, and therefore, the other passive elements 140 are arranged on the third side edge, and the input capacitor 130 is arranged between the IPM units 121/122.

In a preferred embodiment, the control unit 123 and the control unit 121 or 122 of the IPM unit can be integrated into one package or a wafer, so that the number of devices of the top component 100 is reduced, and the layout is simpler.

Figure 2D:
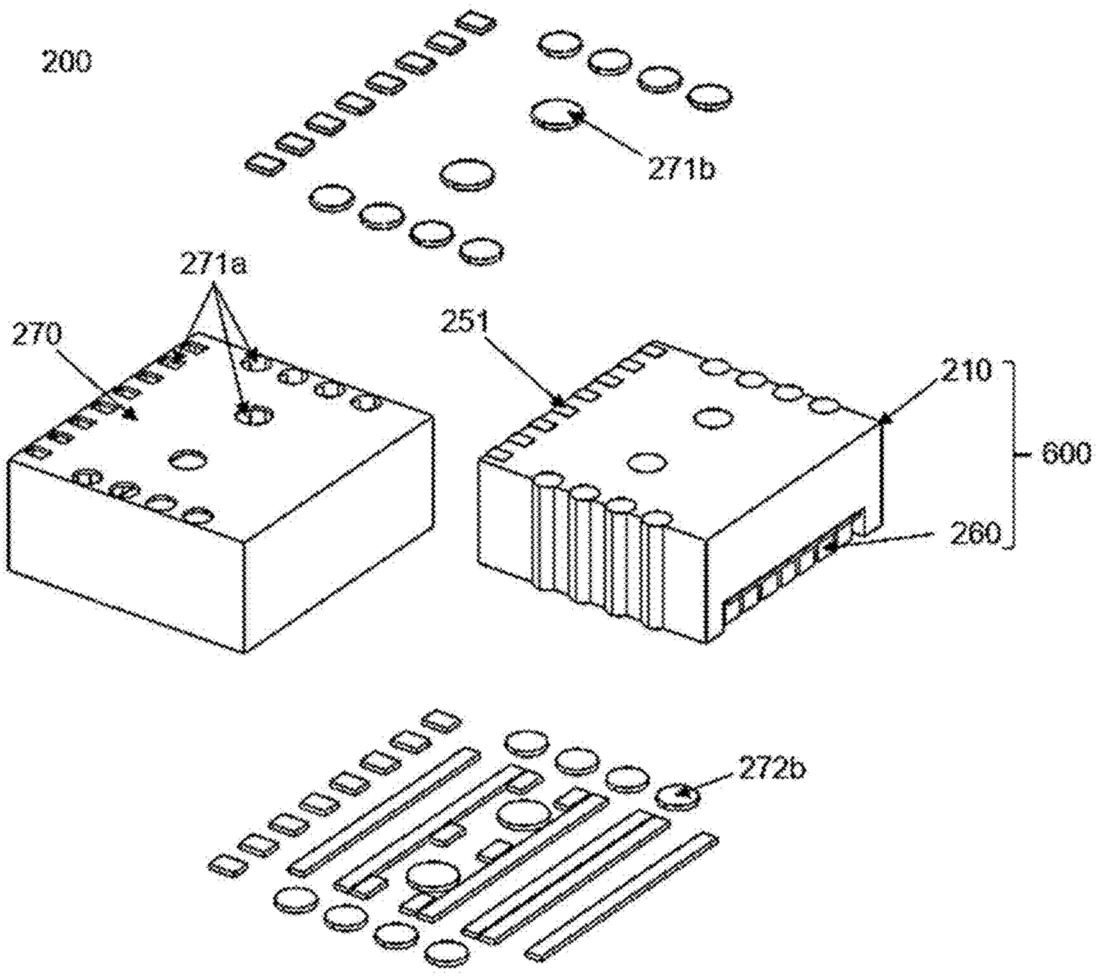

FIG. 2D is a structural exploded view of the middle assembly 200; as shown in FIG. 2D, the middle assembly 200 is formed by plastic packaging of the integrated assembly 600. An electrical connection window 271*a* is formed on the top surface and the bottom surface of the formed plastic package body 270 in a laser direct writing mode, and electrodes of the integrated assembly 600 are exposed; the electrodes are subjected to weldability treatment in an electroplating mode and the like to form the bonding pads 271 *b*/272*b*; and the middle assembly 200 can be reliably welded with the top assembly 100 and the bottom assembly 300. The integrated assembly 600 comprises an inductor assembly 210 and an output capacitor assembly 260. The inductor assembly 210 not only integrates the magnetic material of the two-phase inductor 200 shown in FIG. 1 and the two main windings L1 and L2 thereof, but also integrates the VIN electrical connector 2301/2302, the GND electrical connector 2401/2402, and the signal electrical connector 270*c* shown in FIG. 1, wherein the signal electrical connector 270*c* is integrated on the side of the inductor assembly 210 in an electroplating manner, specifically as shown in the signal electrical connector 251. The output capacitor assembly 260 integrates a plurality of capacitors to realize the function of the output capacitor 360 shown in FIG. 1.

Figure 2E:
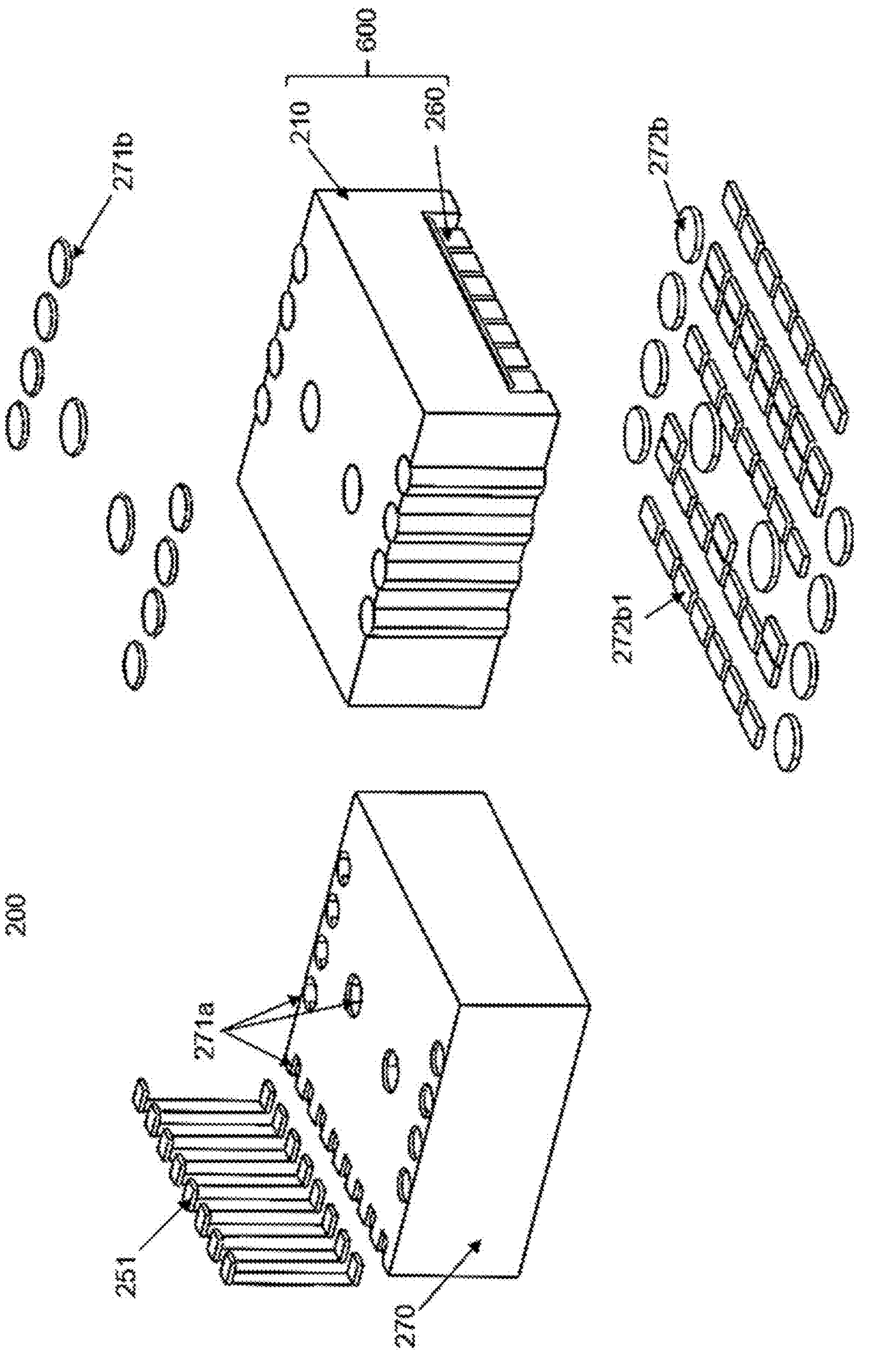

In a preferred embodiment, as shown in FIG. 2E, after the signal electrical connector 251 is plastically packaged in the integrated assembly 600, the third side surface of the middle assembly 200 is formed by means of electroplating, specifically as shown in the signal electrical connector 251; and the capacitor electrodes with different electrical properties in the output capacitor assembly 260 are connected to the load in a two-dimensional alternate arrangement mode, namely, the VO end 160 and the GND end 150 of the corresponding FIG. 1 are alternately arranged, so that the parasitic inductance of the electrical loop formed by the output capacitor and the load is reduced, and the dynamic performance of the output voltage of the VRM module 10 is improved.

Figure 2F:
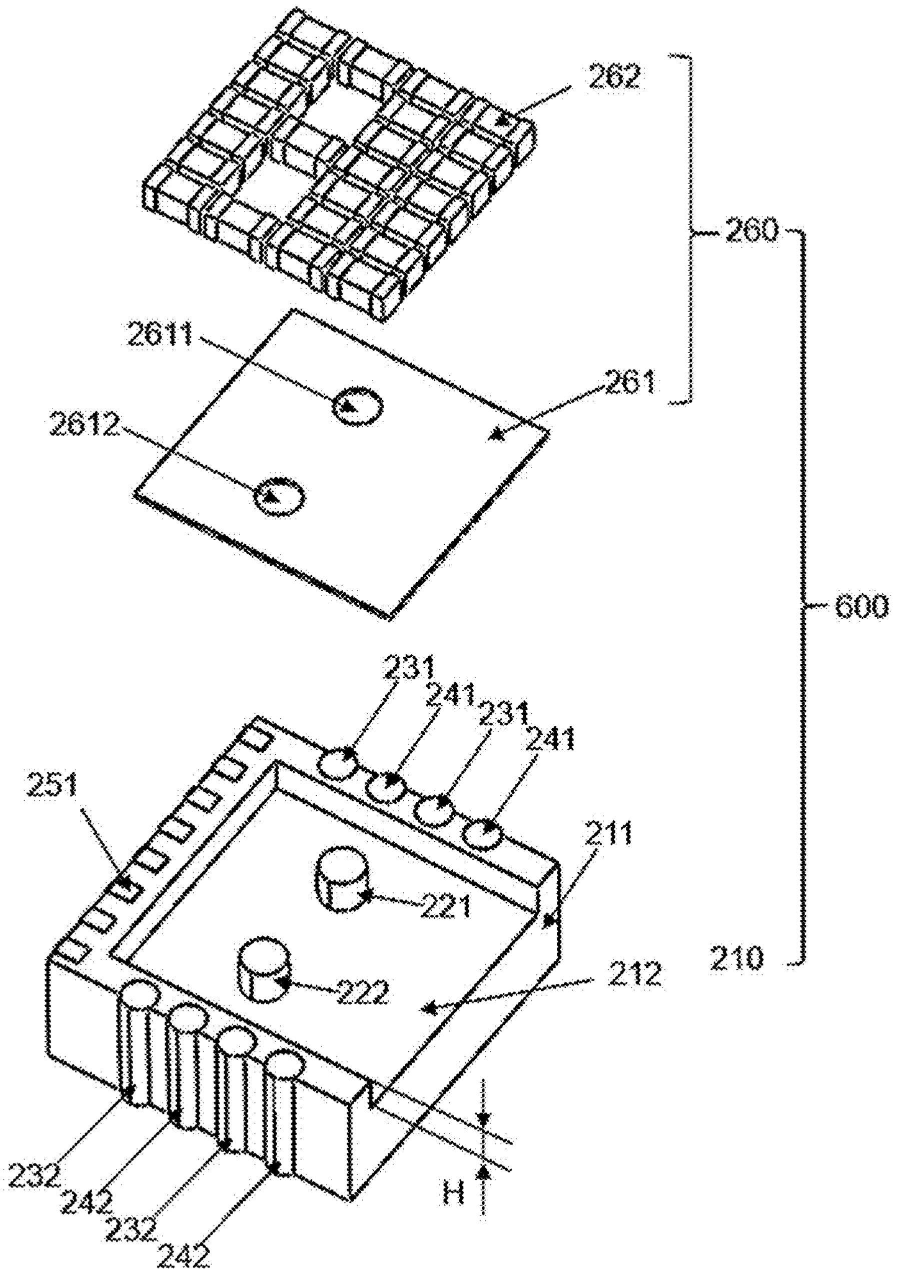

The integrated assembly 600 comprises an inductor assembly 210 and a capacitor assembly 260; FIG. 2F is a structural exploded view of the integrated assembly 600 of FIG. 2D, and FIG. 2F is mirrored in the vertical direction with respect to FIGS. 2A-2D, that is, FIG. 2F mainly shows the bottom structure of the integrated assembly 600, and the corresponding relationship in the horizontal direction is unchanged; as shown in FIG. 2F, the output capacitor assembly 260 comprises a substrate 261 and a capacitor element 262, wherein the capacitor element 262 corresponds to the output capacitor 360 of FIG. 1; The substrate 261 has an insulating function, such as a ceramic substrate, and two through holes 2611/2612 are formed in the middle of the substrate 261; and the main winding 221/222 passing through the through hole 2611/2612 is electrically connected to the VO+ PAD of the bottom assembly 300, that is, the main winding L1/L2 corresponding to FIG. 1 is electrically connected to the VO end 160. The main winding 221/222 matching through hole 2611/2612, and also plays a role in positioning and limiting the output capacitor assembly 260. The capacitor element 262 of the present embodiment is a plurality of SMD capacitors, the capacitor element 262 is fixed on the substrate 261 by means of an adhesive, and the capacitor element 262 is electrically isolation from the magnetic core 211. Due to the existence of the substrate 261, the capacitor element 262 can be attached to the substrate 261 through the automatic surface mount, the bonding and fixing time of the capacitor element 262 and the substrate 261 is greatly shortened, the bonding and fixing time between the capacitor element 262 and the magnetic core 211 is further shortened, and the production efficiency is improved. An electrode of the capacitor element 262, that is, the VO end 160 and the GND end 150 corresponding to FIG. 1 are electrically connected with the VO+ PAD and the VO− PAD of the bottom assembly 300 respectively. The bottom assembly 300 is a bottom wiring interposer board and is used for rearranging the bottom pins of the VRM module 10 so as to meet the requirements of industrial standardized pins or customer customized packaging pins. Due to the fact that the capacitor element 262 is located between the inductor assembly 210 and the bottom assembly 300, the capacitor element 262 is closer to the load to reduce parasitic parameters with the load circuit; and when the load current rapidly changes, the capacitor element 262 can quickly provide energy for the load, so that the stability of the output voltage is ensured, and the dynamic performance of the output voltage of the VRM module 10 is improved.

The inductor assembly 210 comprises a magnetic core 211, a main winding 221/222, a first power electrical connector 231/232, a second power electrical connector 241/242, and a signal electrical connector 251; wherein the main winding 221/222 corresponds to the main winding L1/L2 of FIG. 1, the first power electrical connector 231/232 corresponds to the Vin electrical connector 2301/2302 of FIG. 1, the second power electrical connector 241/242 corresponds to the GND electrical connector 2401/2402 of FIG. 1, the signal electrical connector 251 corresponds to the signal electrical connector 270*c* shown in FIG. 1. The main winding is a first winding, and the main winding 222 is a second winding; the first winding and the second winding are both I-shaped copper columns, and the two ends of the first winding and the second winding are arranged on the top surface and the bottom surface of the magnetic core 211 respectively. The direct-current impedance of the "I"-shaped copper column winding is low, the direct-current conduction loss is low, the efficiency can be effectively improved, and the efficiency under heavy load is particularly improved; and meanwhile, the cylindrical winding enables the magnetic flux generated by the current in the cylindrical winding to have the shortest magnetic flux path, so that the inductance is improved, and the loss of the magnetic core is reduced; and the efficiency under light load is improved.

The main winding 221/222 is provided with a first bonding pad on the top surface of the magnetic core 211 and is used for connecting the SW PAD of the IPM unit 121/122 in the top component, and the main winding 221/222 is provided with a second bonding pad on the bottom surface of the magnetic core 211 for connecting a load through the bottom component 300 and supplying power to the load. The first bonding pad and the second bonding pad are not shown in FIG. 2F. The position of the SW Pad is perpendicular to the position of the main winding 221/222, so that the loss caused by the transverse current can be reduced, and the efficiency is improved.

The first power electrical connector 231/232 and the second power electrical connector 241/242 are both I-shaped copper cylinder, which are similar to the main winding 221/222. The two ends of the first power electrical connector 231/232 are respectively provided with a first bonding pad and a second bonding pad (not shown in FIG. 2F). Similarly, the direct-current impedance of the I-shaped copper cylinder is low, the direct-current conduction loss is low, and the efficiency is favorably improved. Meanwhile, the I-shaped copper cylinder is easy to be integrally formed with the magnetic core 211, the manufacturing process is simplified, and the reliability is improved.

The first power electrical connector 231/232 corresponds to the VIN electrical connector 2301/2302 of FIG. 1; the second power electrical connector 241/242 corresponds to the GND electrical connector 2401/2402 of FIG. 1. With reference to FIG. 1, there is a parasitic inductance in a power input loop formed by the VIN electrical connector 2301/2302, the IPM unit 121/122 and the GND electrical connector 2401/2402; and the presence of the parasitic inductance can form resonance with the input capacitor Cin. If the resonant frequency is close to the equivalent switching frequency of the VRM, the current amplitude of the parasitic inductor is increased, the normal work of the VRM module can be interfered, and the efficiency of the power circuit is reduced (if the PWM phase of the IPM unit 121/122 is the same, the equivalent working frequency of the two-phase voltage reduction circuit is equal to the switching frequency of the IPM; and if the PWM phase of the IPM unit 121/122 is staggered with 180 degrees, the equivalent working frequency is equal to twice the switching frequency of the IPM). In this embodiment, as shown in FIG. 2F, the first power electrical connector 231/232 and the second power electrical connector 241/242 are alternately arranged, reducing the parasitic inductance of the power input loop; the resonant frequency between the parasitic inductance and Cin is improved, so as to be far higher than the equivalent switching frequency of the VRM module, so that the influence of oscillation on the efficiency of the VRM module is reduced, and the efficiency is improved; and the first power electrical connector 231 is formed by connecting two I-shaped copper columns in parallel (the first power electrical connector 232 and the second power electrical connector 241/242 are similar), the direct-current impedance of the first power electrical connector 231 can be reduced, and the efficiency is further improved.

The bottom of the magnetic core 211 is provided with a concave, and the concave (after deducting the space occupied by the main winding 221/222) is a capacitor setting area 212; and the output capacitor assembly 260 and the magnetic core 211 can be fixed through adhesive glue, and the bottom surface of the electrode of the capacitor element 262 of the output capacitor assembly 260 and the bottom surface of the electrode of the inductor assembly 210 are coplanar so as to meet the requirements of the subsequent plastic packaging process and the flatness of the electrode. On the whole, after the inductor assembly 210 and the output capacitor assembly 260 are glued together, the inductor assembly 210 and the output capacitor assembly 260 are plastically packaged together through the plastic packaging material, and an SMD pin is further generated on the surface of the plastic package body through windowing or electroplated, so that the integrated assembly 600 is changed into one packaged whole. On one hand, the reliability of the product is greatly improved, on the other hand, the flatness of the SMD pin is greatly improved, and the welding quality of the integrated assembly 600 is improved.

In a preferred embodiment, the plastic packaging process can also be processed with the electrode surface of the capacitor assembly 260 and the bottom surface of the inductor assembly 210 to be simultaneously placed on one horizontal plane for plastic packaging, and the output capacitor assembly 260 and the magnetic core 211 do not need to be fixed in advance through the adhesive glue. After plastic packaged, the electrode of the capacitor element 262 and the bottom surface electrode of the inductor assembly 210 can be better kept on the same horizontal plane, and the gap between the output capacitor assembly 260 and the inductor assembly 210 is filled and bonded by means of the plastic packaging material.

In a preferred embodiment, only the steps of adhering the inductor assembly 210 and the output capacitor assembly 260 together can be reserved, and the plastic packaging process is omitted, so that the cost is reduced.

Figure 2G:
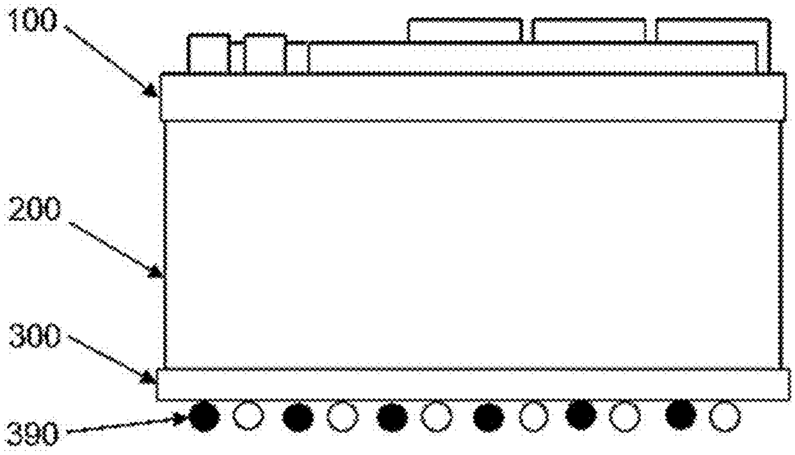

In a preferred embodiment, as shown in FIG. 2G, the bottom surface of the bottom assembly 300 can form a solder ball 390 by means of ball planting, thereby forming a BGA package; wherein the solid dots represent solder balls 390 corresponding to VO ends 160 of FIG. 1, and the hollow dots represent solder balls 390 corresponding to GND terminals 150 of FIG. 1. The welding ball corresponds to an electrical network formed by alternately arranging the VO end 160 and the GND end 150, and an electrical network corresponding to the output capacitor assembly 260 and corresponding to the VO end 160 and the GND end 150 is alternately arranged, so that a corresponding position relationship between the VO end 160 and the GND end 150 is met, the inductance of the parasitic inductance between the electrode of the capacitor element 262 and the welding ball 390 is reduced, and the dynamic performance of the module is further improved. In another preferred embodiment, the bottom surface of the bottom assembly 300 may also form an LGA package.

Figure 2H:
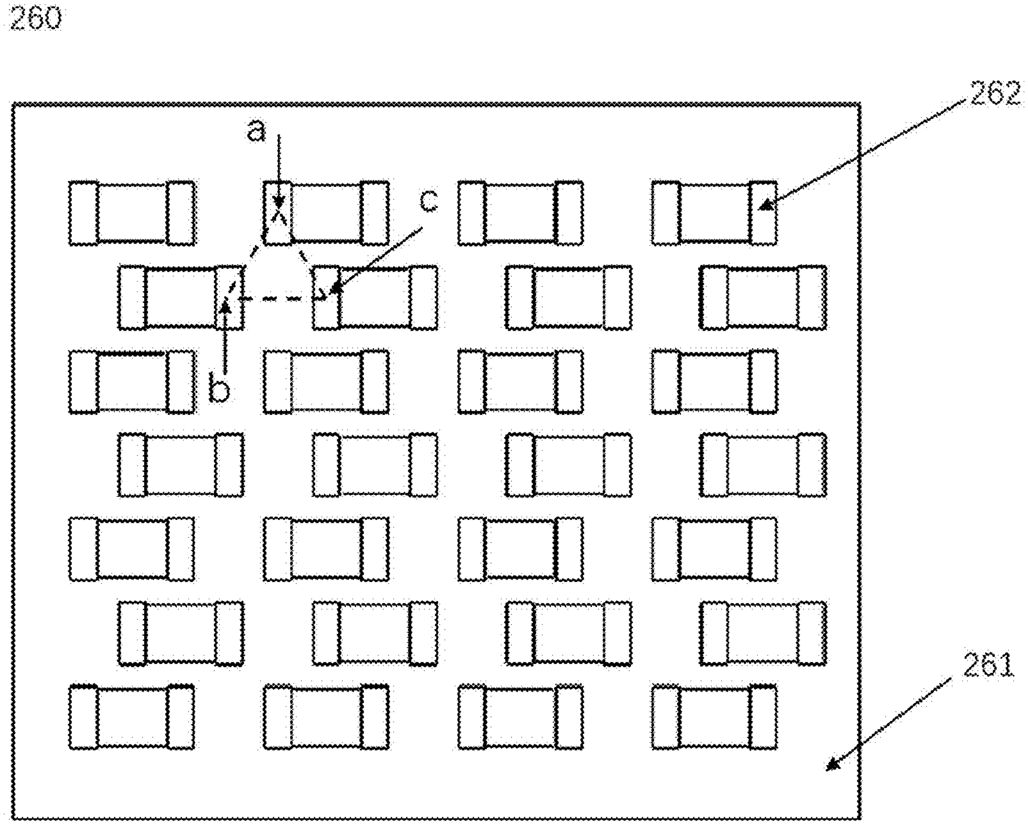

In a preferred embodiment, as shown in FIG. 2H, the electrodes of the output capacitor assembly 260 are arranged in an array of a plurality of common sides, specifically, the distance between the three electrodes a, b and c in the figures are equal, and ab is equal to the ca and bc to form a regular triangle. A plurality of such regular triangles can be found in the electrode of the output capacitor assembly 260, and the two sides of the regular triangles are coplanar. The electrode electrical network of the further output capacitor assembly 260 meets the alternative arrangement of the VO end 160 and the GND end 150, so that the pins of the bottom surface of the capacitor element 262 and the bottom surface of the bottom assembly 300 can meet the up-down one-to-one corresponding position relationship, so that the parasitic inductance theory of the path between the electrode of the capacitor element 262 and the load is minimized, and the optimal dynamic performance is achieved.

Figure 2I:
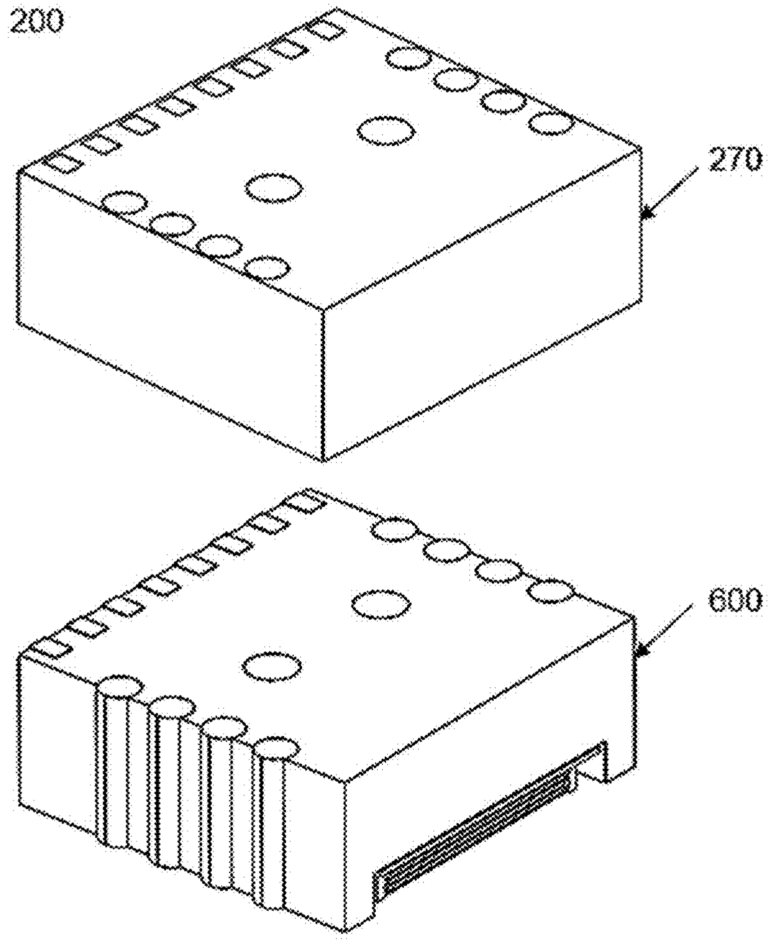
Figure 2J:
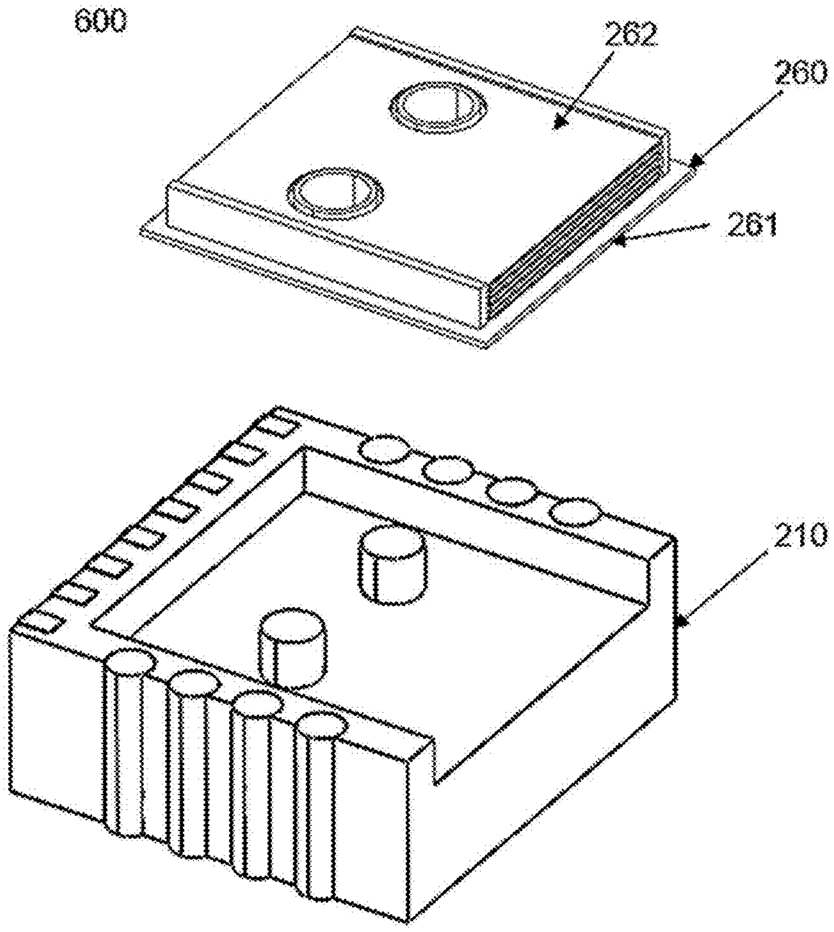
Figure 2K:
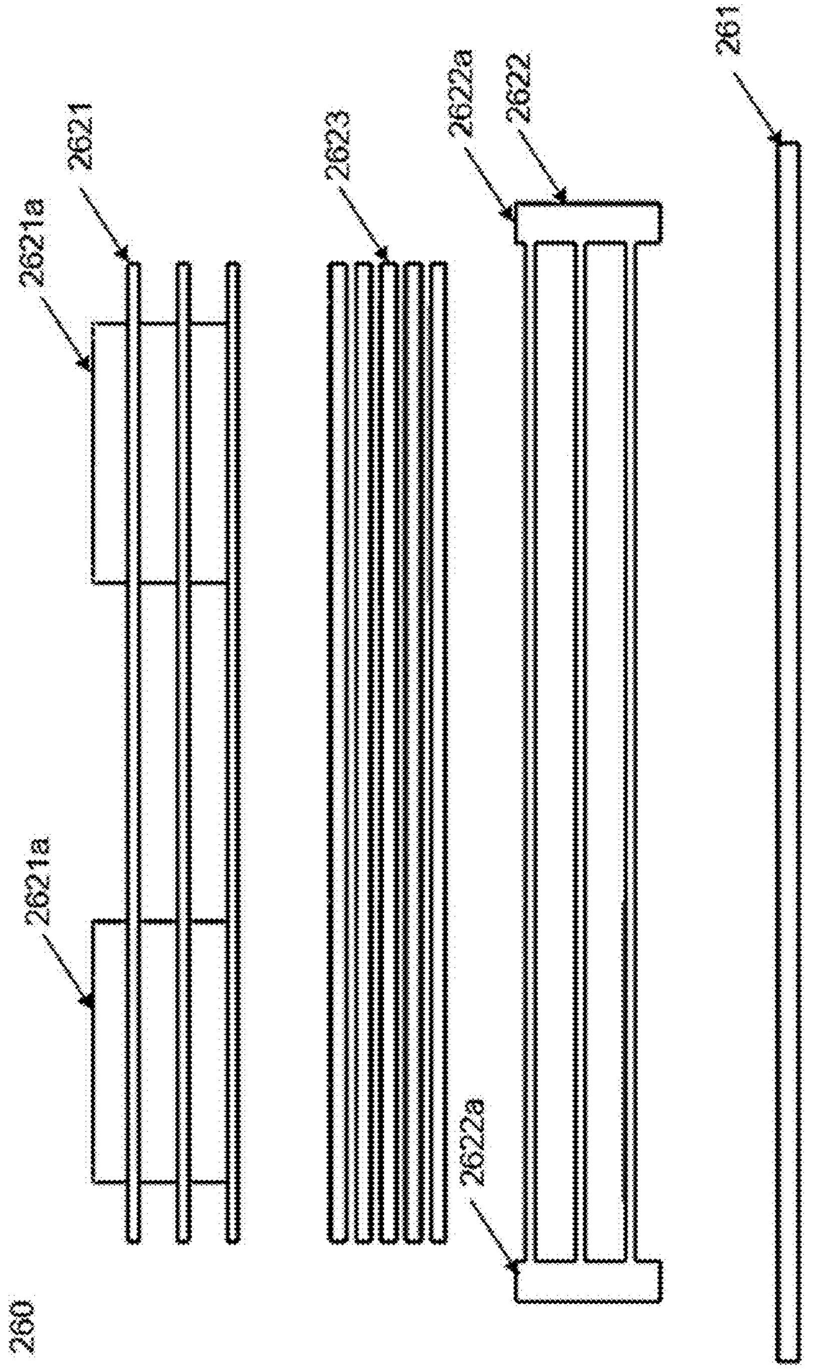

In a preferred embodiment, as shown in FIGS. 2I to 2K, the capacitor element 262 is a layered capacitor. FIG. 2J is an exploded view of the structure of FIG. 2I. Two implementation modes of the arrangement of the layered capacitor are that firstly, the capacitor element 262 and the substrate 261 are assembled together through the adhesive and the inductor assembly 210 after being sintered and formed, so that the capacitor and the inductor can respectively exert the best performance, and the annealing temperature with the best performance of the capacitor and the inductor is different. In a preferred embodiment, the substrate 261 can be omitted by process optimization without affecting the performance of the power converter module, thereby achieving the purposes of reducing cost and saving space. In another preferred embodiment, the substrate 261, the blank of the capacitor element 262 and the blank of the inductor assembly 210 can be first assembled together, and then the inductor and the capacitor are annealed together; and the two annealing processes are changed into one-time annealing, so that the production efficiency can be improved, the production process is simplified, and the production cost is reduced.

FIG. 2K is a side-view structural exploded diagram of the output capacitor assembly 260. As shown in FIG. 2K, the layered capacitor comprises a first electrode plate 2621, a second electrode plate 2622 and a dielectric layer 2623, and the first electrode plate 2621 and the second electrode plate 2622 are stacked together layer by layer through the interval layer of the dielectric layer 2623. The electrode material and the dielectric material are both provided with two through holes so as to avoid the position of the main winding 221/222. The first electrode plate 2621 serves as a positive plate, and the positive electrode pad 2621*a* of the first electrode plate 2621 is arranged at the position of the through hole. Since the positive electrode of the capacitor element 262 is at the same potential as the output end of the main winding 221/222, the positive electrode pad 2621*a* is arranged at the position of the through hole to facilitate electrical connection, and optimization of parasitic parameters is achieved. The second electrode plate 2622 serves as a negative plate, and the negative electrode pad 2622*a* is arranged on the two sides; and the positive plate and the negative plate need to be electrically isolated. Compared with the plurality of SMD capacitors shown in FIG. 2A, the layered capacitor can fully utilize the space, so that the assembly gap between the SMD capacitors is saved. When the overall size is the same, the layered capacitor can realize larger capacitance capacity, so that the output voltage has better dynamic performance; or under the requirement of the same output capacitor capacity, the layered capacitor can be realized by a smaller volume; therefore, the power density of the module can be improved.

Embodiment 2

Figure 3A:
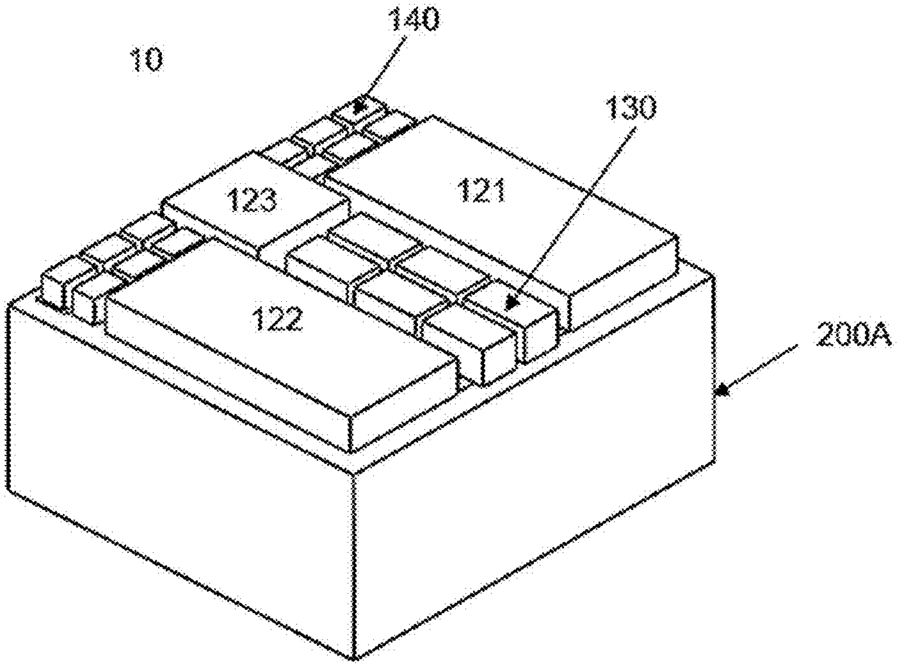
FIG. 3A to FIG. 3E are schematic structural diagrams of a second embodiment.
Figure 3B:
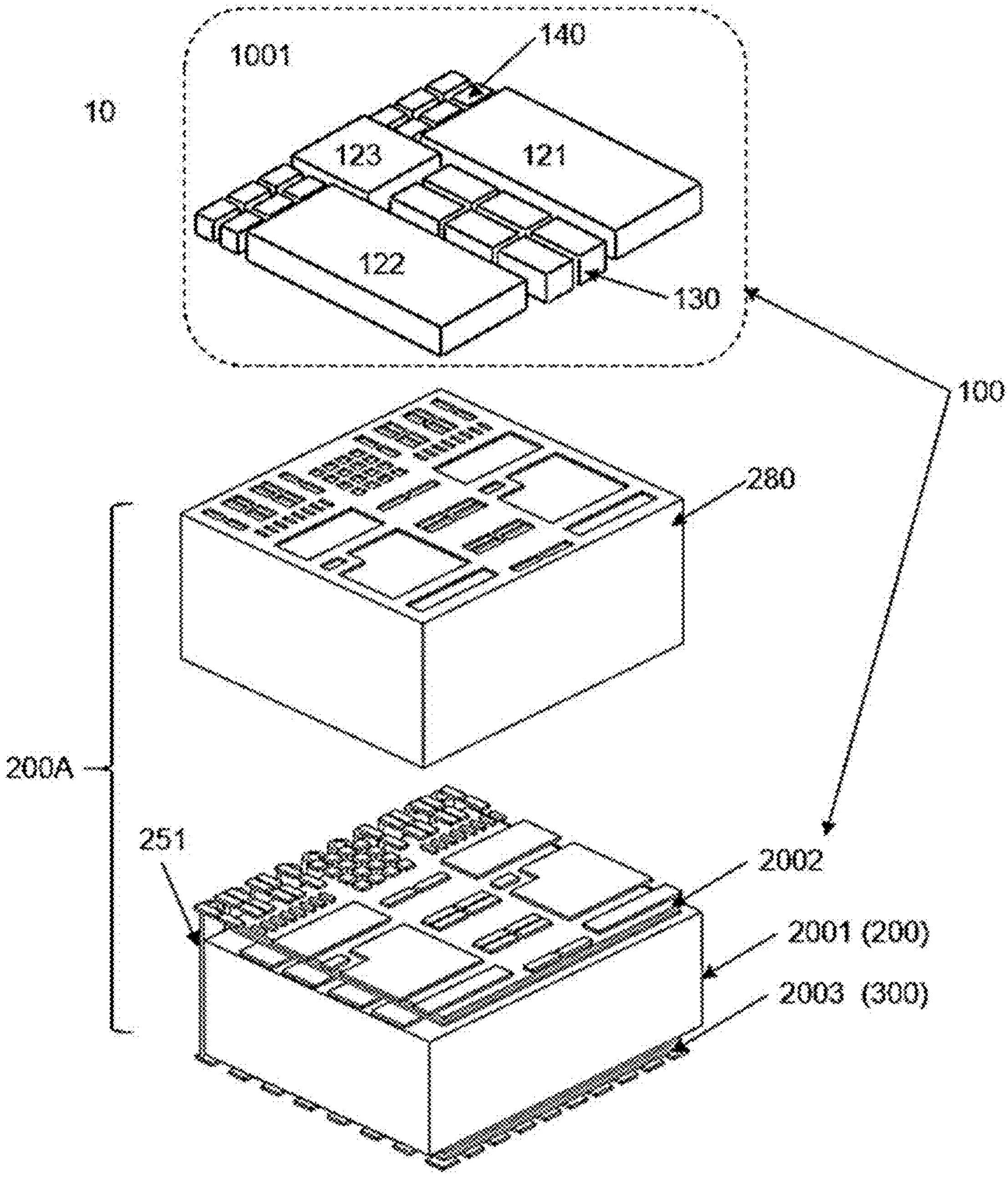
Figure 3C:
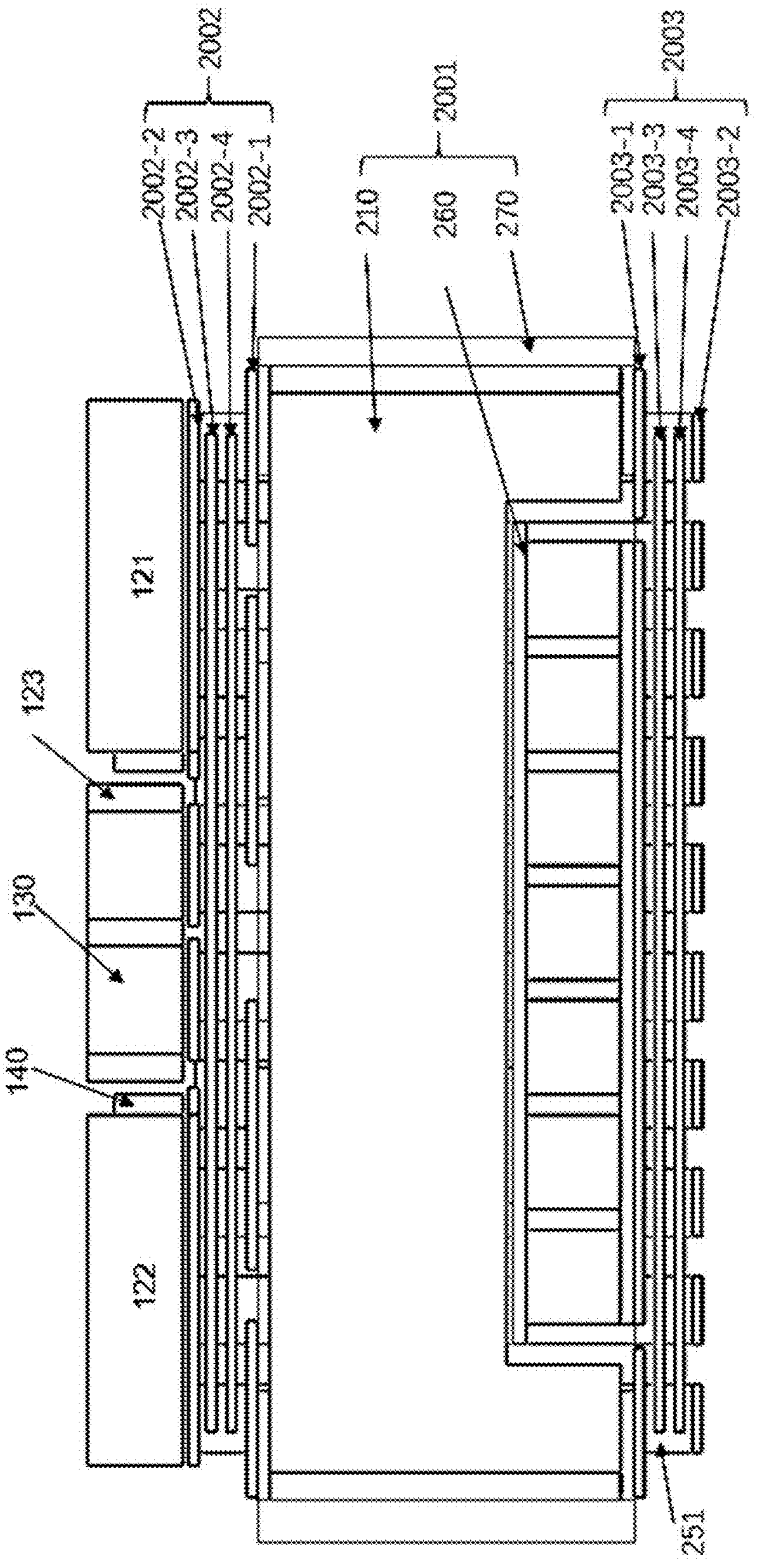

FIG. 3A shows an overall structure of the embodiment; and FIG. 3B is an exploded view of the structure of FIG. 3A. The two-phase VRM module 10 of the embodiment comprises a top assembly 1001 and an integrated substrate assembly 200*a*; the integrated substrate assembly 200A comprises a main body structure 2001, a top structure area 2002, a bottom structure area 2003, a signal electrical connector 251, and a PCB insulating dielectric material 280. Compared with the first embodiment, the top assembly 1001 of the present embodiment omits the top plate 110, and the function of the top plate 110 is achieved by the top structure area 2002 in the integrated substrate assembly 200A (ie, the top assembly 1001 and the top structure area 2002 correspond to the top assembly 100 of the first embodiment in function);

FIG. 3C is a side view of the integrated power converter module after the PCB insulating dielectric material 280 is hidden according to the embodiment; as shown in FIG. 3A to 3C, the main body structure 2001 comprises an inductor assembly 210, a capacitor assembly 260, and a plastic package 270 (corresponding to the middle assembly 200 in embodiment 1); the top structure area 2002 comprises a first wiring layer 2002-1, a second wiring layer 2002-2, a third wiring layer 2002-3 and a fourth wiring layer 2002-4; and the first wiring layer 2002-1 is electrically connected to the top electrode of the main body structure 2001; and the second wiring layer 2002-2 corresponds to a pin of the top assembly 1001 and is used for electrically connecting the top assembly 1001; and the third wiring layer 2002-3 and the fourth wiring layer 2002-4 are used as wiring between the first wiring layer 2002-1 and the second wiring layer 2002-2; and the electrical connection between the wiring layers is usually realized by means of electrical connection between layers such as blind holes, buried holes and through holes (not shown in the figure). In some other embodiments, the top structure area 2002 may also be provided with a greater number of wiring layers for electrical connection, heat dissipation, electromagnetic shielding or other functions, which are merely examples and are not limited herein.

The bottom structure region 2003 includes a first wiring layer 2003-1, a second wiring layer 2003-2, a third wiring layer 2003-3, and a fourth wiring layer 2003-4; and the first wiring layer 2003-1 and the bottom electrode of the main body structure 2001 are electrically connected; the second wiring layer 2003-2 is used for being electrically connected with a load. In a preferred embodiment, the second wiring layer 2003-2 is an LGA or BGA dot-shaped bonding pad and is used for being electrically connected with a load; and the third wiring layer 2003-3 and the fourth wiring layer 2003-4 are used as an electrical connection between the first wiring layer 2003-1 and the second wiring layer 2003-2; and the electrical connection between the wiring layers is usually realized by means of blind holes, buried holes, through holes and the like (not shown in the figure). In other embodiments, the bottom structure area 2003 can also be provided with a larger number of wiring layers for electrical connection, heat dissipation, electromagnetic shielding or other functions, which are only examples and are not limited herein.

Since the top structure area 2002 is functionally equivalent to the top plate 110 of the first embodiment, and the bottom structure area 2003 is functionally equivalent to the bottom assembly 300 of the first embodiment. In the present embodiment, an integrated substrate assembly 200*a* obtained by integrating the middle assembly 200, the top plate 110 and the bottom assembly 300 of the first embodiment in a PCB by means of a PCB process. The purpose of the application is, two times of welding between the middle assembly and the top assembly and between the middle assembly and the bottom assembly are omitted, module assembly can be completed only by performing one-time welding (corresponding to one-time welding on the upper surface of the top plate 110 in the first embodiment) of the top assembly 1001 and the integrated substrate assembly 200A. The two-time welding process is reduced, the integration degree is greatly improved, meanwhile, the production cost is reduced, and the reliability of the module is improved. In a preferred embodiment, the PCB of the integrated substrate assembly 200A is further provided with a vertical electrical connector with two ends electrically connected to the top structure area 2002 and the bottom structure area 2003, respectively, and the vertical electrical connector can be used as an alternative implementation form of a structure such as a signal electrical connector 251. The difference between the embodiment and the first embodiment can also be applied to the other preferred embodiments, and details are not described herein again.

In a preferred embodiment, the bonding and fixing between the inductor assembly 210 and the capacitor assembly 260 in FIG. 3C can be done without the plastic package 270, but only depends on the bonding glue between the inductor assembly 210 and the capacitor assembly 260; therefore, the plastic package 270 can be removed.

Figure 3D:
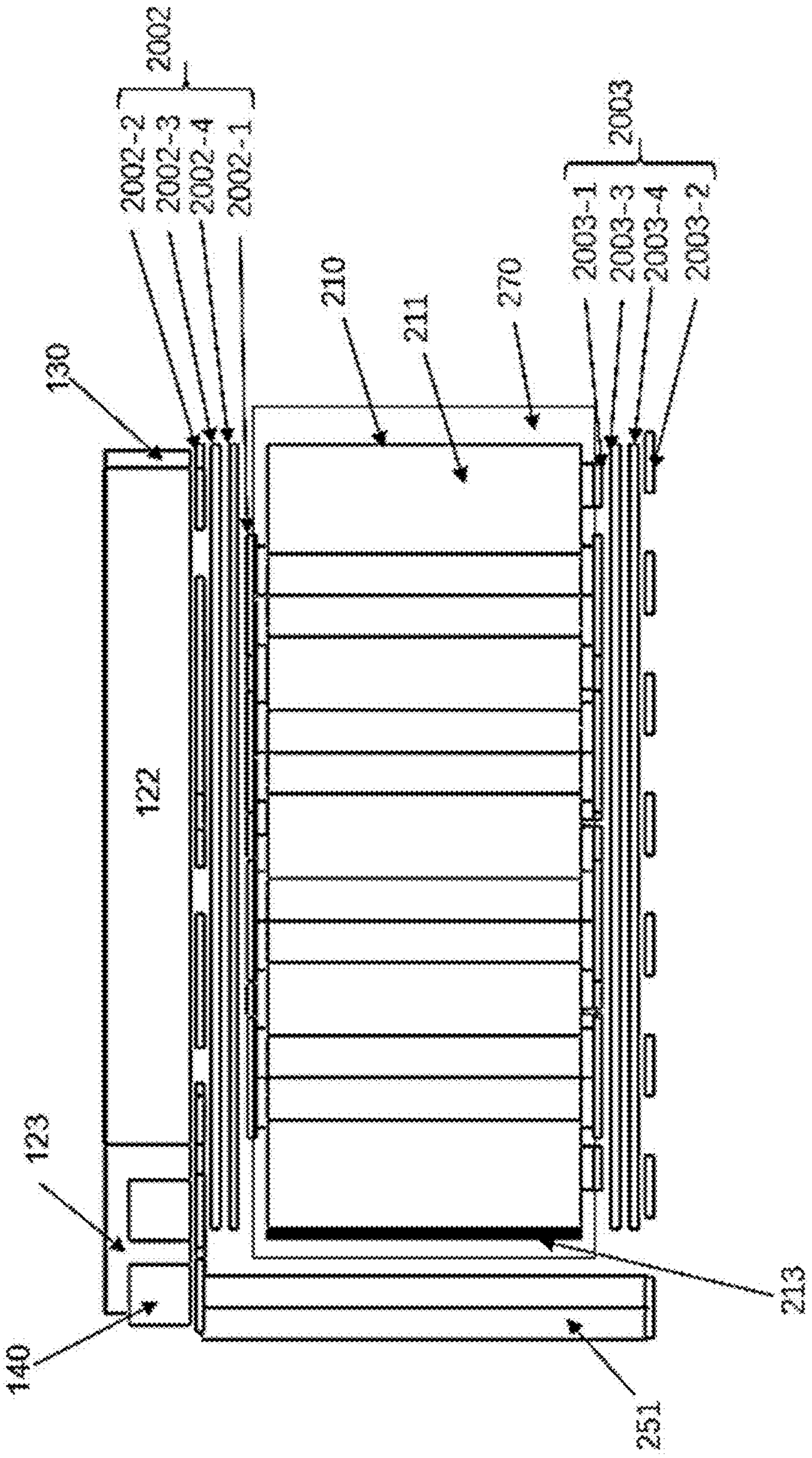

In a preferred embodiment, as shown in FIG. 3D (the perspective direction of FIG. 3D is the same as that in FIG. 3C), a metal layer 213 is electroplated on the fourth side surface of the magnetic core 211, so that the metal layer 213 is located between the magnetic core and the signal electrical connector 251; and the metal layer 213 is electrically connected to an electrostatic potential such as GND and VIN by means of the wiring layer 2002 or the wiring layer 2003 so as to shield the electric field interference which interfere the signal electrical connector 251 and generated by the rapidly changed voltage on the input end 221*a*/222*a* of the main winding, and can also shield the magnetic field interference which interfere the signal electrical connector 251 and generated by the diffusion magnetic field of the magnetic core 211, so as to ensure the reliable operation of the VRM module. The electroplated metal layer can also achieve the same technical effect by opening a window on the plastic packaging material 270 to complete electroplating.

Figure 3E:
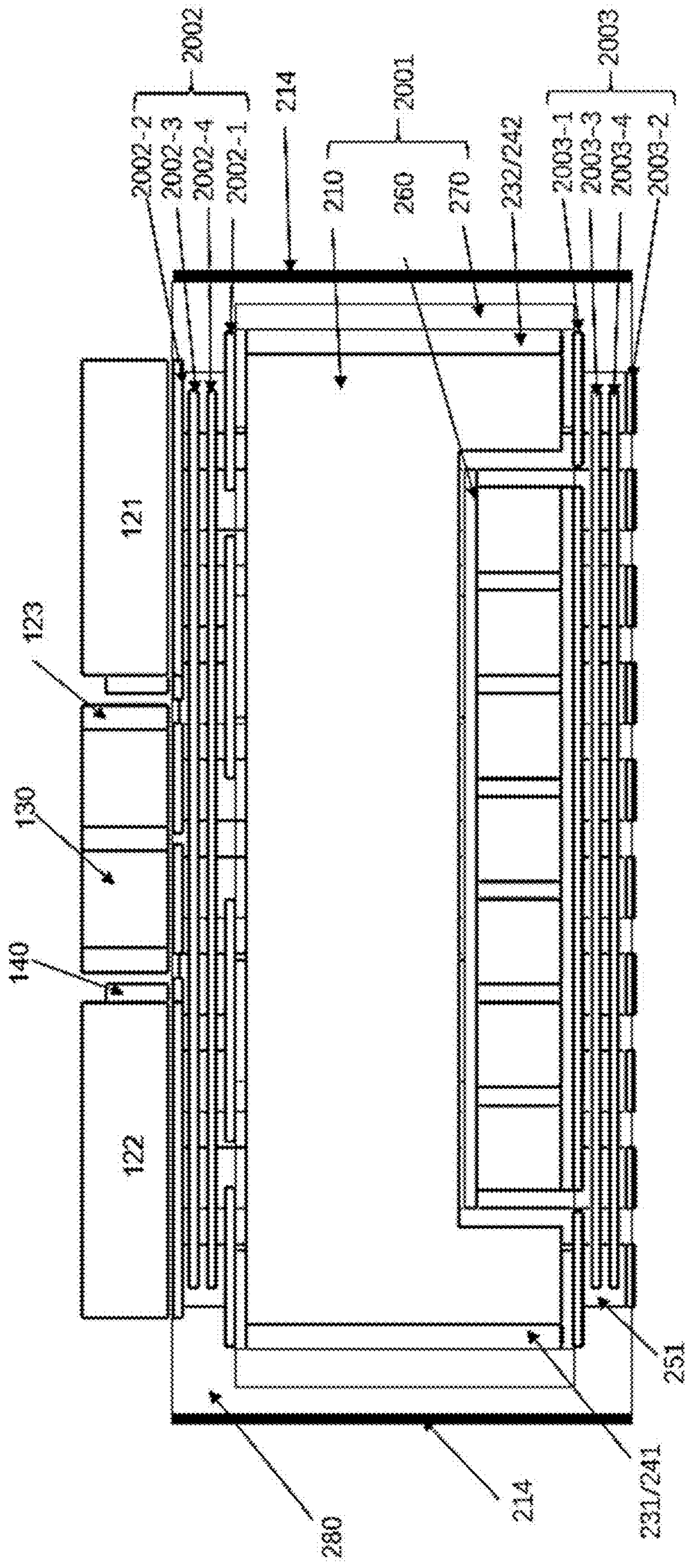

In another preferred embodiment, as shown in FIG. 3E (the perspective direction of FIG. 3D is the same as that shown in FIG. 3C, and the insulating dielectric material 280 is not hidden), a metal layer 214 is respectively arranged on the second side surface and the fourth side surface of the insulating dielectric material by adopting a side electroplating process; and the metal layer 214 is electrically connected with electrostatic positions such as GND and VIN through a wiring layer 2002 or a wiring layer 2003. The metal layer 214 is adjacent to the inductor assembly. The function of the metal layer is greatly reducing the parasitic inductance of the loop of the power electrical connector 213/241 between the second side surface and the fourth side surface, or greatly reducing the parasitic inductance of the loop between 232/242; the resonance impedance between the parasitic inductance of the loop and Cin is greatly reduced to be damped by the parasitic resistance in the circuit, so that the resonant current in Cin is greatly reduced, the influence of the resonance on the efficiency of the VRM module is reduced, and the efficiency is improved.

Embodiment 3

Figure 4A:
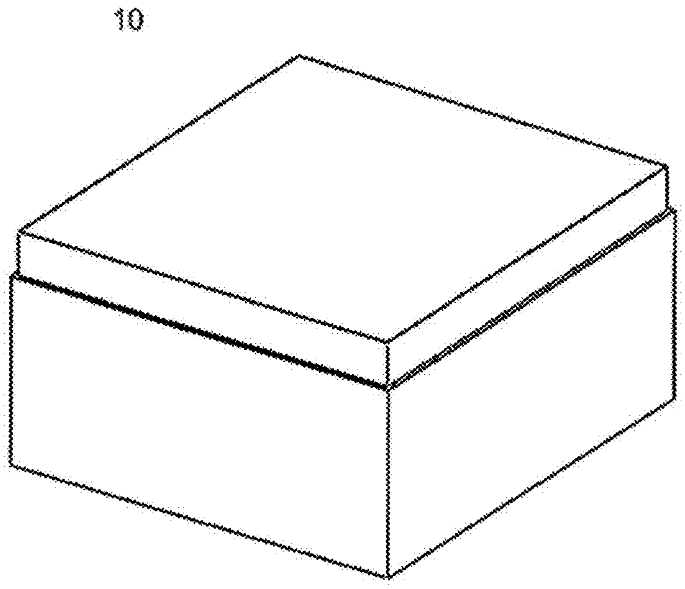
FIG. 4A to FIG. 4B are schematic structural diagrams of a third Embodiment.
Figure 4B:
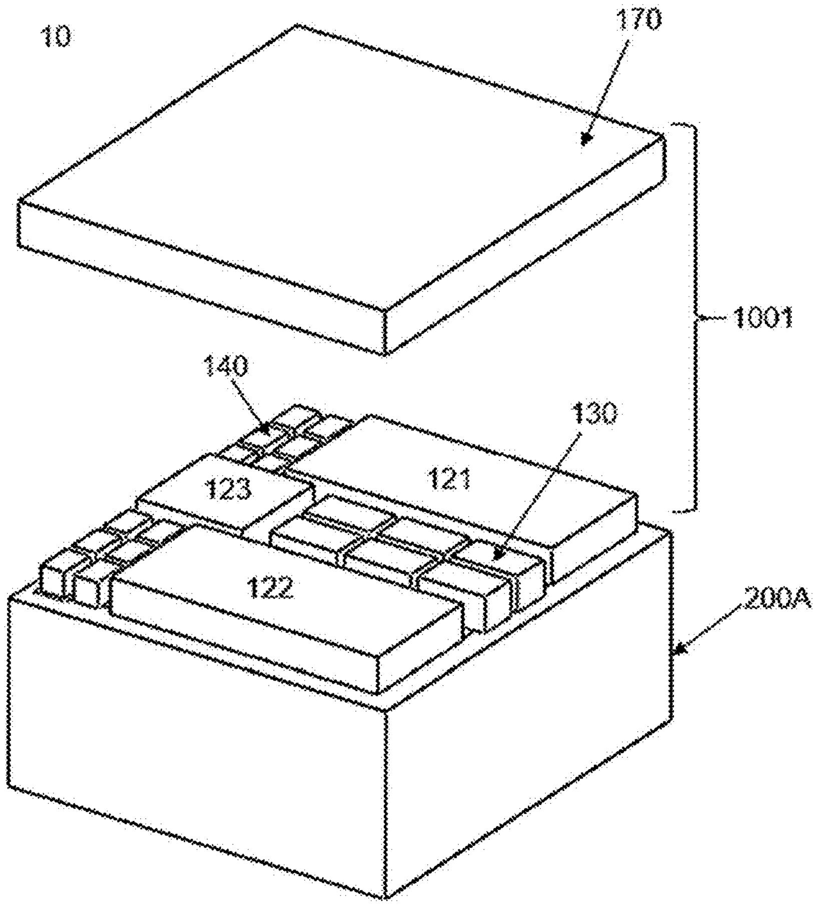

FIG. 4A shows an overall structure of the embodiment; FIG. 4B is an exploded view of FIG. 4A. The difference between the embodiment and the second embodiment lies in that, the top assembly 1001 further comprises a top plastic package 170, and the top plastic package 170 covers other parts of the top assembly 1001 and at least a part of the top surface of the integrated substrate assembly 200A. According to the embodiment, after components of the top assembly 1001 are welded on the top surface of the integrated substrate assembly 200A and plastic encapsulated, no welding point of the whole VRM module is exposed, and the reliability of the module is further improved.

Embodiment 4

Figure 5A:
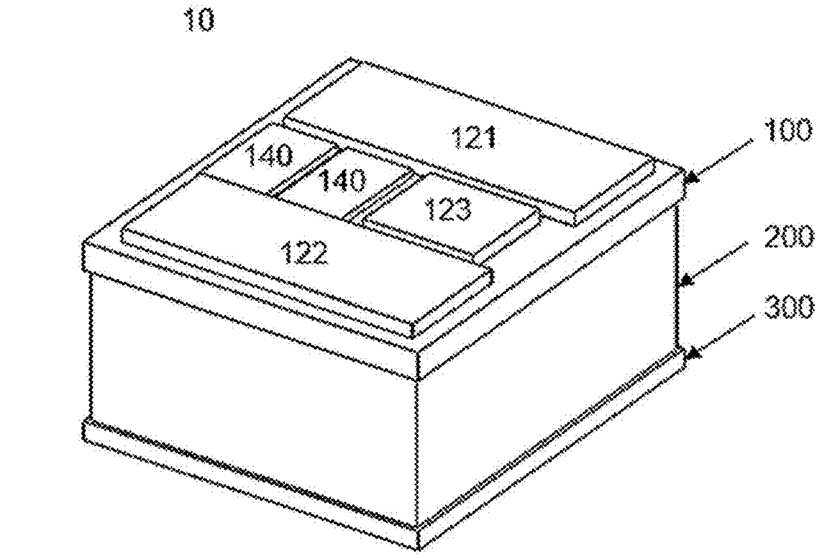
FIG. 5A to FIG. 5D are schematic structural diagrams of a fourth Embodiment.
Figure 5B:
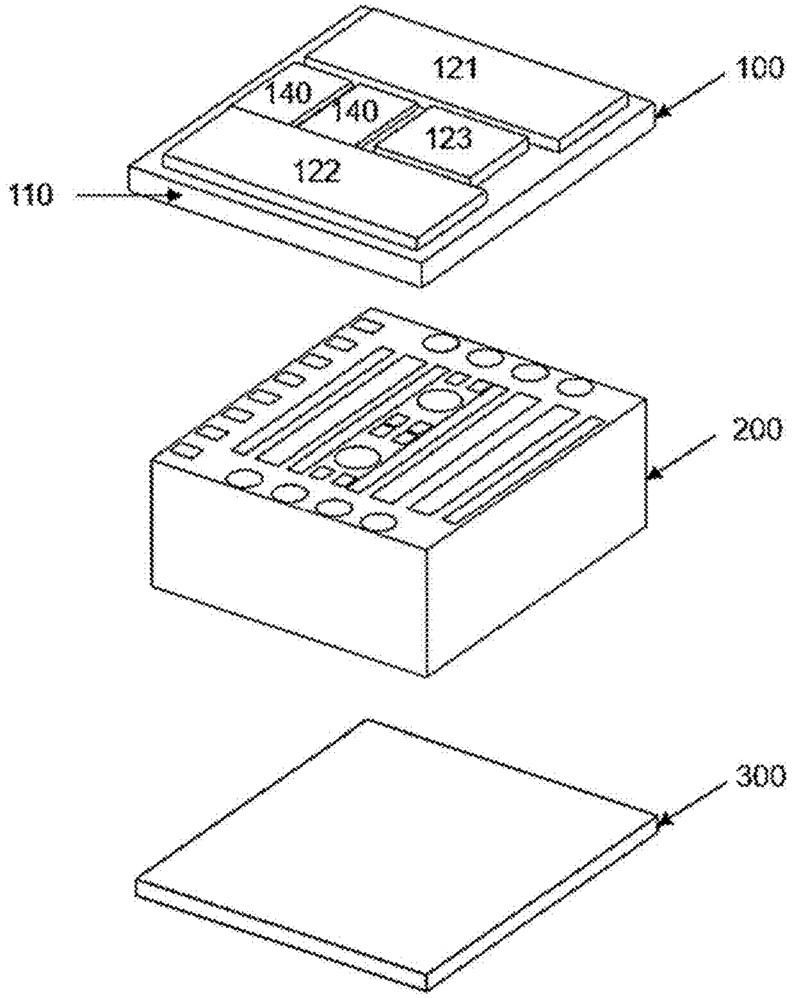
Figure 5C:
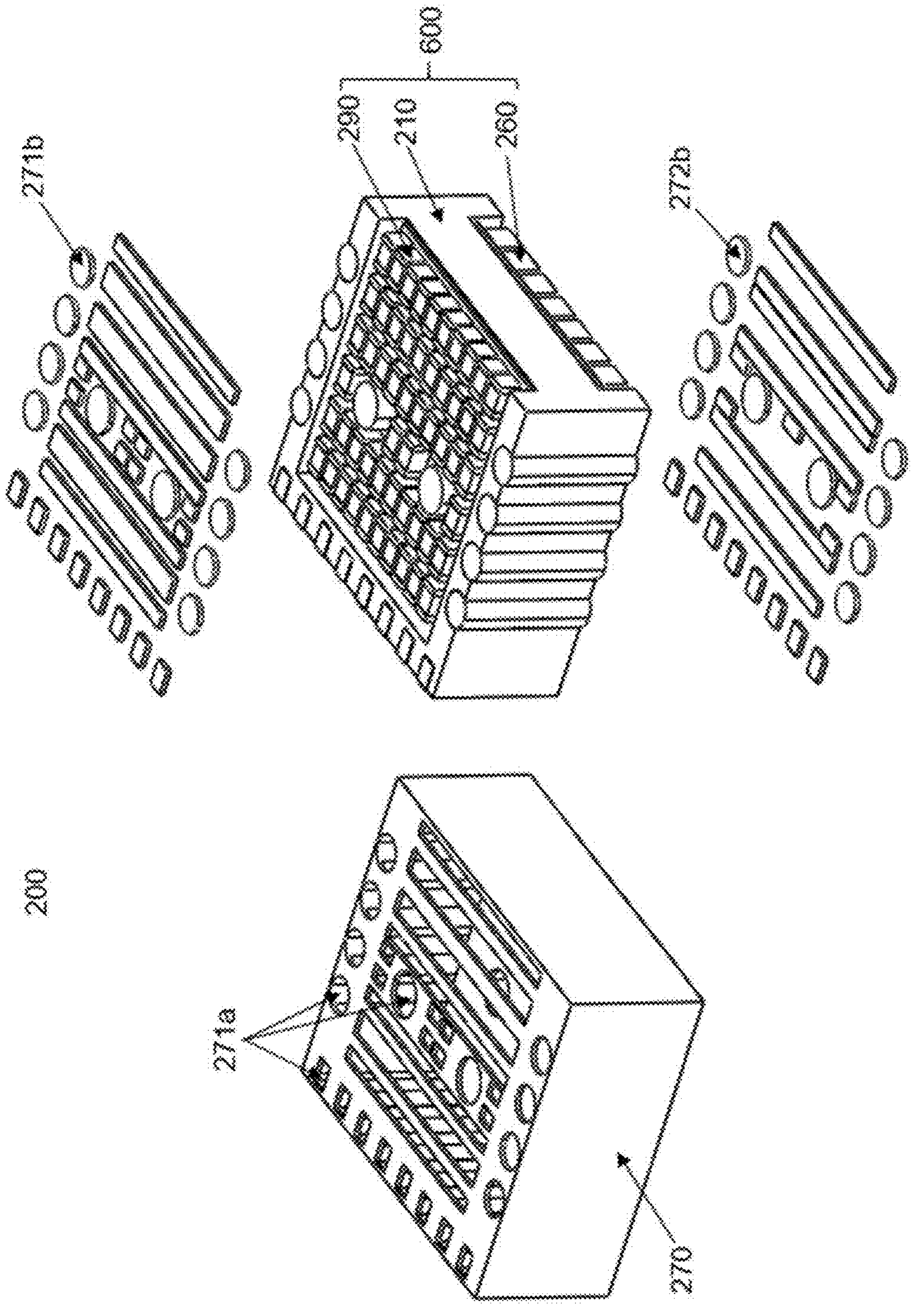

FIG. 5A shows an overall structure of the embodiment; FIG. 5B is an exploded view of the structure of FIG. 5A; and FIG. 5C is a structural exploded view of the middle assembly 200. The difference between the embodiment and Embodiment 1 lies in that the input capacitor 130 of Embodiment 1 is removed from the top assembly 100 to form an input capacitor assembly 290 and then is integrated into the middle assembly 200.

As shown in FIG. 5A and FIG. 5B, the top assembly 100 comprises a top plate 110, an IPM unit 121/122, a control unit 123 and other passive elements 140. The device in the top assembly 100 can be a device with a lower height, for example, the IPM unit 121/122 and the control unit 123 adopt Chip Size Package (CSP); the other passive elements 140 also adopt integrated ultrathin packaged devices, such as silicon capacitors and the like. The maximum height of the device above the top plate 110 in the first embodiment is limited by the height of the input capacitor 130, the height of the device is reduced, the required capacitance of the device can be met, and therefore, even if other devices are thinned, the multiple output spaces are not effectively utilized. But the embodiment is not limited; the thickness of the functional area of the semiconductor device can be only 0.1 mm or below, so that the thickness of the non-functional area can be reduced by adopting processes such as advanced packaging and semiconductor thinning and grinding, so that the occupied height of the top assembly 100 is reduced, the height utilization rate of the top assembly is improved, and the power density of the VRM module is improved; and the thickness of the semiconductor chip is reduced, and the overall height of the top assembly 100 is reduced, so that the thermal resistance of heat dissipation from the heat source to the upper part can be reduced, and heat dissipation is facilitated.

As shown in FIG. 5C, in addition to the inductor assembly 210 and the output capacitor assembly 260, the integrated assembly 600 of the present embodiment further comprises an input capacitor assembly 290. The output capacitor assembly 260 corresponds to the output capacitor 360 of FIG. 1; and the input capacitor assembly 290 corresponds to the input capacitor 1301-1313 of FIG. 1, so that the function of filtering high-frequency ripples is achieved. The concave used for setting the input capacitor assembly 290 is connected with one side surface of the magnetic core 211. More input capacitors can be set in the concave to get the better filter function, and it will be convenient to set the capacitors in the concave. Similarly, the concave used for setting the output capacitor assembly 260 has the same structure, lower ripple and better dynamic performance can be gotten, and details are not described herein again.

Figure 5D:
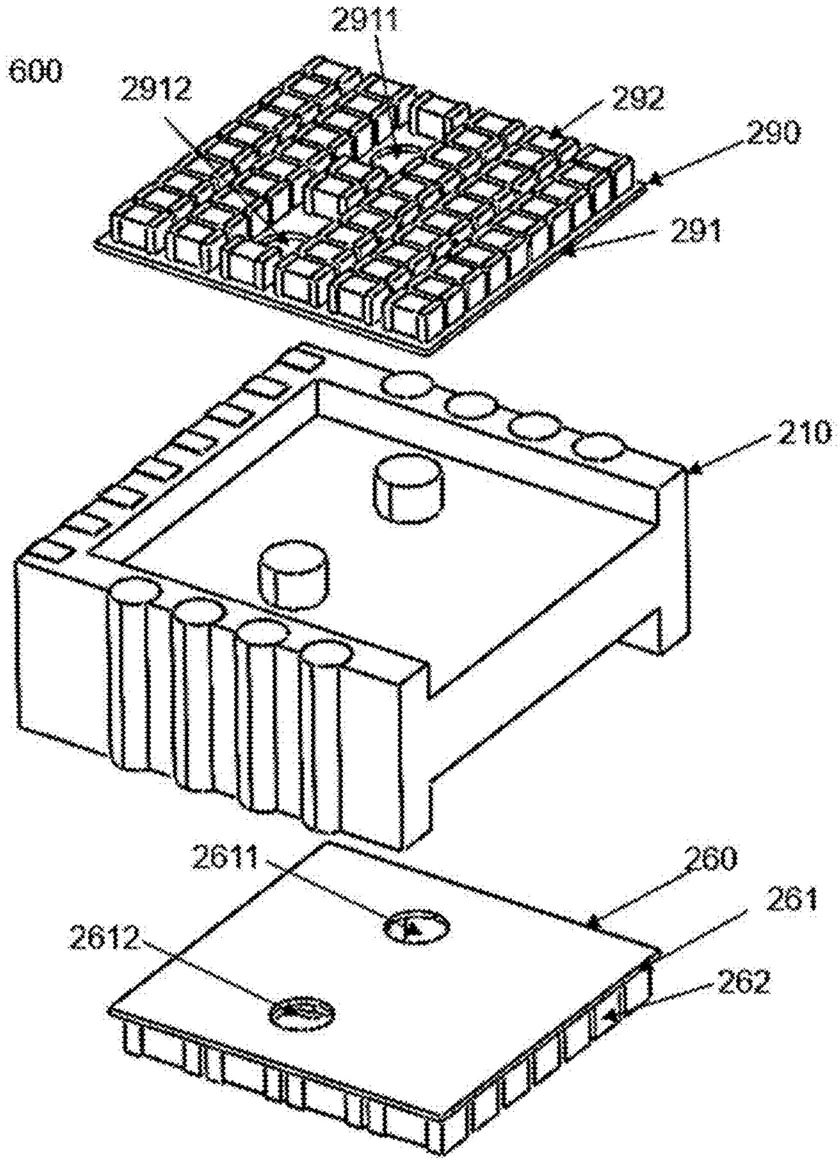

FIG. 5D is an exploded view of the integrated assembly 600. The top and the bottom of the magnetic core 211 are respectively provided with a concave to form two capacitor setting areas respectively used for accommodating the input capacitor assembly 290 and the output capacitor assembly 260. The structure of the output capacitor assembly 260 is described in the first embodiment, and details are not described herein again. The structure of the input capacitor assembly 290 can adopt a structure similar to that of the output capacitor assembly 260. In the embodiment, the input capacitor assembly 290 comprises a substrate 291 and a capacitor element 292, wherein the capacitor element 292 corresponds to the input capacitor 1301-1313 shown in FIG. 1; the substrate 291 has an insulating function, such as a ceramic substrate, and two through holes 2911/2912 are formed in the substrate 291; and the position of the through hole 2911/2912 corresponds to the position of the main winding 221/222, and the main winding 221/222 passes through. It should be noted that the Cin shown in FIG. 1 is not in short circuit with the input end of the two-phase inductor 200, and therefore, the electrode of the input capacitor assembly 290 needs to be electrically isolated from the input end of the main winding 221/222. The structure of the input capacitor assembly 290 and the implementation mode thereof can be implemented by a person skilled in the art with reference to the related description of the output capacitor assembly 260 in the first embodiment as an example, which will not be repeated here.

The input capacitor assembly 290 is located below the top assembly 100, so that the input capacitor assembly 290 has a larger area to place capacitors, so that a larger total capacitance can be obtained at the same time, or the height of the capacitor assembly can be reduced on the premise of the same total capacitance value. Therefore, according to the arrangement mode, the overall height of the module can be reduced to improve the power density, or the size in the height direction is made to the magnetic core 211 to reduce the loss of the magnetic core 211 so as to improve the efficiency of the module. On the other hand, due to the fact that the capacitor element 292 can be vertically connected with VIN PAD and GND PAD of the IPM unit 121/122 through the top plate 110, compared with a horizontally adjacent arrangement mode, the vertically electrical connection path is shorter, the area of a high-frequency loop between the capacitor element 292 and the IPM unit 121/122 is smaller, the loss of high-frequency switch ripple current generated when the IPM unit 121/122 works is smaller, and the improvement efficiency is facilitated. The electrode electrical network similar to the output capacitor assembly 260 satisfies the alternative arrangement of the VO end 160 and the GND end 150, and the electrode electrical network of the input capacitor assembly 290 also satisfies the alternative arrangement of the VIN end 170 and the GND end 150, thereby further reducing the parasitic inductance of the loop between the capacitor element 292 and the IPM unit 121/122, reducing the loss generated when the IPM unit 121/122 works at the high-frequency switch, and further improving the efficiency.

Embodiment 5

Figure 6A:
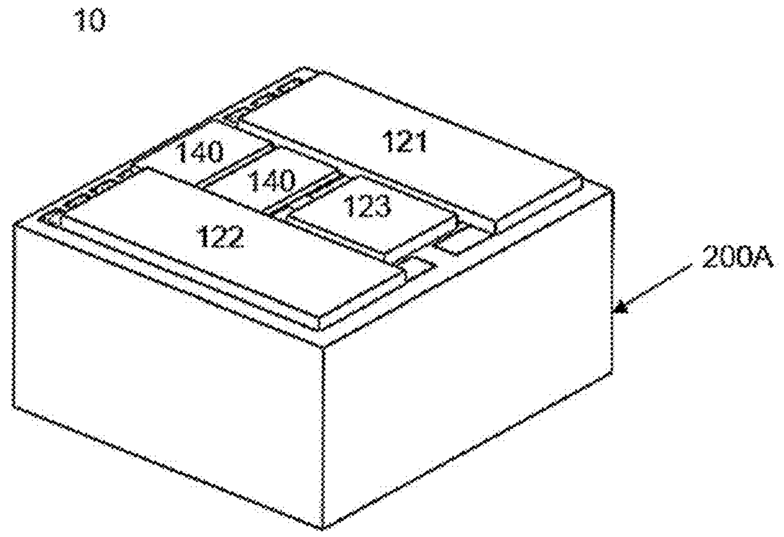
FIG. 6A to FIG. 6D are schematic structural diagrams of a fifth embodiment.
Figure 6B:
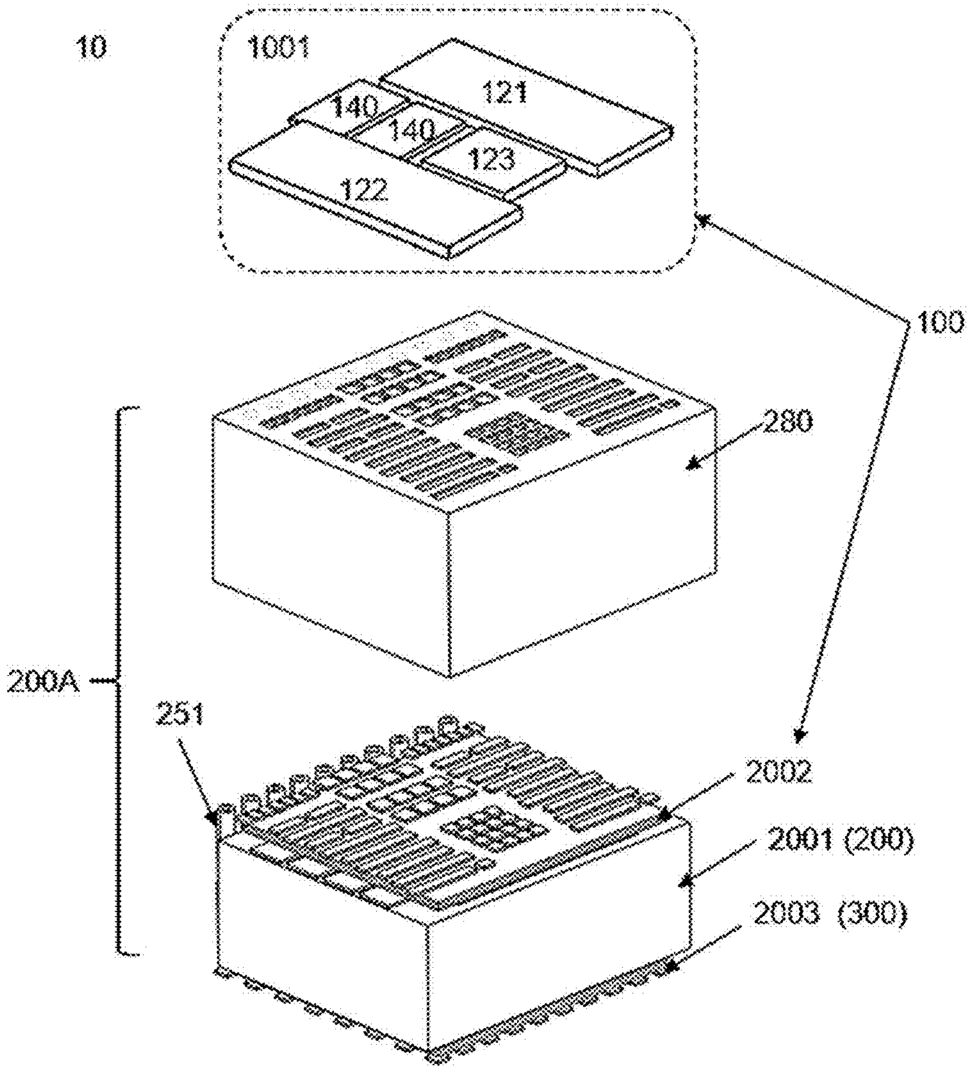
Figure 6C:
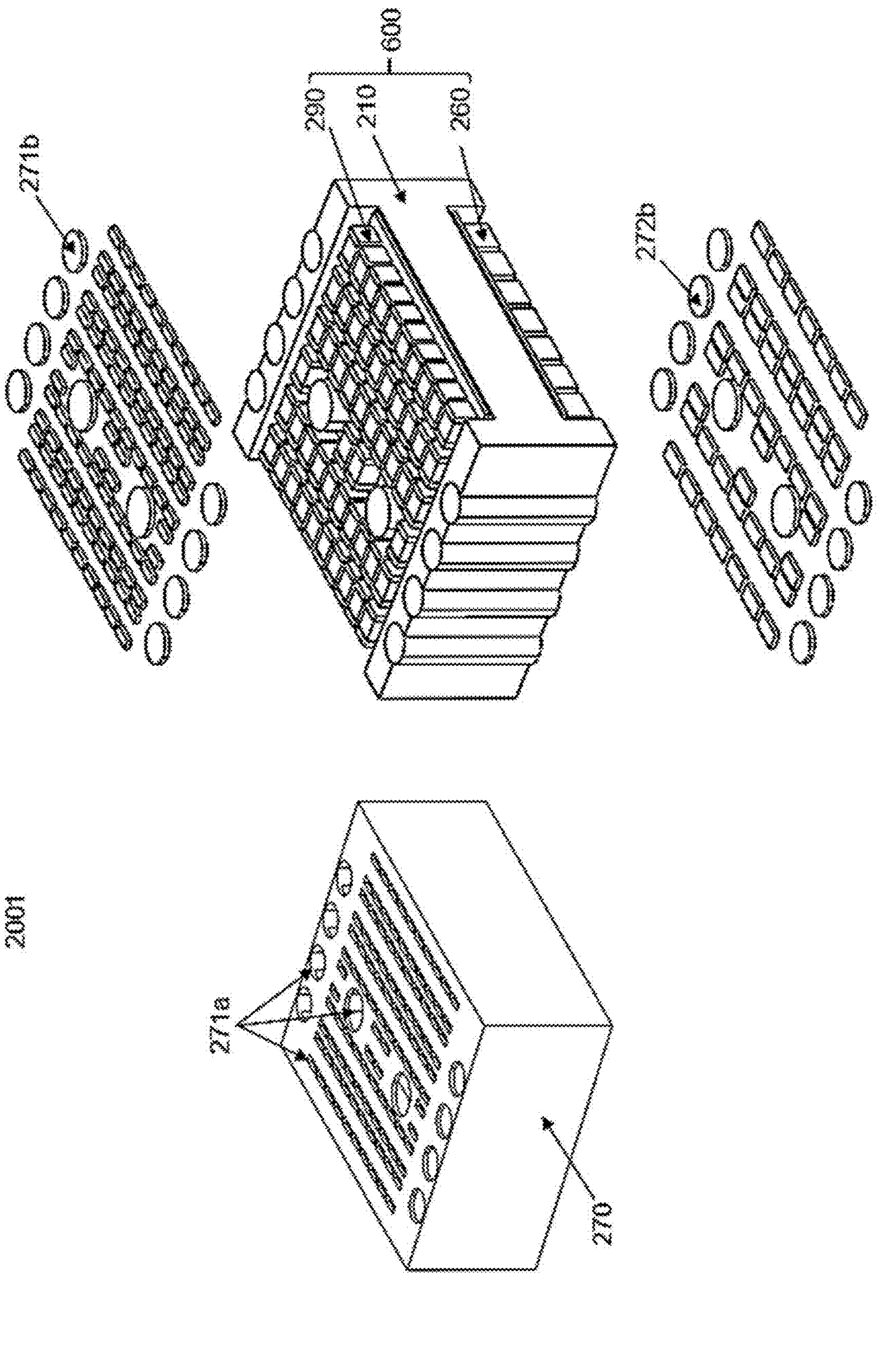

FIG. 6A shows an overall structure of the embodiment; FIG. 6B is an exploded view of the structure of FIG. 6A; and FIG. 6C is an exploded view of the structure of the main body structure 2001. The two-phase VRM module 10 of the embodiment comprises a top assembly 1001 and an integrated substrate assembly 200A. The embodiment is equivalent to the combination of the fourth embodiment and the second embodiment. The concave used for setting the input capacitor assembly 290 is connected with two opposite side surfaces of the magnetic core 211. More input capacitors can be set in the concave to get the better filter function, and it will be convenient to set the capacitors in the concave. Similarly, the concave used for setting the output capacitor assembly 260 has the same structure, lower ripple and better dynamic performance can be gotten, and details are not described herein again.

Figure 6D:
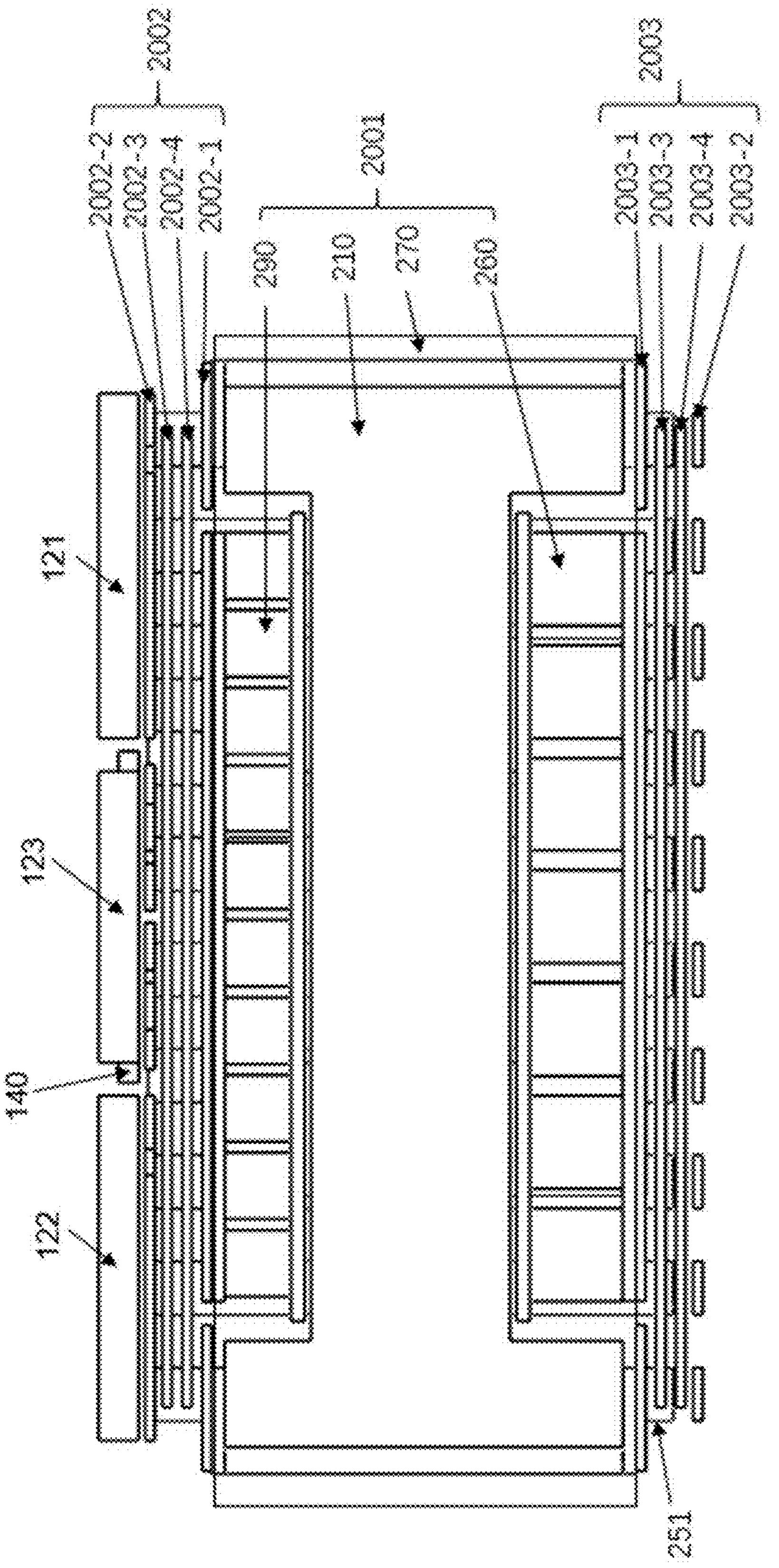

FIG. 6D is a side view of the integrated power converter module after the PCB insulating dielectric material 280 is hidden according to the embodiment. As shown in FIG. 6A to FIG. 6D, the main body structure 2001 comprises an integrated assembly 600 (comprising an inductor assembly 210, an output capacitor assembly 260, an input capacitor assembly 290) and a plastic package 270 (the main body structure 2001 corresponds to the middle assembly 200 in Embodiment 4); the top structure area 2002 comprises a first wiring layer 2002-1, a second wiring layer 2002-2, a third wiring layer 2002-3 and a fourth wiring layer 2002-4. The first wiring layer 2002-1 is electrically connected to a top electrode of the main body structure 2001; the second wiring layer 2002-2 corresponds to a pin of the top assembly 1001 and is used for electrically connecting the top assembly 1001; and the third wiring layer 2002-3 and the fourth wiring layer 2002-4 are used as an electrical connection between the first wiring layer 2002-1 and the second wiring layer 2002-2.

The bottom structure region 2003 includes a first wiring layer 2003-1, a second wiring layer 2003-2, a third wiring layer 2003-3, and a fourth wiring layer 2003-4. The first wiring layer 2003-1 is electrically connected to the bottom electrode of the main body structure 2001; the second wiring layer 2003-2 is used for being electrically connected to a load. In a preferred embodiment, the second wiring layer 2003-2 is an LGA or BGA point-shaped bonding pad for being electrically connected to a load; and the third wiring layer 2003-3 and the fourth wiring layer 2003-4 are used as an electrical connection between the first wiring layer 2003-1 and the second wiring layer 2003-2.

Since the top structure area 2002 is functionally equivalent to the top plate 110 of the fourth embodiment, and the bottom structure area 2003 is functionally equivalent to the bottom assembly 300 of the fourth embodiment, according to the embodiment, the middle assembly 200, the top plate 110 and the bottom assembly 300 of the fourth embodiment are integrated in one PCB through a PCB process to obtain the integrated substrate assembly 200A; compared with the fourth embodiment, the two-time welding process is reduced, the integration degree is greatly improved, meanwhile, the production cost is reduced, and the reliability of the module is improved. In a preferred embodiment, the bonding and fixing between the inductor assembly 210 and the output capacitor assembly 260 and the input capacitor assembly 290 in FIG. 6D can be done without the plastic package 270, but only depends on the adhesive glue between every two adjacent pairs; therefore, the plastic package 270 can be removed.

The fourth embodiment can also be combined with the third embodiment to form a better embodiment, that is, the device of the top assembly 1001 is subjected to plastic packaging on the basis of the embodiment, so that the reliability of the module is improved.

Embodiment 6

Figure 7A:
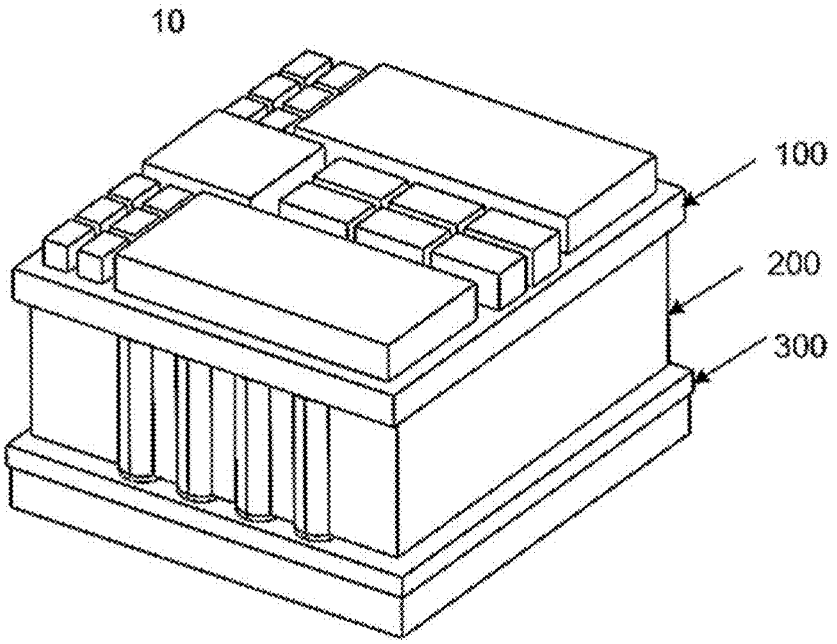
FIG. 7A to FIG. 7D are schematic structural diagrams of a sixth embodiment.
Figure 7B:
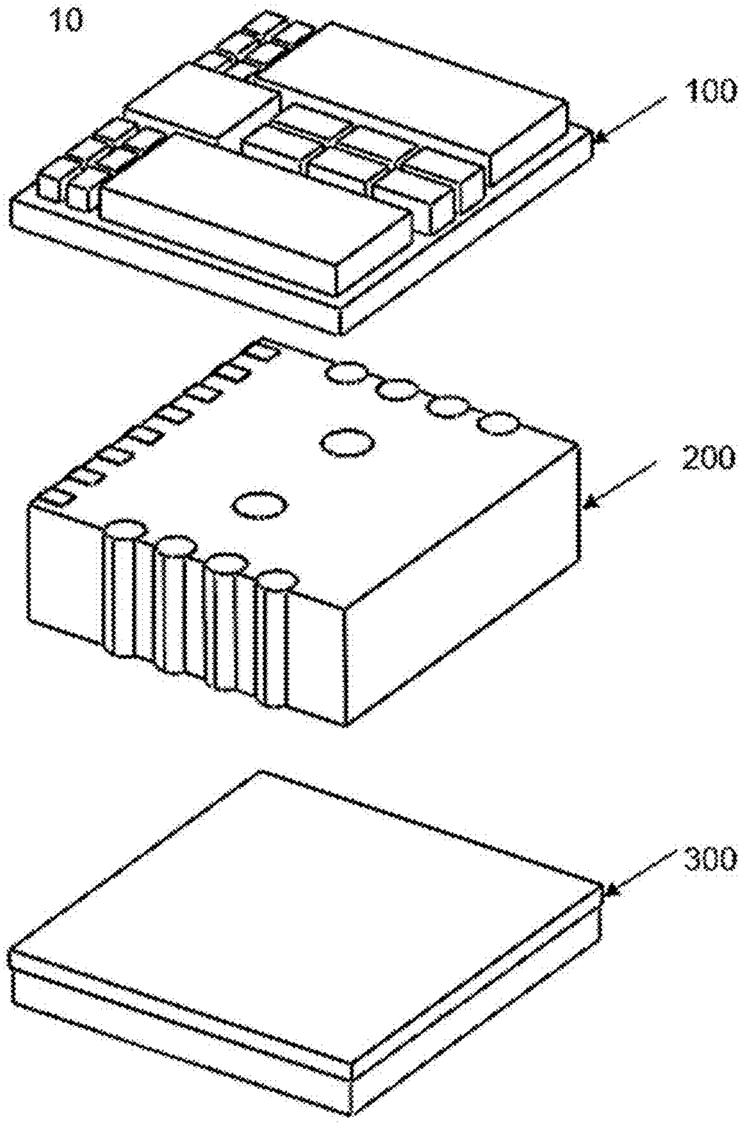
Figure 7C:
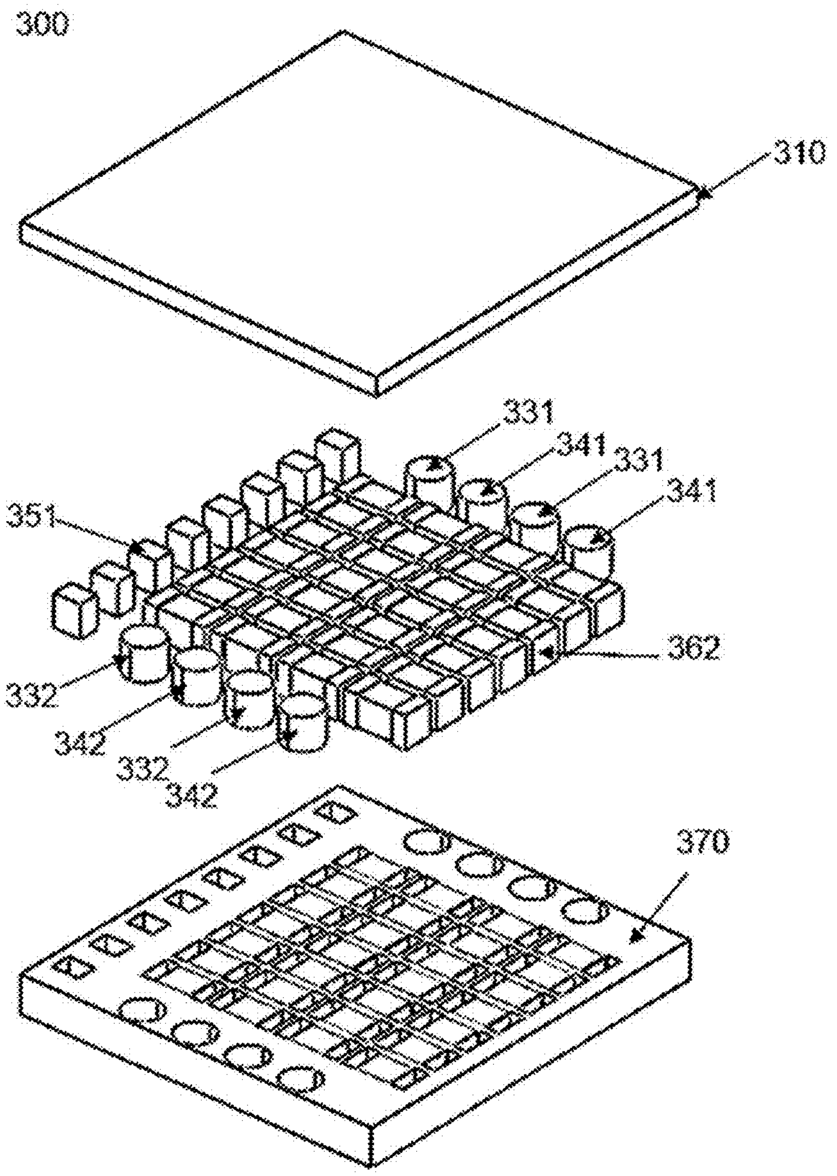

FIG. 7A shows an overall structure of the embodiment; and FIG. 7B is an exploded view of the structure of FIG. 7A. As shown in FIG. 7A and FIG. 7B, the two-phase VRM module 10 of the embodiment comprises a top assembly 100, a middle assembly 200 and a bottom assembly 300. Compared with the first embodiment, the embodiment is equivalent to removing the output capacitor assembly 260 from the middle assembly 200, extending a part of the conductive structure in the middle assembly 200, and incorporating the removed and extending part into the bottom assembly 300. FIG. 7C is a structural exploded view of the bottom assembly 300 in the embodiment; as shown in FIG. 7C, the bottom assembly 300 comprises a bottom substrate 310, copper columns 331/332/341/342/351, a capacitor element 362 and a plastic package 370. A first power connector 231/232, a second power connector 241/242 and a signal connector 251, which are electrically connected to a load by means of a bottom substrate 310 and a corresponding copper column 331/332/341/342/351, respectively. Here, the first power connector 231/232 is electrically connected to the copper column 331/332, respectively; the second power connector 241/242 is electrically connected to the copper column 341/342, respectively; and the signal connector 251 is electrically connected to the copper column 351. Preferably, the wirings corresponding with the first power connector 231/232, the second power connector 241/242 and the signal connector 251 pass through the bottom substrate 310, so that the copper columns 331/332/341/342/351 are arranged in an up-and-down and one-to-one correspondence with the pin electrical network on the lower surface of the bottom assembly 300. So that the copper columns 331/332/341/342/351 can be electrically connected to the lower surface pins of the bottom assembly 300 only through electroplating, etching and laser drilling technologies on the surface of the plastic package 370. In a preferred embodiment, the copper pillar 351 may be electrically connected to the side of the plastic package on the upper surface and the lower surface of the bottom component 300 for replacement.

In the embodiment, the output end of the main winding 221/222 and one electrode of the capacitor element 362 are equipotential, so that the copper column does not need to extend through the copper column, the electrical network of the local or all bonding pads on the lower surface of the bottom substrate and the electrical network of the local or all bonding pads on the lower surface of the bottom assembly 300 meet the up-down and one-to-one correspondence relationship of the positions through the wiring in the bottom substrate 310. And the output end of the main winding 221/222 is electrically connected with the load through the bottom substrate 310 and the electrode of the corresponding capacitor element 362. The specific implementation method comprises the following steps: 1, welding the capacitor element 362 on the lower surface of the bottom substrate 310; 2, electrically connecting the capacitor electrode to the pin on the lower surface of the bottom assembly 300 through electroplating, etching and laser drilling technology on the surface of the plastic package 370. The output end 221/222 of the middle assembly main winding is connected with the load through the bottom substrate 310 and the electrode of the capacitor element 362, so that the lower surface space of the bottom substrate 310 is not occupied, and a larger area of the lower surface of the bottom substrate 310 can be used for arranging the capacitor element 362, so that the dynamic performance of the output voltage of the VRM module 10 is further improved. Similarly, the output end of the main winding 221/222 depends on the wiring of the bottom substrate 310, and the second power connector 241/242 may also depend on the wiring of the bottom substrate 310, so that the second power connector 241/242 is electrically connected to the load by means of the bottom substrate 310 and the electrode of the corresponding capacitor element 362, respectively, so that the area of the copper column 341/342 can be greatly reduced, and the capacitor element 362 can occupy a larger space. In conclusion, by arranging the wiring layer between the middle assembly 200 and the capacitor element 362, that is, the bottom substrate 310, the area of the placement capacitor element 362 is greatly increased.

Figure 7D:
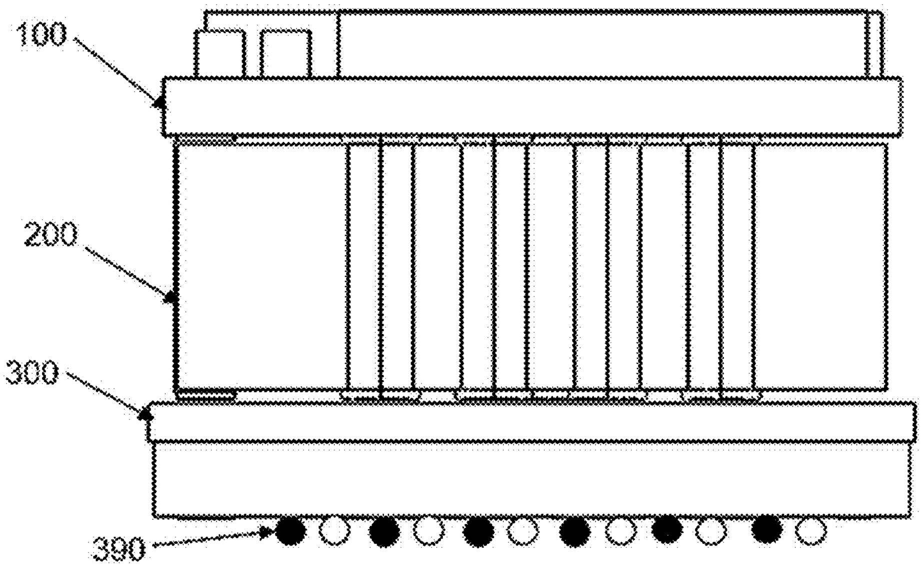

In a preferred embodiment, as shown in FIG. 7D, the bottom surface of the bottom substrate 310 can be plastic encapsulated to form a plastic package 370, and a window is opened on the bottom surface of the plastic package 370 to expose the electrode, and solderability treatment or ball planting is performed to form the pin of the BGA package; the plastic package 370 can protect the welding points between the bottom substrate 310 and the capacitor element 362 and between the copper columns 331/332/341/342/351 so as to improve the reliability of the module.

In a preferred embodiment, after the top assembly 100, the middle assembly 200 and the bottom assembly 300 are welded together, the double-face plastic package is formed through a double-face plastic packaging process, all welding points can be hidden, and the reliability is further improved.

In a preferred embodiment, the capacitor element 362 and the copper column 331/332/341/342/351 can also be arranged in the bottom substrate 310 by means of a PCB embedding process, so as to improve the reliability of the module.

Embodiment 7

Figure 8A:
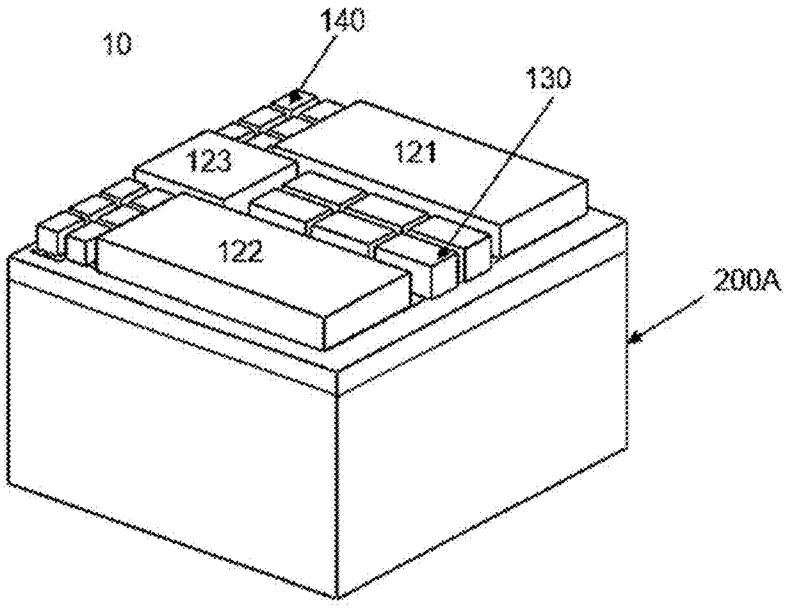
FIG. 8A to FIG. 8D are schematic structural diagrams of a seventh embodiment.
Figure 8B:
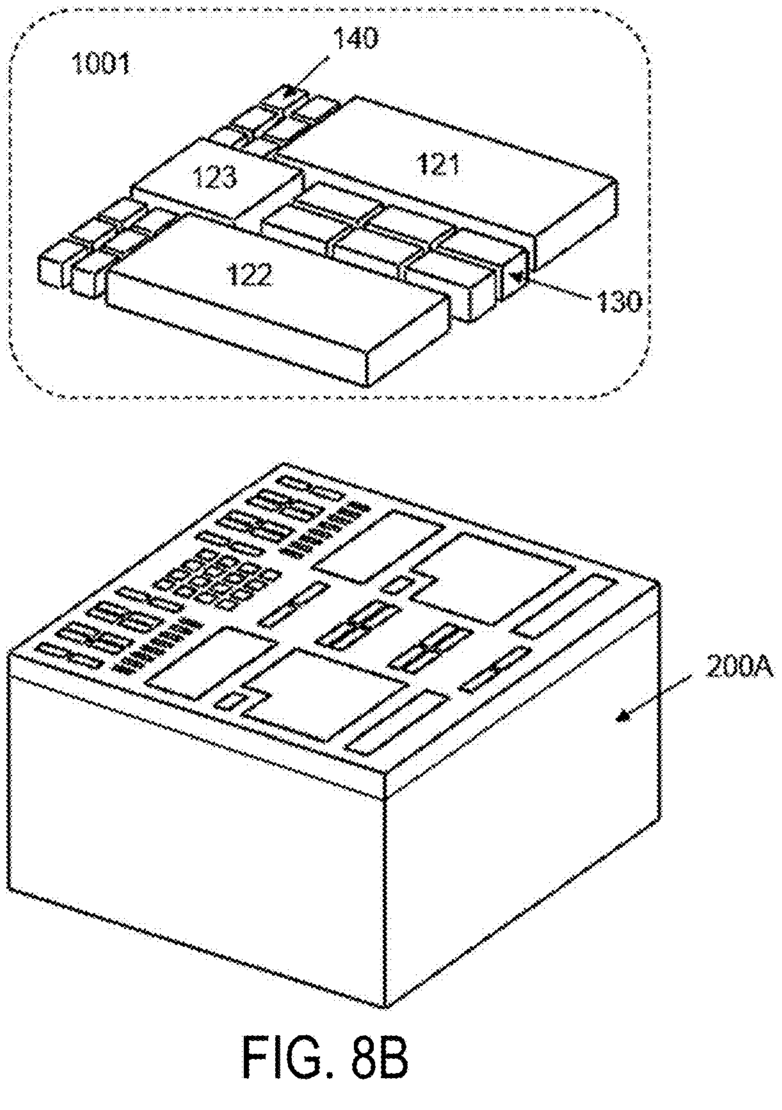
Figure 8C:
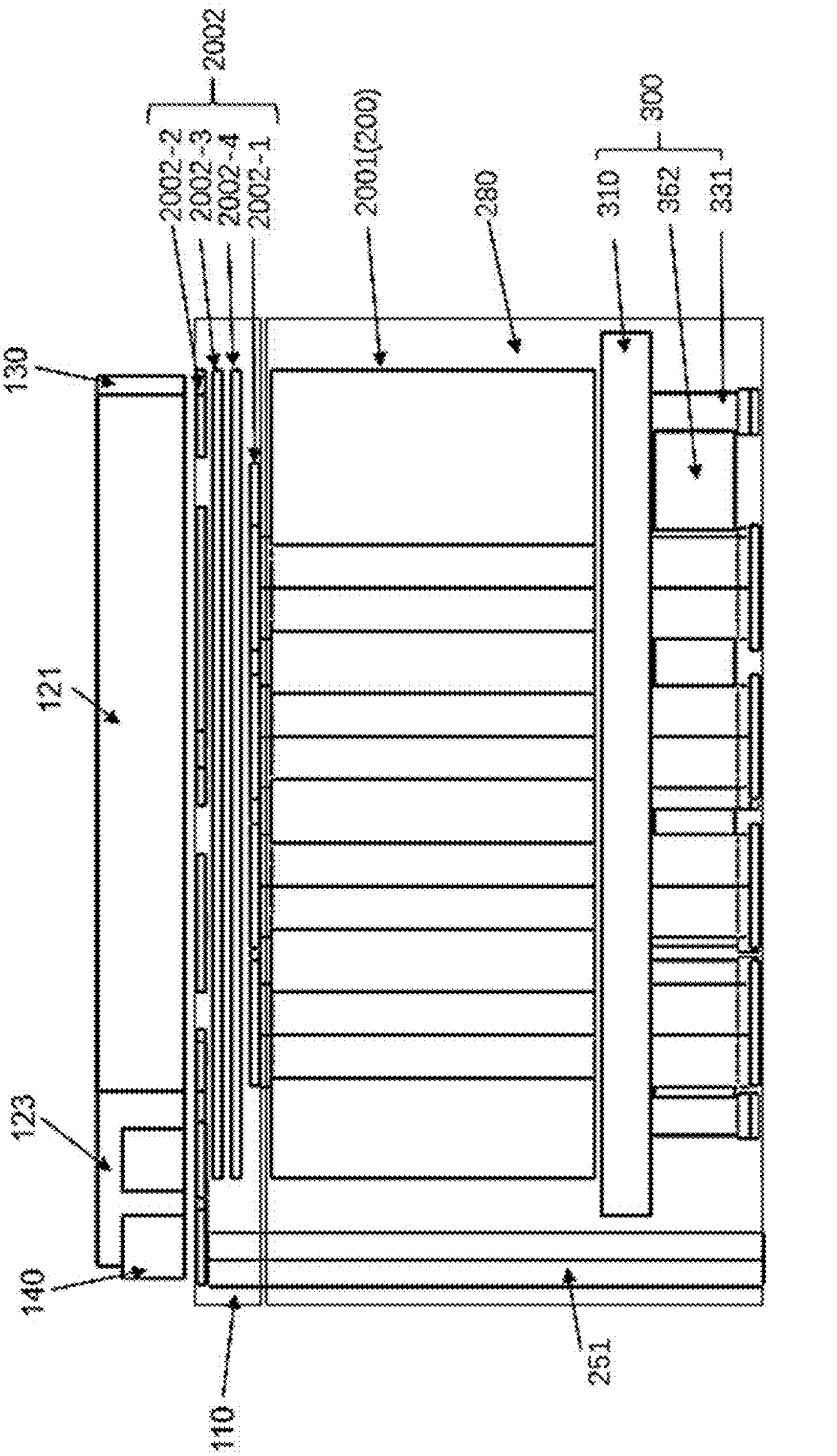
Figure 8D:
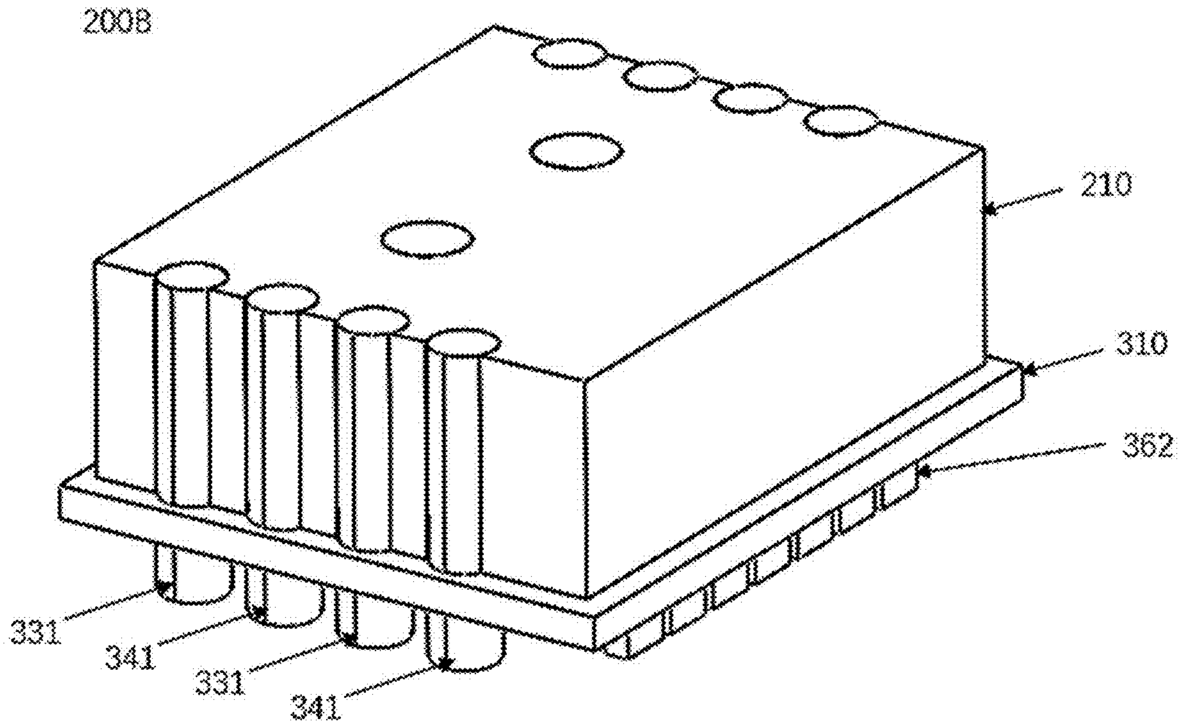

FIG. 8A shows an overall structure of the embodiment; FIG. 8B is an exploded view of the structure of FIG. 8A; FIG. 8C is a side view of the integrated power converter module of the present embodiment after hiding the plastic-packaged insulating dielectric material 280; and FIG. 8D shows the overall structure of the main body structure 2001 of the present embodiment. As shown in FIG. 8A to FIG. 8D, the two-phase VRM module 10 of the embodiment comprises a top assembly 1001 and an integrated substrate assembly 200A. The top assembly 1001 of the embodiment is the same as the second embodiment; the integrated substrate assembly 200A comprises a top plate 110, a main body structure 200B, a signal electrical connector 251, and the plastic packaging material 280. A main body structure 200B shown in FIG. 8D further comprises an inductor assembly 210, a bottom substrate 310 and copper columns 331/332/341/342 (wherein 332 and 342 are not shown) and the capacitor element 362. The inductor assembly is welded to the upper surface of the bottom plate assembly 310, and the copper columns 331/332/341/342 and the capacitor element 362 are welded to the lower surface of the bottom plate assembly 310. Further welding the main body structure 200B of FIG. 8D on the lower surface of the top plate 110, and then carrying out plastic packaging on the lower surface of the top plate 110 and parts thereof, namely the main body structure 200B. Then, electroplating on the side edge of the plastic package to form a signal electrical connector connected between the top assembly 1001 and the load mainboard; and windowing and electroplating the lower surface of the plastic package to form pins on the lower surface of the substrate assembly 200A, wherein the specific effect is shown in FIG. 8*c*. The wiring in the bottom substrate 310 enables the electrical network of the local or all of the pads on the lower surface of the bottom substrate to meet the up-down and one-to-one correspondence of the positions of the electrical network of the lower surface of the integrated substrate assembly 200A. The area of the copper column on the lower surface of the bottom substrate 310 is greatly reduced, and the area of the capacitor element 362 is greatly increased. Moreover, the integrated substrate assembly 200A can be manufactured only by means of welding and plastic packaging and an electroplating process, the process is simple, and the production cost is low. In the embodiment, the copper column can be metal column made of other conducting material.

Embodiment 8

Figure 9:
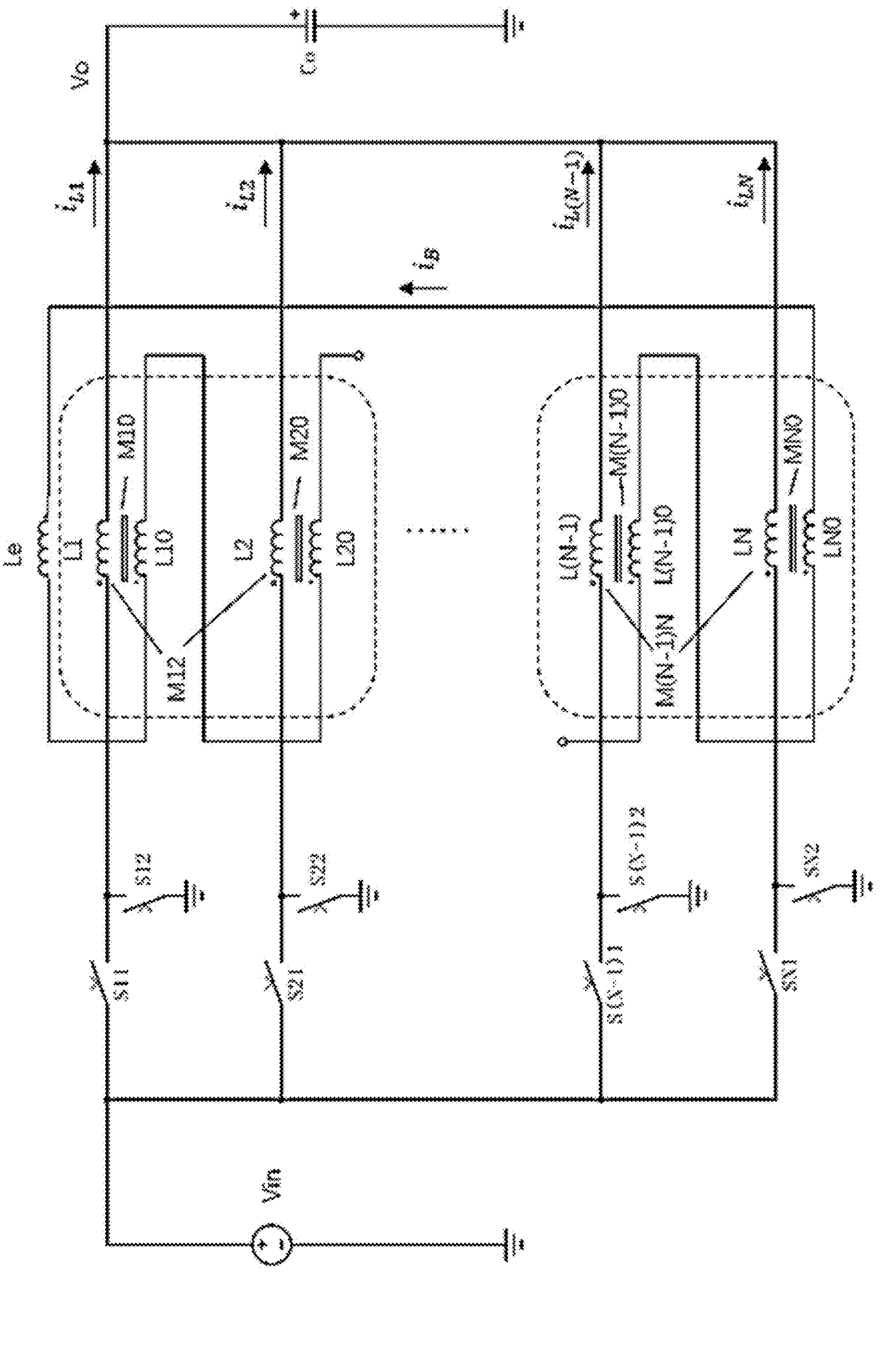
FIG. 9 is a circuit schematic diagram of a TLVR technology.

A power converter module applying a TLVR technology can further improve the dynamic performance of the power converter module. The TLVR technology is characterized in that a multi-phase inductor which does not have a magnetic coupling relationship originally has a magnetic coupling relationship with each other through an auxiliary winding. After the plurality of two-phase BUCK voltage reduction modules adopt a TLVR technology, the effect of multi-phase coupling can be equivalently realized. The multi-phase coupling inductor can realize small dynamic sensing so as to improve the dynamic performance of the multi-phase Buck module; and meanwhile, the multi-phase coupling inductor can keep a large steady-state inductance, so that the efficiency of the module is improved. FIG. 9 is a circuit schematic diagram of a TLVR technology. As shown in FIG. 9, if the function of the multiphase VRM module is realized by a plurality of two-phase VRM modules, the two-phase inductors in the first two-phase VRM module comprise a main winding L1 and a main winding L2, and the two-phase inductors in the same way to the N/2th two-phase VRM modules comprise a main winding L(N−1) and a main winding LN; and when the auxiliary winding L10 . . . LN0 is not arranged, the N-phase inductors formed by the main windings L1 . . . LN are not magnetically coupled with each other. Auxiliary windings L10 and L20 are arranged in the first two-phase VRM module, and auxiliary windings L(N−1)0 and Ln0 are arranged in the N/2th two-phase VRM module. The auxiliary winding L10 . . . LN0 and the corresponding main winding L1 . . . LN are arranged in a positive coupling mode; and the input terminals of the auxiliary winding L10 . . . LN0 and the corresponding terminals of the main winding L1 . . . LN are dotted terminal and are marked as a point end; and the output terminals of the main winding L1 . . . LN and the corresponding terminals of the auxiliary winding L10 . . . LN0 are non-dotted terminal and non-pointed ends. All the auxiliary windings are sequentially connected in series according to the non-point end of the next auxiliary winding in series with the point end of the previous auxiliary winding, and are externally connected with a compensation inductor Le. The PWM signals of the N-phase Buck voltage reduction circuit are arranged in a mode of sequentially staggered phases (360/N); and the N-phase main windings L1 . . . Ln which are originally not coupled with each other are coupled through the auxiliary winding L10 . . . LN0 and the compensation inductor. According to the embodiment, the two-phase VRM module 10 is taken as an example, and the combination of the TLVR technology and the technical scheme of the application is shown.

Figure 10A:
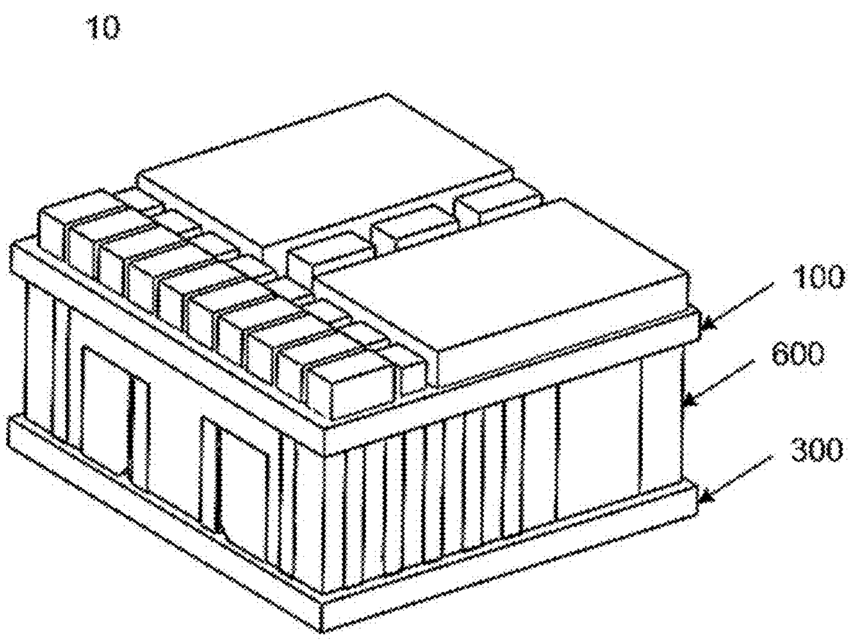
FIG. 10A to FIG. 10H are schematic structural diagrams of the eighth Embodiment.
Figure 10B:
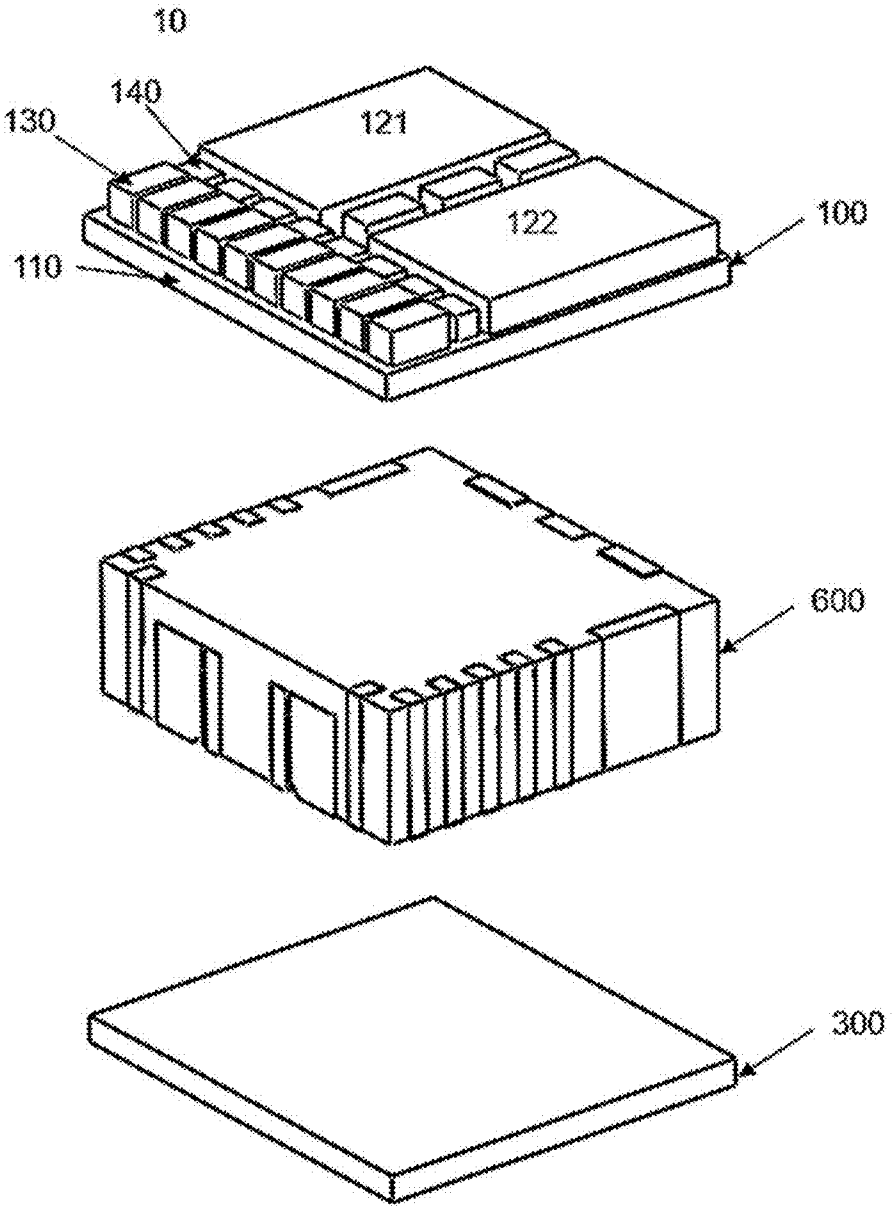
Figure 10C:
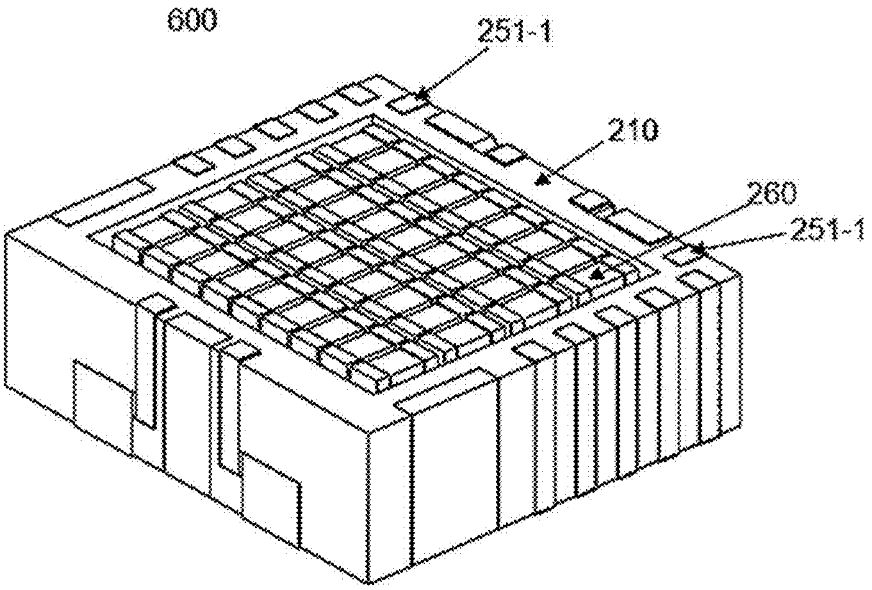
Figure 10D:
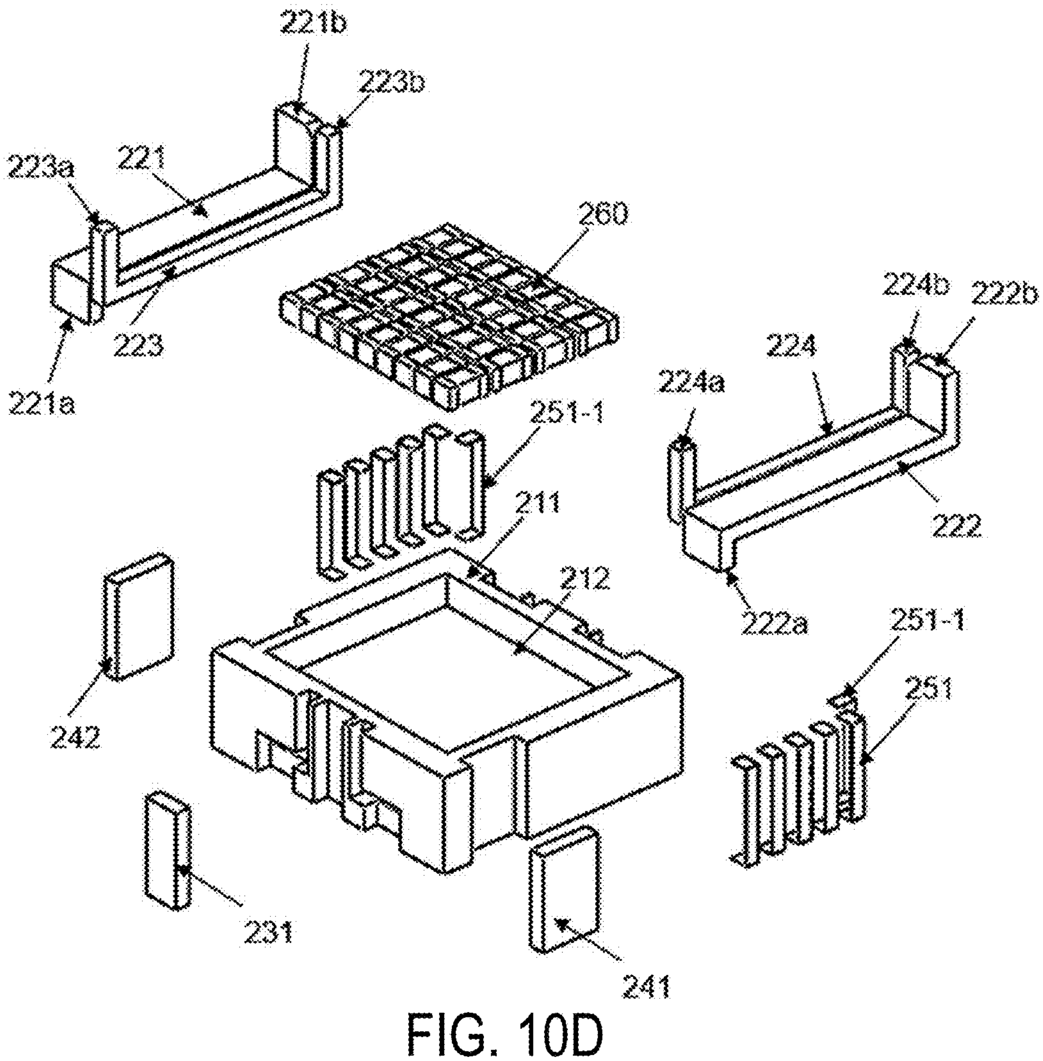

FIG. 10A shows an overall structure of the integrated power converter module of the present embodiment, and FIG. 10B is an exploded view of the structure of FIG. 10A; as shown in FIG. 10A and FIG. 10B, the two-phase VRM module 10 of the embodiment comprises a top assembly 100 and an integrated assembly 600 (the integrated assembly 600 of the embodiment can directly form a middle assembly) and a bottom assembly 300. The top assembly comprises a top plate 110, an IPM unit 121/122, an input capacitor 130 and other passive elements 140. The IPM unit 121/122 is arranged at a position close to a first side edge of the top plate 110; a signal pin of the IPM unit 121/122 is arranged in a direction opposite to the first side edge, namely a position close to the third side edge; other passive elements 140 are mainly elements of a control signal loop of the IPM unit, so that the signal pins of the adjacent IPM units 121/122 are arranged, and the input capacitor 130 is arranged at the position between the two IPM on the top plate 110 and the remaining positions of the top surface. FIG. 10C is a schematic structural diagram of the integrated assembly 600 viewed from the bottom (equivalent to upside/down and left-rear/front-right direction reversal with respect to FIG. 10B and FIG. 10C, and right-rear/left-front direction unchanged, and FIGS. 10D-10G are same). FIG. 10D is a structural exploded view of FIG. 10C; and as shown in FIGS. 10C and 10D, the integrated assembly 600 comprises an inductor assembly 210 and an output capacitor assembly 260.

The inductor assembly 210 comprises a magnetic core 211, a main winding 221/222, an auxiliary winding 223/224, a first power electrical connector 231, a second power electrical connector 241/242 and a signal electrical connector 251, wherein the main winding 221 and the auxiliary winding 223 are arranged together and are respectively a first main winding and a first auxiliary winding, and the main winding 222 and the auxiliary winding 224 are arranged together and are respectively a second main winding and a second auxiliary winding.

An insulating material area is arranged between the main winding 221/222 and the corresponding auxiliary winding 223/224. Electrical isolation is achieved through the insulating material area, and meanwhile the coupling coefficient between the main winding 221/222 and the corresponding auxiliary winding 223/224 is improved.

The main winding 221/222 has a transverse detour section and is of a Z-shaped structure, one end of the Z-shaped shape extends towards the top surface of the magnetic core 211, a pin 221*a*/222*a* is formed on the top surface, and the pins 221*a*/222*a* are vertically corresponding to the positions of the SW pads of the IPM units 121/122 electrically connected to the pins 221*a*/222*a*; the other end of the Z-shaped word extends towards the bottom surface of the magnetic core 211, a pin 221*b*/222*b* is formed on the bottom surface, and the pin 221*b*/222*b* is connected with the load through the bottom assembly 300 to provide energy for the load. The auxiliary winding 223/224 is of a x-shaped structure, the two ends of the auxiliary winding 223/224 extend towards the bottom surface of the magnetic core 211, and pins 223*a*/223*b*/224*a*/224*b* are formed on the bottom surface; the pins 223*a*/223*b*/224*a*/224*b* are electrically connected to the bottom pins of the two-phase VRM module 10 through the bottom assembly 300, and then the plurality of auxiliary windings of the two-phase VRM module 10 are connected in series through the circuit structure arranged outside the embodiment, so that a TLVR loop is formed, and the function shown in FIG. 9 is achieved. In a preferred embodiment, the circuit structure arranged outside the embodiment can be a third assembly bottom plate, expansion of any number of two-phase modules is facilitated, and a person skilled in the art can provide a compensation inductor Le and other structures in a third assembly bottom plate according to actual needs. According to the structure of the embodiment, the electrical connection structure between the auxiliary windings 223/224 in the module is omitted, and the connecting structure is usually completed in the bottom assembly 300.

The magnetic core 211 has a first side surface to a fourth side surface which are adjacent in sequence, and corresponds to the position of the first side edge to the fourth side edge of the top plate 110. The first power electrical connector 231 is disposed on the first side surface and is located between the pin 221*a* and the pin 222*a*. The second power electrical connector 241/242 is disposed on the second side and the fourth side, respectively, and is close to one side of the first side; the pin 221*b*/222*b* is arranged on the third side surface, and the signal electric connector 251 is arranged at the remaining positions of the second side surface, the third side surface and the fourth side surface. Due to the fact that the pin 221*b*/222*b* corresponds to the inductor output end, compared with the inductor input end, the potential of the pin 221*b*/222*b* is relatively static potential, and therefore, the interference-prone analog signal electrical connector 251-1 can be arranged at the position of the third side surface, which is close to the pin 221*b*/222*b*, so as to filter out electromagnetic field interference generated by rapidly changing voltage. In order to maintain the strong coupling between the main winding 221/222 and the corresponding auxiliary winding 223/224, the distance between the pin 221*b*/222*b* and the corresponding pin 223*b*/224*b* is very close, so that the corner of the pin 221*b*/222*b* close to the corresponding pin 223*b*/224*b* is provided with a chamfer or a notch, so as to avoid a short-circuit risk possibly occurring during welding.

The bottom of the magnetic core 211 is provided with a recessed area, the recessed area is a capacitor setting area 212 for placing the output capacitor assembly 260, and the output capacitor assembly 260 comprises a plurality of SMD capacitors arranged in an array; the SMD capacitor can be glued in the capacitor arrangement area 212, or can be directly welded with the bottom assembly 300, or the integration can be realized by adopting the plastic packaging process, the PCB embedding process and the like in the embodiment. In a better embodiment, the embodiment and the second embodiment can be combined, so that the exposure of the welding point is reduced, and the reliability is improved.

Figure 10E:
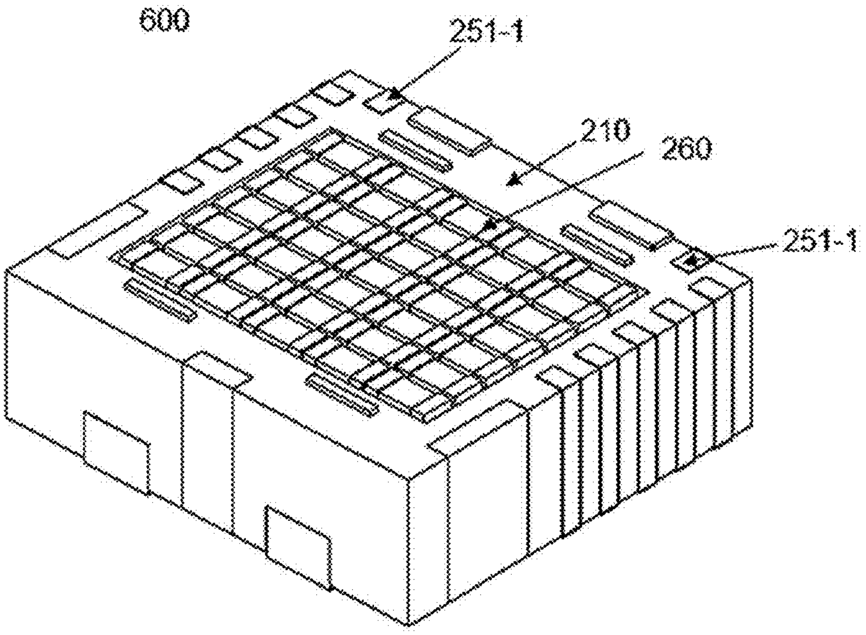
Figure 10F:
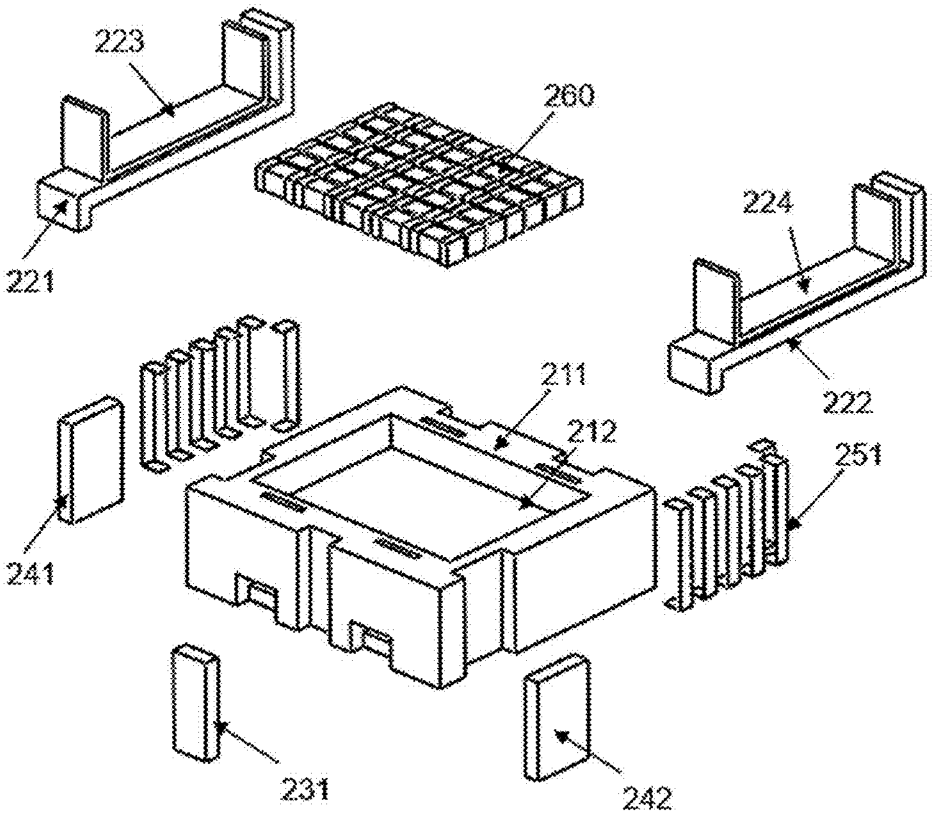

In a preferred embodiment, as shown in FIG. 10E, the integrated assembly 600 may have another structure. FIG. 10F is an exploded view of the structure of FIG. 10E. The difference lies in the relative position of the auxiliary winding 223/224 and the main winding 221/222. As shown in FIGS. 10E and 10F, the auxiliary windings 223/224 and the corresponding main windings 221/222 are arranged vertically in a stacked manner. The positions of the pins 223*a*/223*b*/224*a*/224*b* are also correspondingly adjusted, and a common straight line position relationship with the pins 221*b*/222*b* is formed on the bottom surface of the magnetic core 211; since the auxiliary winding 223/224 does not occupy the horizontal area of the magnetic core 211, the main winding 221/222, the first power electrical connector 231 or the second power electrical connector 241 can adopt a wider width, so that the direct current impedance of the main winding 221/222 is reduced, and the efficiency is improved.

Figure 10G:
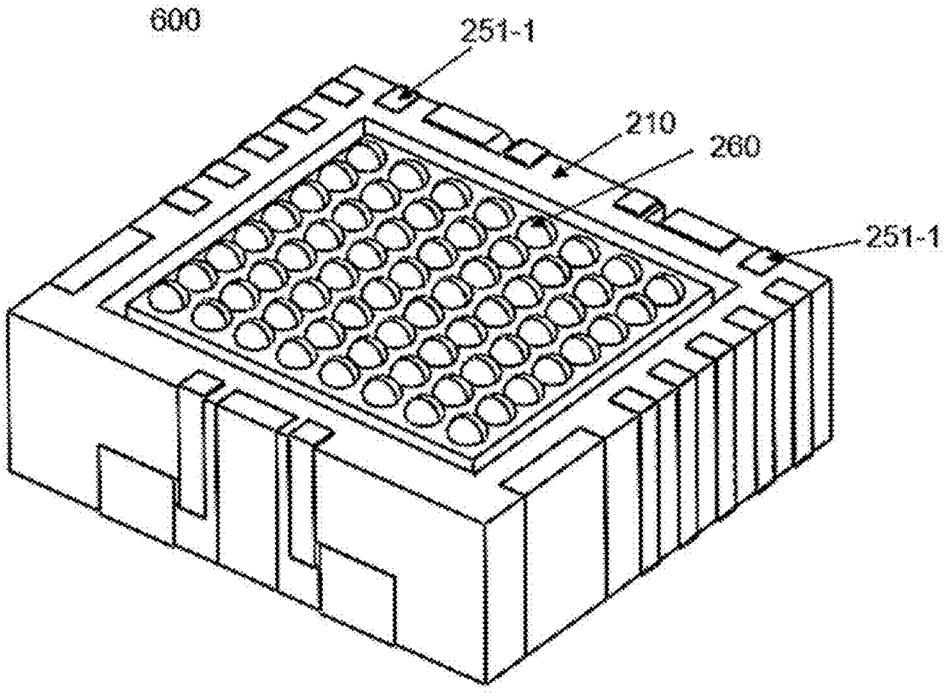
Figure 10H:
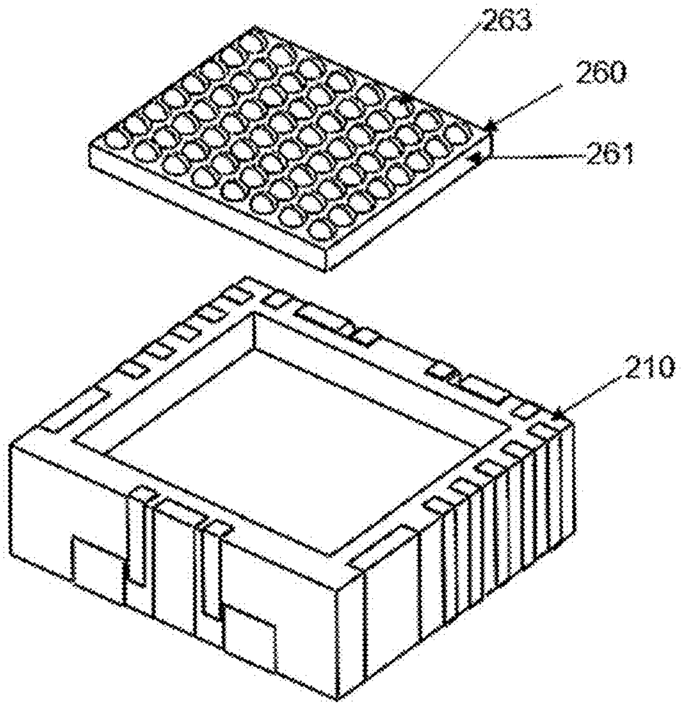

In a preferred embodiment, as shown in FIG. 10G, the integrated assembly 600 may have another structure. FIG. 10H is an exploded view of the structure of FIG. 10G. The structure is different in that the output capacitor assembly 260 is an integrated packaging type capacitor assembly adopting an LGA or BGA pin, such as a silicon capacitor (the coplanarity of the bottom surface pin of the output capacitor assembly 260 and the bottom surface pin of the inductor assembly 210 does not consider the height of the welding ball). The capacitor has the characteristics of being thin in thickness and high in capacitance density, the depth of the capacitor setting area 212 can be reduced, the height of the magnetic core 211 is reduced, and the current density of the VRM module is improved. Furthermore, the pin polarity of the integrated packaging type capacitor assembly disclosed by the embodiment meets the staggered arrangement mode of positive and negative ends, so that the parasitic inductance of the loop between the integrated packaging type capacitor and the load is minimum.

Although the module structure and the implementation mode are described by taking the two-phase VRM module 10 as an example, the technical scheme of the application is not limited to a two-phase VRM module. In other embodiments, the same concept can be applied to other multi-phase VRM modules, other power conversion modules and power supply products, and a person skilled in the art can obtain corresponding structures through analogy.

Embodiment 9

Figure 11:
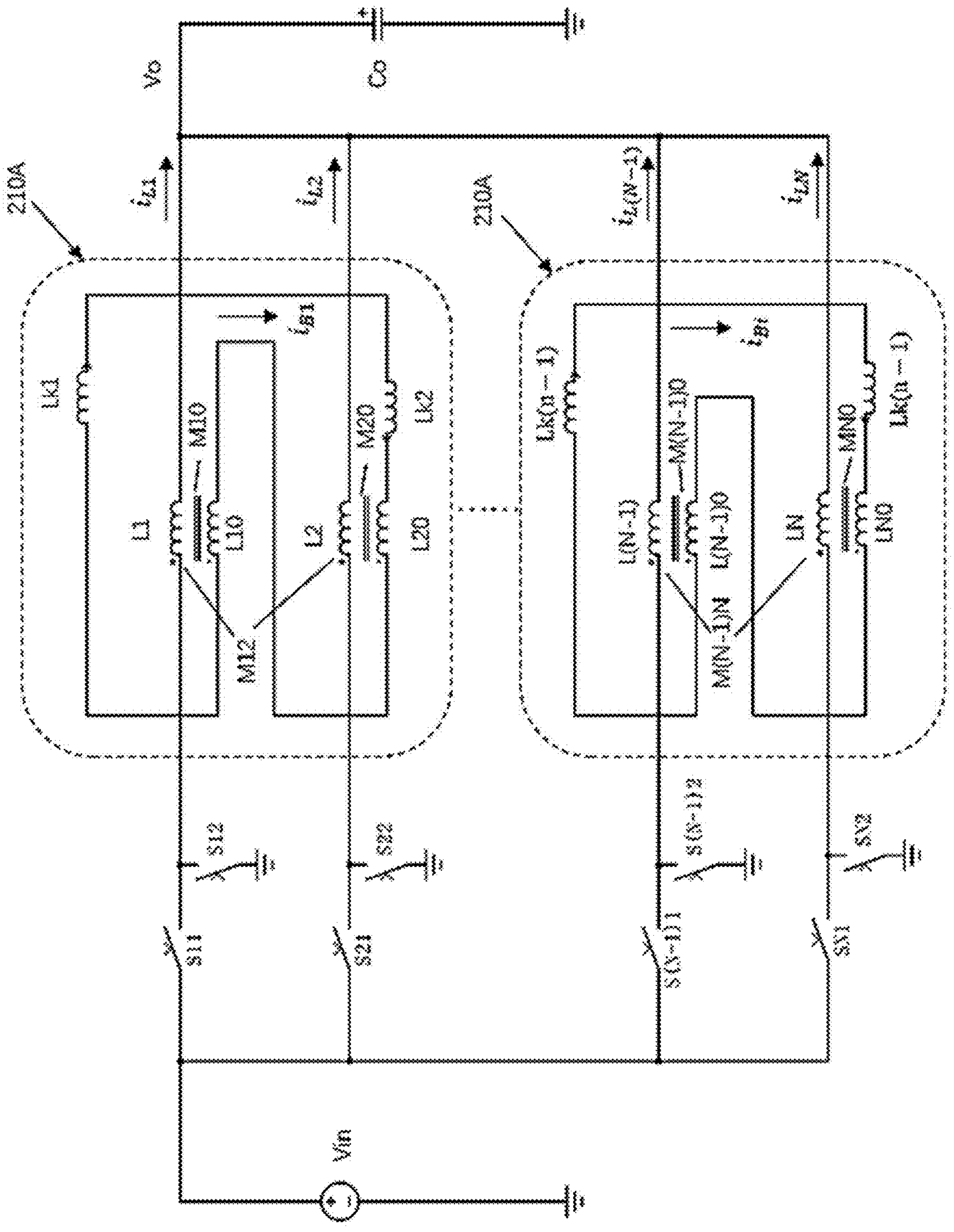
FIG. 11 to FIG. 12C are schematic diagrams of the ninth Embodiment.

FIG. 11 is another schematic diagram of a power supply scheme comprising N VRM modules, and the inductor of the VRM module is a two-phase inductor adopting a TLVR technology. As shown in FIG. 11, 210A is a two-phase inductor adopting a TLVR technology, and the N two-phase inductors 210A adopting TLVR technology form the inductor of a 2N-phase VRM module. After the two-phase inductor in the two-phase inductor 210A adopting the TLVR technology realizes the TLVR technology through the auxiliary winding, a coupling relationship exists between the two-phase main windings, and when the two PWM phases corresponding the two-phase TLVR 210A are staggered by 180 degrees, the two-phase inductor works in an anti-coupling state. The anti-coupling inductor enables the VRM module to have low dynamic inductance so as to improve the dynamic performance of the output voltage, and meanwhile, the VRM module has relatively high steady-state inductance to improve the efficiency of the VRM module.

a plurality of two-phase inductors adopting a TLVR technology form a power supply scheme of the multi-phase VRM inductor, and the two auxiliary windings of each two-phase inductor only complete series connection near the outside of the inductor magnetic core or only complete series connection in the inductor magnetic core; and after the two auxiliary windings are connected in series, the induced voltage on the winding pin is much lower than the induced voltage on the winding pin after the plurality of auxiliary windings are connected in series; the pin voltage amplitude of the two-phase VRM module 10 is worthy of being limited, and the pin peripheral circuit is greatly reduced by the high-voltage breakdown risk; and meanwhile, the placement position of the plurality of VRM modules formed by the plurality of two-phase inductors adopting the TLVR technology on the load mainboard is more flexible and is not limited by the auxiliary winding.

Figure 12A:
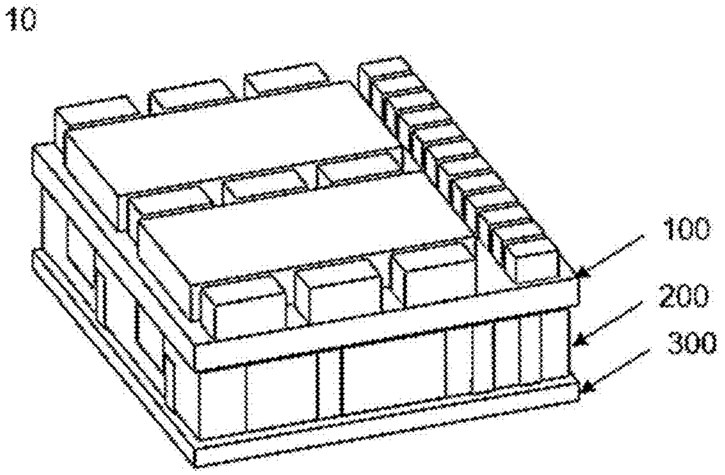
Figure 12B:
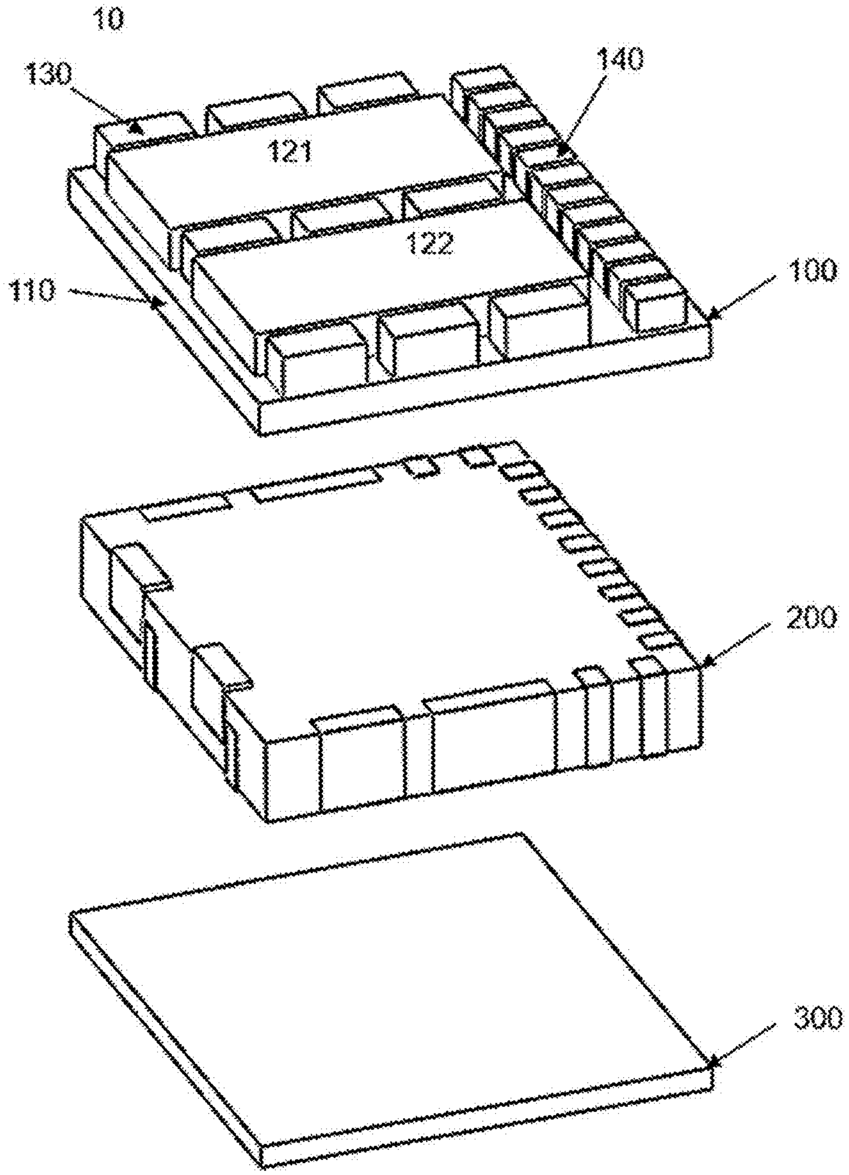
Figure 12C:
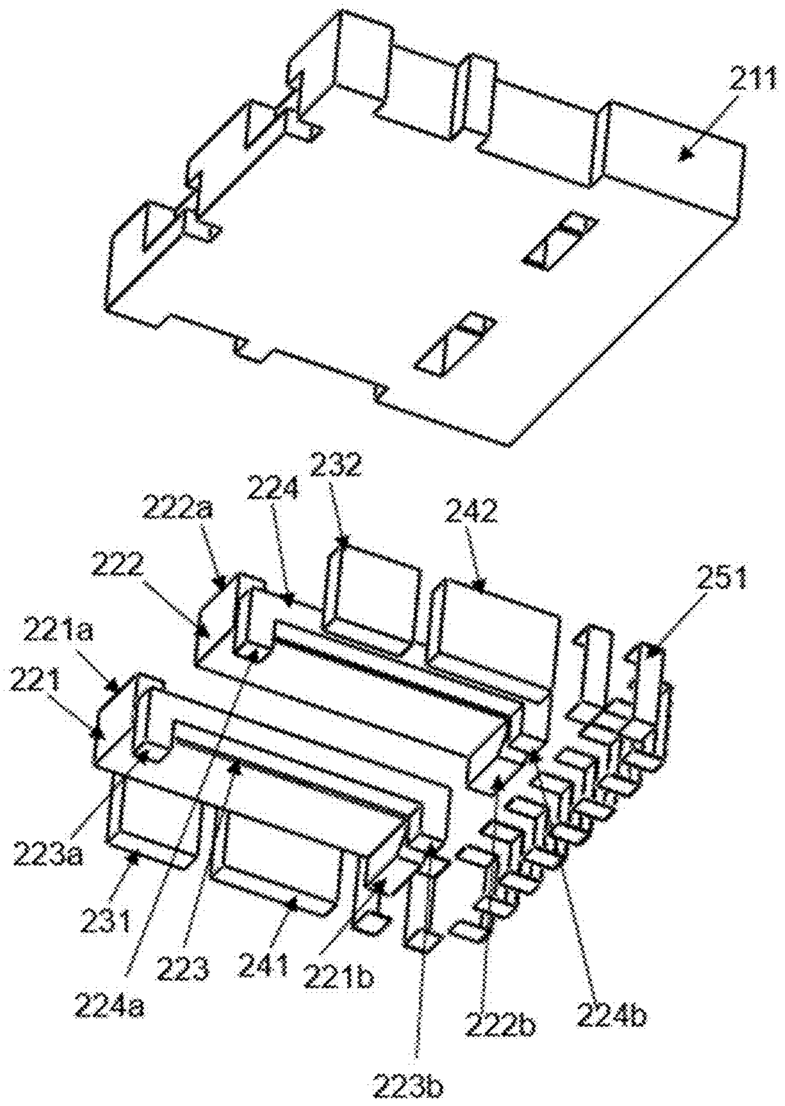

FIG. 12A shows a two-phase VRM module 10 of the present embodiment, and FIG. 12B is an exploded view of the structure of FIG. 12A; as shown in FIGS. 12A and 12B, the overall structure is the same as the two-phase VRM module 10 in the embodiment shown in FIG. 10A, and details are not described herein again; and FIG. 12C is a structural exploded view of the middle assembly 200; as shown in FIG. 12C, the second pins of the two main windings 221 and 222 in the embodiment are both arranged in the middle of the bottom surface of the magnetic core; and the two auxiliary windings 223 and 224 are connected in series through the bottom assembly 300. Specifically, the short connection lines 1, 224*b* and 223*a* are formed by short circuit connection of the 223*b* and the 224*a* to form the short wiring 2, so that the two-phase TLVR technology is realized. The purpose of setting is to shorten the distance between the second pin and the load and improve the efficiency; and the requirement of auxiliary winding wiring on the load mainboard is eliminated, and the wiring space is saved for the main board. However, the problem exists in the embodiment that the two short connection lines of the two auxiliary windings are crossed, so that the paths of the short connection line 1 and the short connection line 2 are long, and the arrangement of the short connection line 1 and the short connection line 2 on the bottom assembly 300 is complex. The output capacitor assembly 260 of the embodiment is arranged in the bottom assembly 300 (the specific arrangement mode can be referred to Embodiment 6, and FIGS. 12A to 12C are not shown); in other embodiments, the output capacitor assembly can also be arranged in the middle assembly or arranged outside the two-phase VRM module 10.

Embodiment 10

Figure 13A:
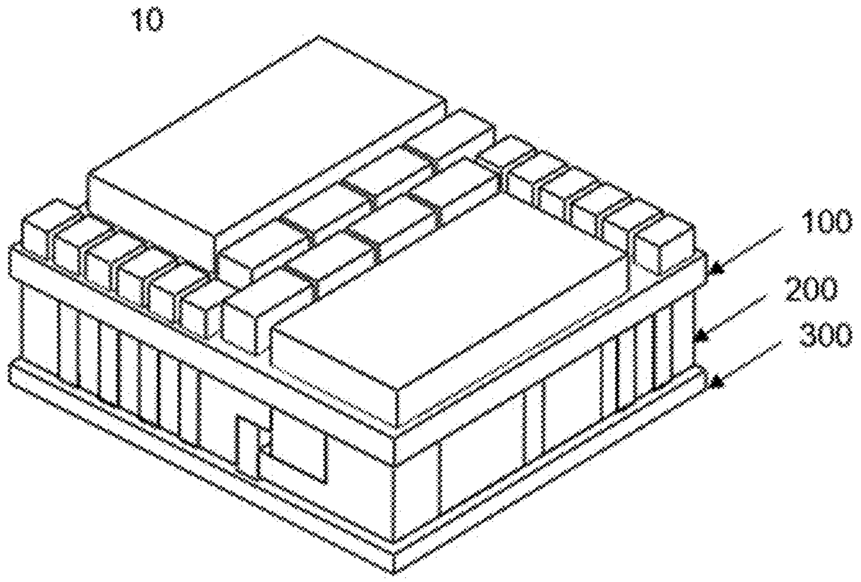
FIG. 13A to FIG. 13C are schematic structural diagrams of a tenth embodiment.
Figure 13B:
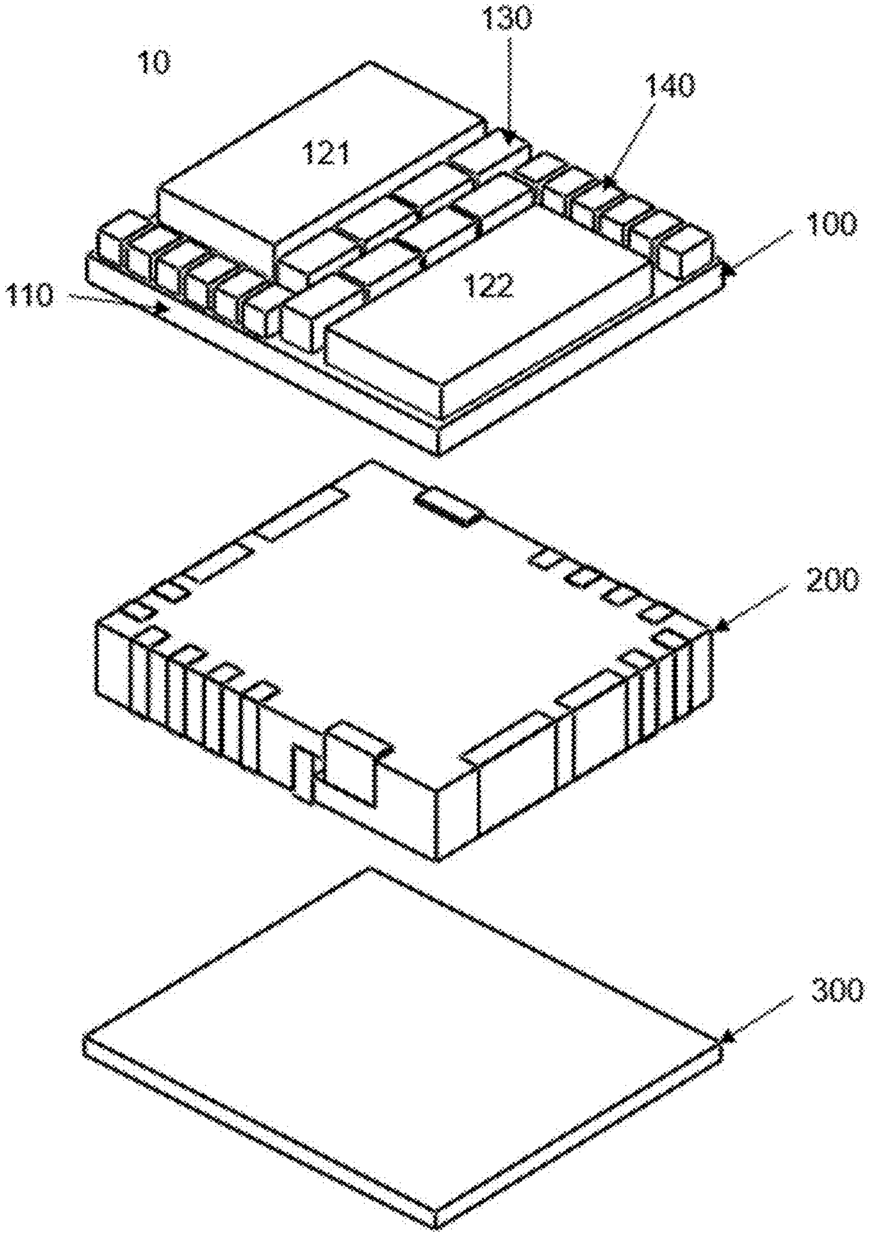
Figure 13C:
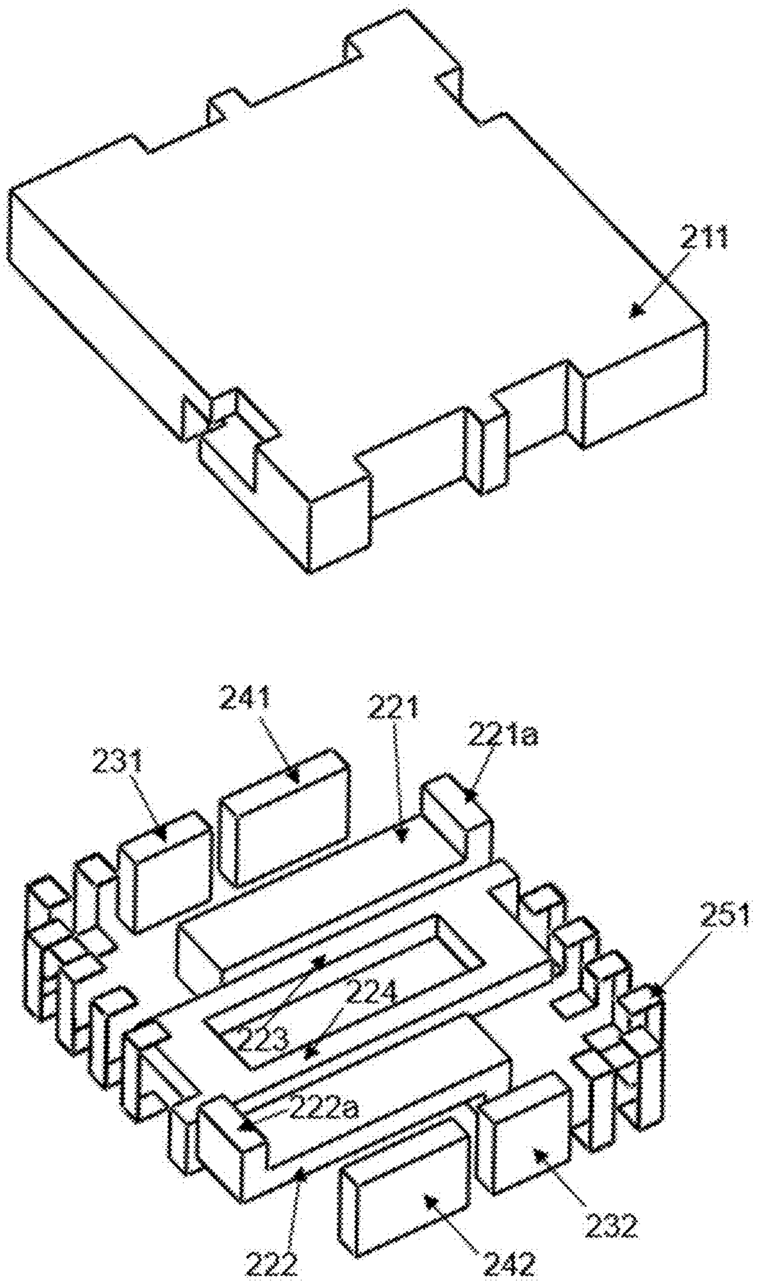

FIG. 13A illustrates a two-phase VRM module 10 of the present embodiment, FIG. 13B is an exploded view of the structure of FIG. 13A, and FIG. 13C is a structural exploded view of the middle assembly 200; and the embodiment of the application has the same technical effect as the implementation shown in FIG. 12A, the difference between the embodiment and the embodiment shown in FIG. 12A is the layout mode of the IPM 121 and the IPM 122, the arrangement mode of the winding and the setting mode of the signal PIN. The SW pin of the IPM 121 and the SW pin of the IPM 122 are arranged on the two opposite sides of the top plate 110, and the input capacitor is located between the IPM 121 and the IPM 122; and the first pin 221*a* of the first winding is arranged on the first side surface close to the magnetic core; and the first pin 222*a* of the second winding is arranged on the third side surface close to the magnetic core; and the second pins of the first winding and the second winding are both arranged in the middle of the bottom surface of the magnetic core. As shown in FIG. 13C, the auxiliary winding 223 and the auxiliary winding 224 are connected in series in the magnetic core 211 through 225 and 226; the auxiliary winding extends outwards and forms pins 225*a* and 226*a* on the surface of the magnetic core. The auxiliary winding in the embodiment is connected in series in the magnetic core, so that the wiring of the bottom assembly is simple; the auxiliary windings 225 and 226 can introduce a inductance value corresponding to the leakage inductance Lk1 and Lk2 in FIG. 11, by adjusting the widths W1 and W2 of the auxiliary windings 225 and 226, the sizes of the leakage inductance Lk1 and the leakage inductance Lk2 can be adjusted to adjust the coupling coefficient between the auxiliary winding and the main winding, so that the dynamic inductance of the two-phase TLVR is adjusted, and the difference of the dynamic inductance requirements of different application scenes is met.

Furthermore, because the area of the smart card mainboard reserved for the integrated power converter module (hereinafter referred to as a module for short) becomes smaller and smaller, the requirement for the unit area output current density of the integrated power converter module becomes larger and larger. According to the structure and the implementation scheme, the power supply current density per unit area is exerted to the extreme, and the density of the power supply current per unit area of the integrated power converter module can be improved by two times or more than 2 times compared with a traditional structure ratio. In the first to fourth embodiments and the sixth embodiment to the tenth embodiment, the input capacitor Cin and the IPM units 121 and 122 are arranged on the top surface of the top plate 110; due to the progress of the magnetic material, the shape plasticity of the magnetic material is enhanced, and the area of the inductor can be further reduced, so that the area of the IPM unit and the area of the input capacitor Cin become the bottleneck of further optimization of the area of the integrated power converter module. On the top surface of the integrated power converter module, the area of 60% is occupied by the IPM unit (2*6 mm*4 mm). In addition, the actual effective area in the IPM unit is a silicon wafer (about 3 mm*5 mm), the effective function thickness of the IPM unit is less than 0.1 mm, but the height occupation is 1 mm, which is equivalent to that most areas of the IPM are wasted. According to the application, the input capacitor Cin is arranged on one side of the bottom surface of the top plate 110, as shown in Embodiment 5, although the position of the input capacitor Cin is simply moved on the structure, the purpose of reducing the area of the integrated power converter module is achieved, but a large challenge is brought to the implementation of the design and scheme of the integrated power converter module. According to the method, the essence of the problem is accurately grasped, a trend scheme is provided, the challenge of details is solved, and various options are provided and suitable for different process scenes.

In addition, the application also discloses the eleventh to the fourteenth embodiments. In these embodiments, the IPM units 121 and 122 are placed above the bottom surface of the top plate 110, that is, the IPM units 121 and 122 can be arranged on the top surface of the top plate 110 or embedded in the top plate 110. The input capacitor Cin is arranged below the IPM units 121 and 122. It can be arranged between the bottom surface of the top plate 110 and the inductor assembly 210, and can also be embedded in the top plate 110, and is electrically connected with the IPM units 121 and 122 so as to obtain the area of the minimum loop and the minimum integrated power converter module. If the input capacitor Cin is arranged between the bottom surface of the top plate 110 and the magnetic core 211, only welding fixation is adopted, a special fixing mode is not adopted, and in the module assembling process or the welding process in the client application process, welding spots of the input capacitor Cin can be remelted, so that elements in the bottom surface of the top plate 110 fall or displace, and the reliability of the module is reduced.

Embodiment 11

In the embodiment shown in FIGS. 14A-14G, an input capacitor Cin is disposed on the inductor assembly 210 and is fixed together with the inductor assembly 210. Taking FIG. 14A as an example, the integrated assembly 600 comprises inductor assembly 210, the input capacitor assembly 292, the external electrode 294 and the plastic package 270. Input capacitor assembly 292 and the external electrode 294 are arranged on the top surface of the inductor assembly 210, the external electrode 294 is arranged adjacent to the side surface of the module, and the external electrode 294 is electrically connected with the winding of the inductor assembly 210; inductor assembly 210, the input capacitor assembly 292 and the external electrode 294 are fixed together through plastic packaging to form a plastic packaging body 270. An electrode 293 and an external electrode 294 of the input capacitor are exposed by grinding the surface of the plastic packaging body 270, the bonding pad is formed through electroplating, and the inductor assembly 210 is fixed and electrically connected with the top plate 110 through the bonding pads. The inductor assembly 210, the input capacitor assembly 292 and the external electrode 294 in FIGS. 14B-14C both adopt the structure and process shown in FIG. 14A. By adopting the integrated power converter module with the structure, the area of the integrated power converter module is reduced to 9 mm*7 mm=63 mm2 from the original 10 mm*9 mm=90 mm2, the area is reduced by more than 30%, and the power of the AI smart card in the embodiment can be increased by more than 30%, so that the computing power of the AI smart card with the same area is increased by 20% or above, so that the economic benefit of a single AI smart card is up to more than ten thousand yuan RMB.

Figure 14A:
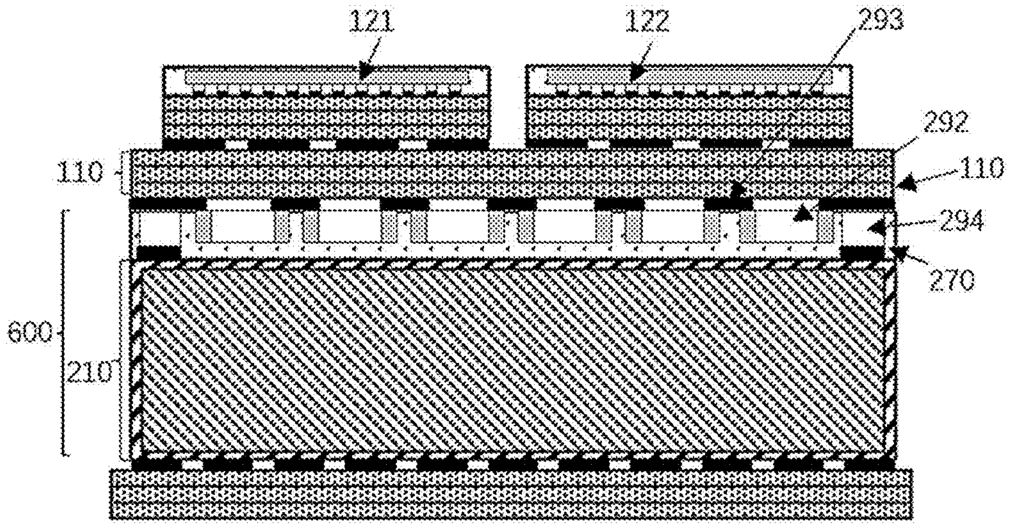
FIG. 14A to FIG. 14G are schematic diagrams of an eleventh embodiment.

As shown in FIG. 14A, the IPM unit 121/122 is welded on the top surface of the top plate 110 after being prepackaged, and the manufacturing process is simple. The side face of the inductor assembly 210 is provided with a electrical connector, and the electrical connector wraps part of the top face, part of the bottom face and one side face of the magnetic core 211, so that electrical connection between the top plate 110 and the bottom substrate 310 is realized, and electrical connection between the power electrode and the signal electrode of the IPM unit and the external bonding pad on the bottom surface of the module is realized. The thickness of the inductor assembly 210 is 6 mm, the thickness of the top plate 110 and the thickness of the bottom substrate 310 are both 0.6 mm, the thickness of the input capacitor assembly 292 and the thickness of the plastic packaging layer 270 are 0.6 mm, and the overall thickness of the IPM unit 121/122 and the packaging thereof is 0.2 mm, so that the thickness of the whole module is 8 mm.

Figure 14B:
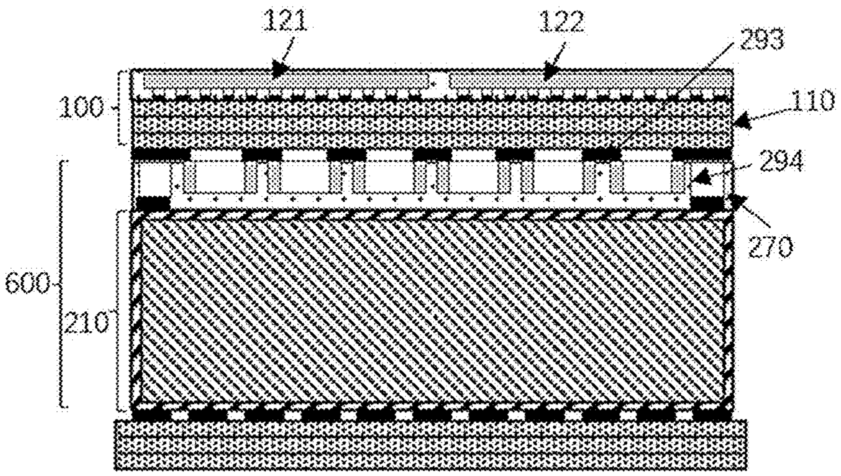

As shown in FIG. 14B, the IPM unit 121/122 adopts a bare chip, the bare chip and the external electrode 294 are arranged on the top surface of the top plate 110 together, and then the bare chip and the external electrode 294 are molded together with the top plate 110 to form the top assembly 100. The area size of the bare chip is smaller (for example, 3 mm*5 mm), the area of the VRM module is 6 mm*7 mm=42 mm2, the area of the VRM module is reduced by 53% or above, and the space utilization rate of the intelligent card mainboard is increased. Furthermore, the plastic packaging 270 can be attenuated after plastic packaging, and then electroplating is carried out on the surface of the plastic packaging 270, so that the heat dissipation capacity of the module is improved while the bare chip is protected; and the thickness of the module in the embodiment is the same as the thickness of the module shown in FIG. 14A.

Figure 14C:
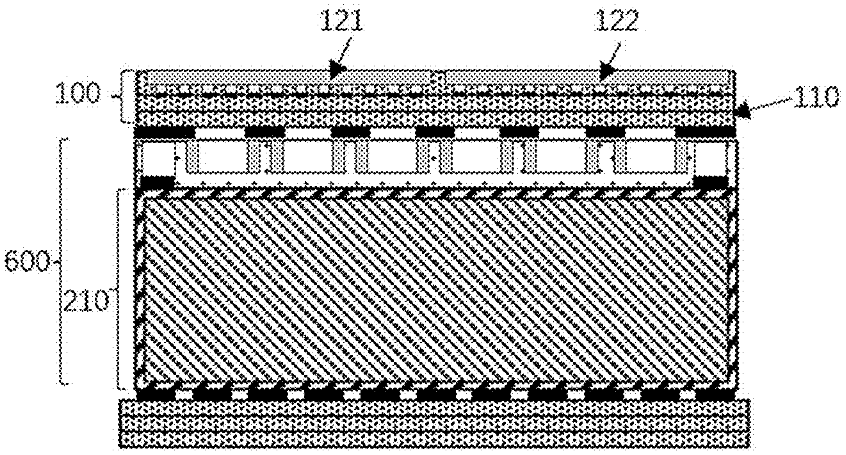

As shown in FIG. 14C, the die of the IPM unit 121/122 is embedded in the top plate 110, the area of the module is the same as the scheme shown in FIG. 14B, and the thickness of the module is reduced by the thickness of the IPM unit (ie, 0.2 mm) as compared to FIGS. 14A and 14B.

Figure 14D:
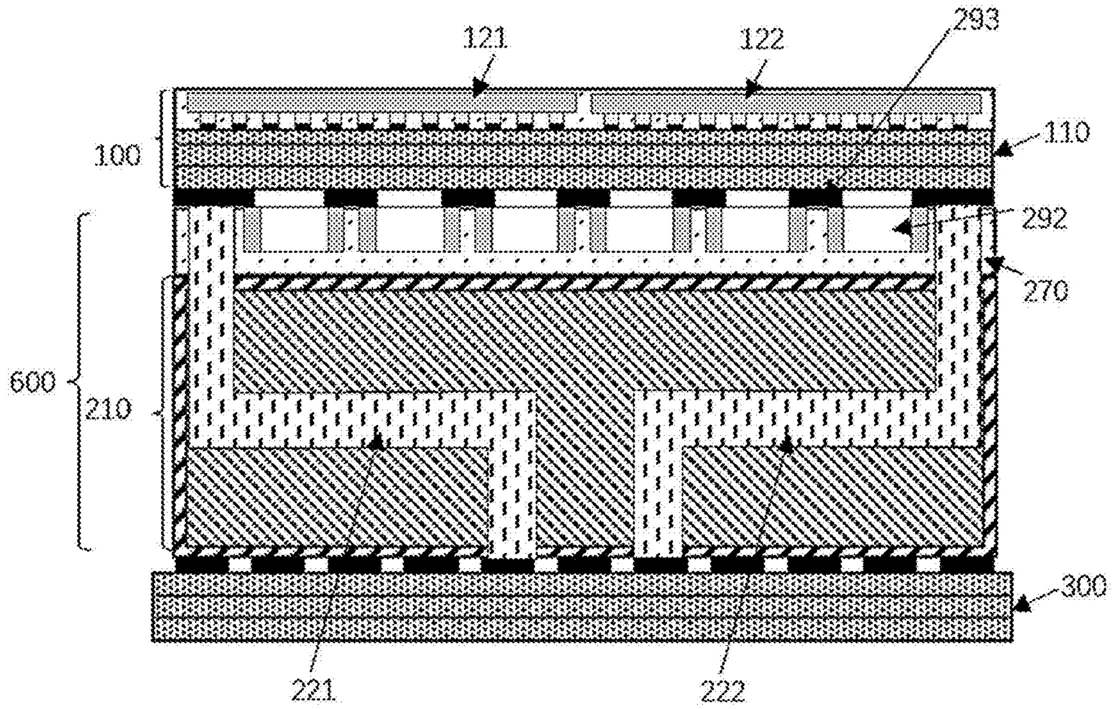
Figure 14E:
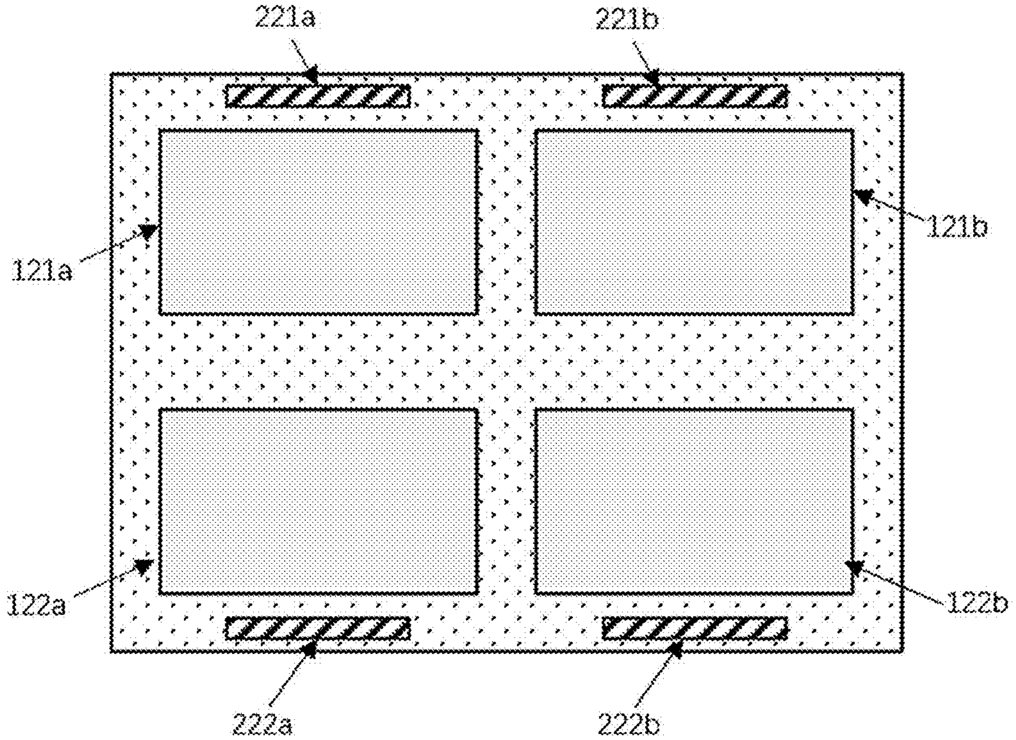

When the thickness of the inductor component in the integrated power converter module is less than 3 mm, as shown in FIG. 14D, the winding 221/222 of the inductor component 210 is Z-shaped, and the horizontal part of the inductor winding 221/222 can ensure sufficient inductance. One end of the inductor winding protrudes out of the top surface of the inductor assembly 210, and the input capacitor assembly 292 and the inductor assembly 210 are molded together to form a plastic package 270; and then the grinding plastic package exposes the end surface of the inductor winding and the input capacitor electrode, and the electroplating forming pad and the top plate 110 are welded and fixed and electrically connected. Compared with the scheme shown in FIG. 14A to FIG. 14C, the external electrode 294 is reduced, and the inductor winding 221/222 is electrically connected with the top plate 110 and the IPM unit 121/122 by utilizing the protruding end of the inductance winding. In order to increase the current density of the module, a scheme that four-phase voltage reduction circuits are connected in parallel can be adopted, bare wafers of four IPM units are arranged in the area of 10 mm*9 mm, and the output current capability of the module is increased; and an external bonding pad on the bottom surface of the module can also be the same as the scheme of 10 mm*9 mm, so that the external bonding pads of the two technical schemes are compatible, and the number of production test fixtures is reduced. FIG. 14E is a top view of FIG. 14D, comprising projections 121*a*/122*a*/122*b*/122*b* of four IPM units on the top surface, and projections 221*a*/222*a*/221*b*/222*b* of the end surfaces of the four inductor windings on the top surface, wherein the projections 121*a*/122*a* of the IPM units are arranged between the projections 221*a*/222*a* of the inductive windings, and the projections 121*b*/122*b* of the IPM units are arranged between the projections 221*b*/222*b* of the inductor windings.

Figure 14F:
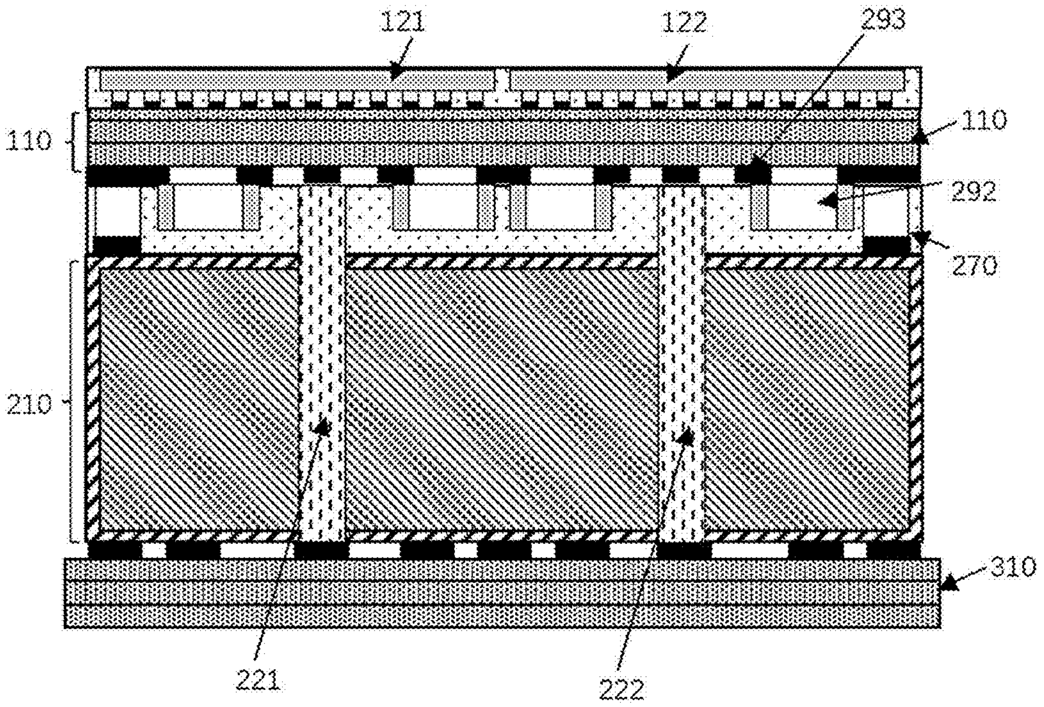
Figure 14G:
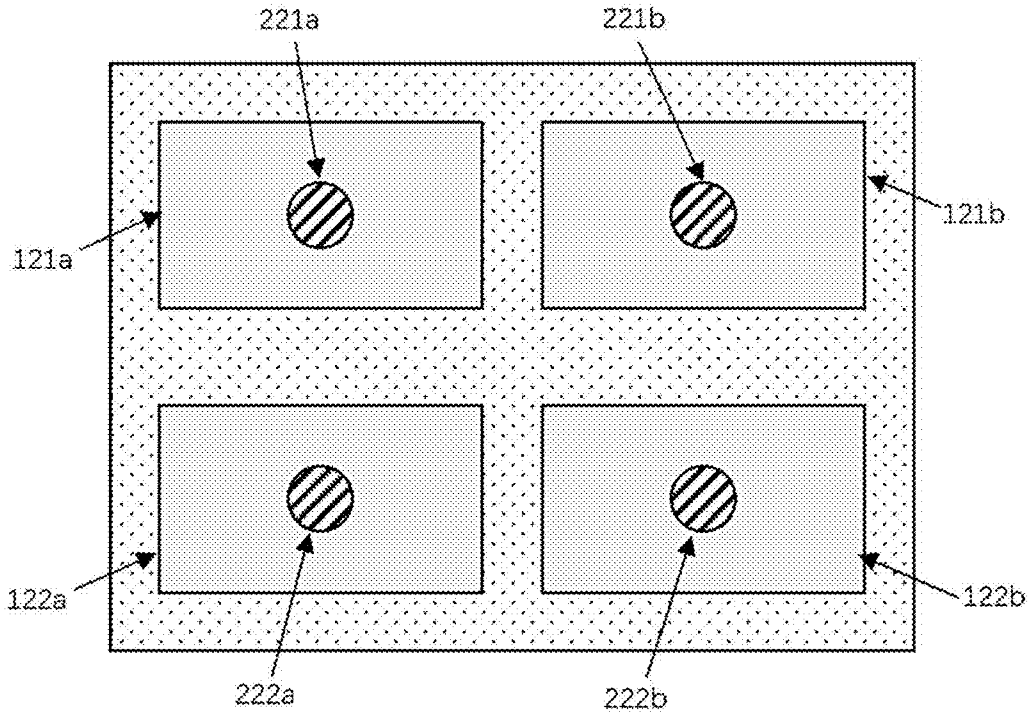

When the thickness of the inductor component in the integrated power converter module exceeds 4 mm, the inductor winding can adopt an I-shaped copper column, as shown in FIG. 14F, the inductor winding 221/222 is arranged perpendicular to the top plate 110 and the bottom substrate 310, and the projection of the inductor winding on the top surface of the top plate 110 is arranged in the projection of the corresponding IPM unit on the top surface of the top plate 110, so that the path through which the current flows is reduced, and the loss on the inductor winding is reduced. One end of the inductor winding protrudes out of the top surface of the inductor assembly 210, and the input capacitor assembly 292 and the inductor assembly 210 are molded together to form a plastic package 270; and then the grinding plastic package exposes the end surface of the inductor winding and the input capacitor electrode, and the electroplating forming pad and the top plate 110 are welded and fixed and electrically connected. The modules can also adopt a scheme that four-phase voltage reduction circuits are connected in parallel, bare wafers of four IPM units are arranged in the area of 10 mm*9 mm, and the output current capability of the modules is increased. FIG. 14G is a top view of FIG. 14F, comprising projections 121*a*/122*a*/121*b*/122*b* of four IPM units on the top surface of the top plate 110, and projections 221*a*/222*a*/221*b*/222*b* of the end faces of the four inductor windings on the top surface of the top plate 110, wherein the projections 221*a*/222*a*/221*b*/222*b* of the end faces of the inductor windings are respectively in the projections 121*a*/122*a*/121*b*/

122*b* of the IPM unit. The input capacitor Cin is arranged around the end face of the inductor winding 221/222.

Embodiment 12

Figure 15A:
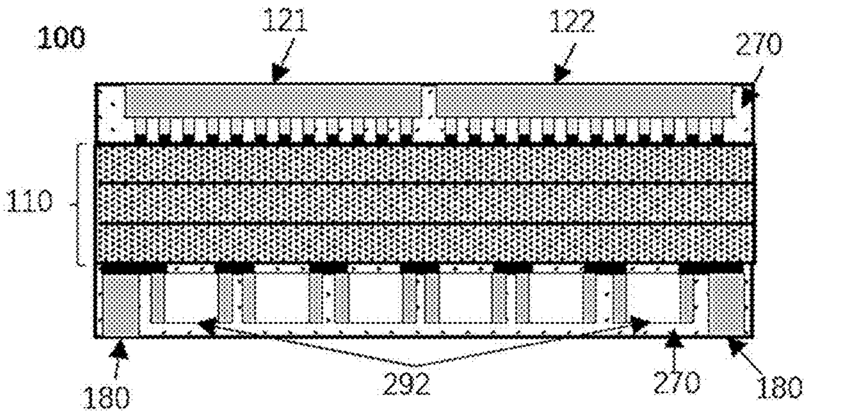
FIG. 15A to FIG. 15D are schematic diagrams of a twelfth embodiment.
Figure 15B:
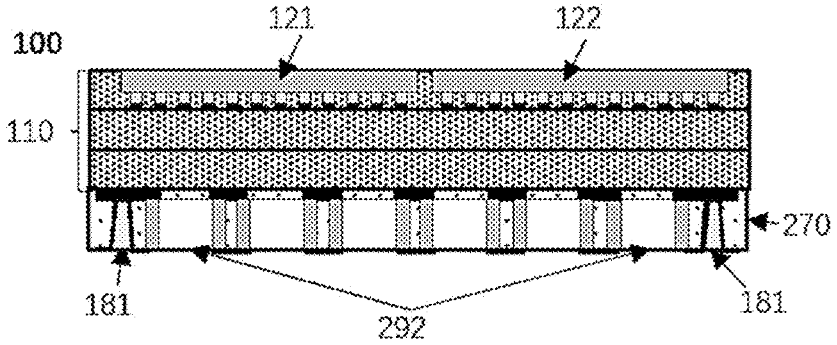

According to the embodiment, the embodiment of arranging the input capacitor assembly 292 below the top plate 110 is provided, that is, the input capacitor assembly 292 is arranged below the IPM unit 121 or 122, and the specific implementation mode is shown in FIG. 15A to FIG. 15D. As shown in embodiment 1 shown in FIG. 15A, the top assembly 100 comprises a top plate 110, IPM units 121 and 122, an input capacitor assembly 292, a power column pin 180 and a plastic package 270. IPM unit 121 and 122 are arranged on the top surface of the top plate 110, the input capacitor assembly 292 and the power column pin 180 are arranged on the bottom surface of the top plate 110 in a welded mode, and the two power column pins 180 are arranged on the two sides of the input capacitor assembly 292 respectively and used for being electrically connected with the input end of the inductor assembly 210. The top plate 110, the IPM units 121 and 122, the input capacitor assembly 292, the power column pins 180 and the plastic packaging material are packaged together to form the plastic package 270. According to the layout disclosed by the embodiment of the application, the cross-sectional area of the module is reduced, and the connection between the top plate 110 and the inductor assembly 210 is not influenced; and when the input capacitor Cin is heated again, and the welding spot is remelted, the phenomenon that the input capacitor Cin falls or shifts is avoided, and the reliability of the module is not influenced. In this embodiment, IPM units 121 and 122 may also be embedded in the top plate 110, as shown in FIG. 15B.

Another difference between the second embodiment shown in FIG. 15B and the first embodiment shown in FIG. 15A lies in that the top assembly 100 does not comprise a power column pin 180, plastic package 270 is formed after the top plate 110 and the input capacitor assembly 292 are molded together, then holes are punched on the two sides of the input capacitor assembly 292, electroplating is carried out, an electrode is led to the surface of the plastic packaging layer to form a power electroplating pin 181, even the surface of the plastic packaging layer is rewiring, and the compatibility of the pin is improved. According to the first embodiment and the second embodiment, because the input capacitor is arranged on the bottom surface of the top plate 110 and reinforced through plastic packaging, regardless of whether the IPM units 121 and 122 are arranged in the top surface of the top plate 110 or embedded in the top plate 110, the thickness of the IPM unit can be reduced as much as possible without worrying about the structural strength of the IPM unit, so that the space utilization rate reaches the extreme.

Figure 15C:
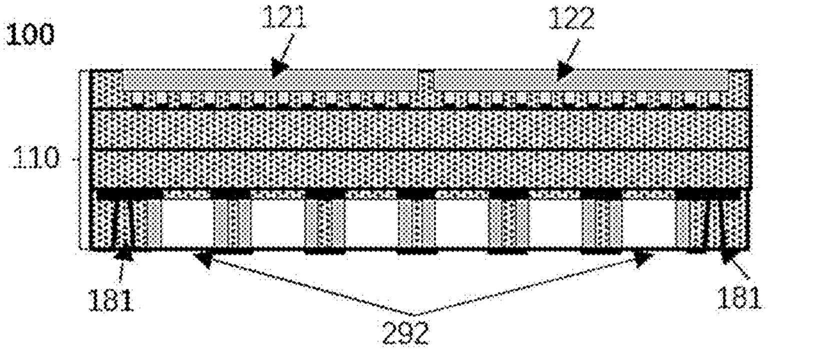

According to the implementation mode 3 of the top assembly structure disclosed by the embodiment, as shown in FIG. 15C, the input capacitor assembly 292 is embedded in the top plate 110, and the input capacitor assembly 292 is electrically connected with the IPM unit through a punching and electroplating process. In the implementation mode, because the input capacitor has no welding spot, a high-temperature remelting phenomenon is avoided, and the problem of production reliability caused by the high-temperature remelting phenomenon is avoided.

Figure 15D:
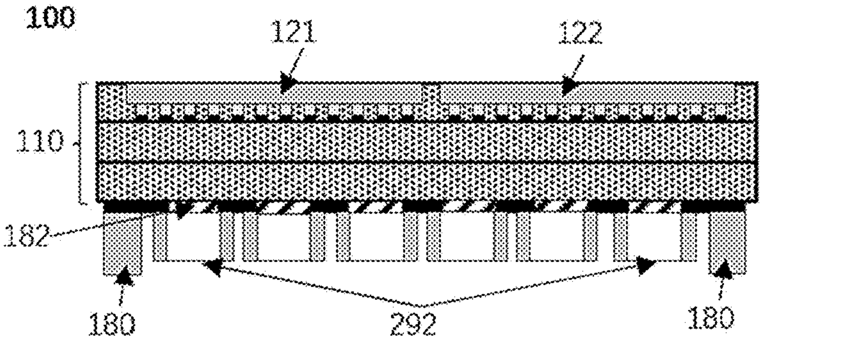

A fourth embodiment of the top assembly structure is as shown in FIG. 15D. The input capacitor assembly 292 and the power column pin 180 are fixed to the bottom surface of the top plate 110 by welding, and the input capacitor Cin and the top plate 110 are filled with an underfill 182. Even after high-temperature remelting, the input capacitor Cin can't fall or move, so that the reliability of the module is influenced. In addition, because the underfill 182 has good fluidity and strong binding force with the capacitor, a capillary effect is not easy to form, and short circuit caused by solder bridging between the two electrodes after high-temperature remelting of the welding spot is avoided. In the present embodiment, the thickness of the input capacitor assembly 292 and the plastic package 270 is 0.8 mm.

Embodiment 13

Figure 16A:
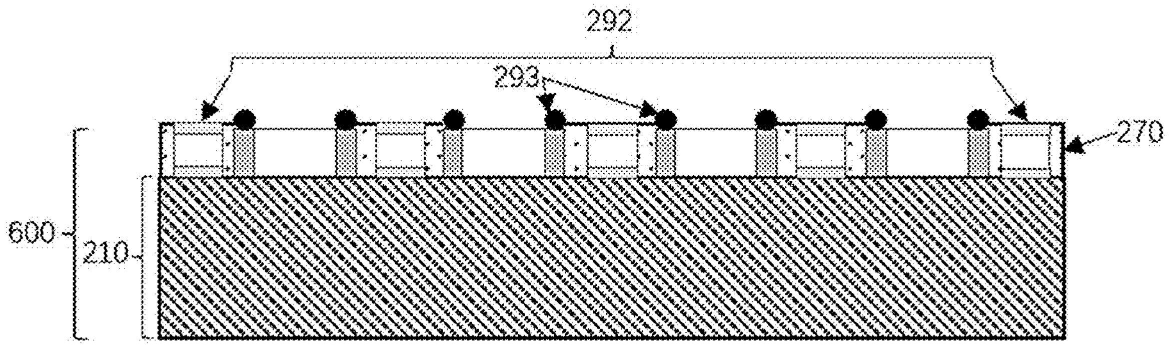
FIG. 16A to FIG. 18 are schematic diagrams of a thirteenth embodiment.
Figure 16B:
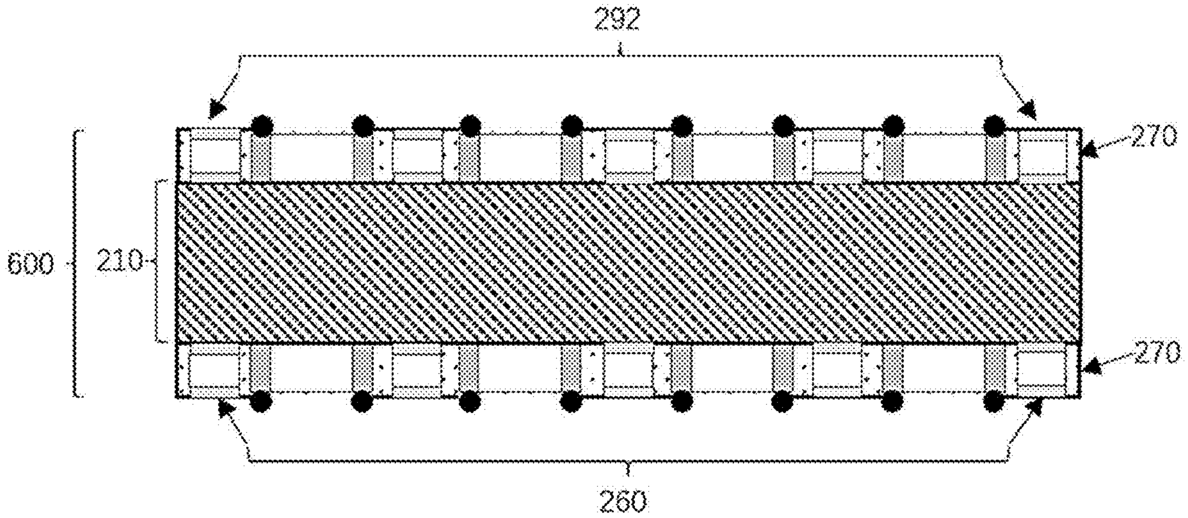

According to the embodiment, the input capacitor assembly 292 is arranged on the inductor assembly 210, as shown in FIG. 16A to FIG. 16D. The integrated assembly 600 shown in FIG. 16A comprises an inductor assembly 210, an input capacitor assembly 292 and a capacitor electrode 293, wherein the input capacitor assembly 292 is arranged on the top surface of the inductor assembly 210, and then is molded together with the inductor assembly 210 to form a plastic package 270; then, the electrode 293 of the capacitor is led out by thinning the plastic package layer or through the laser hole and the electrode 293 of the capacitor; and the electrode 293 of the capacitor is electrically connected with the IPM unit. No welding spot exists between the input capacitor Cin and the inductor assembly 210, and the reliability problem of falling or shifting of the input capacitor Cin due to remelting of the welding spot can be avoided only through plastic package fixing. Similarly, the output capacitor Co may also be disposed on the bottom surface of the inductor assembly 210 by using the same technical means, as shown in FIG. 16B. According to the structure disclosed by the embodiment, the reliability of the module is greatly improved, and the difficulty of the client application module is reduced; and furthermore, under the trend that the switching frequency of the module is increased to MHz or even more than several MHz, the inductor becomes thinner and thinner, so that the structure of the inductor body is not strong enough, the capacitor and the inductor are integrally packaged, and the problem of inductance strength is effectively solved.

Figure 16C:
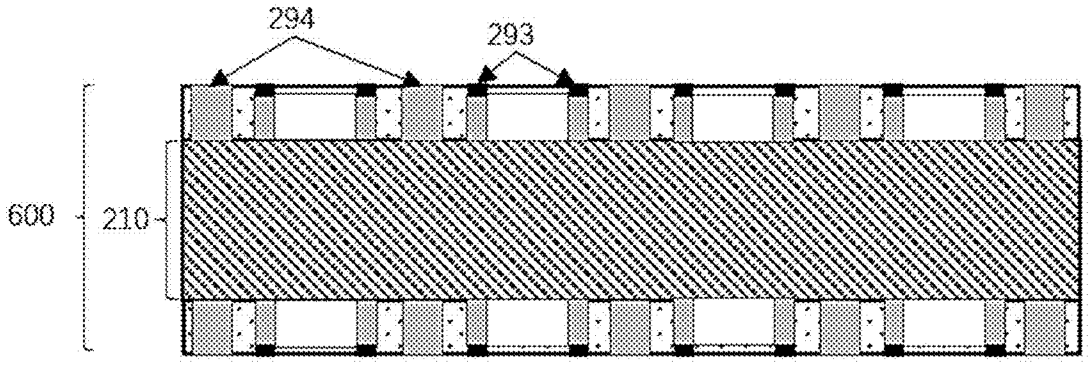
Figure 16D:
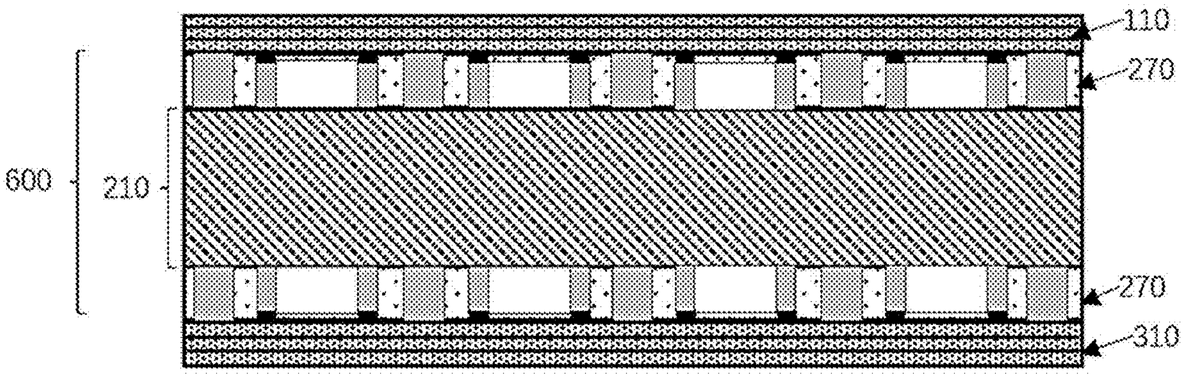

On the basis of the structure shown in FIG. 16A and FIG. 16B, an external electrode 294 of the inductor winding can be led out through laser hole opening electroplating or plastic packaging power column pins, or electroplating is carried out on the surface of the plastic packaging layer to form a power electrical connector or a signal electrical connector. As shown in FIG. 16C. Furthermore, as shown in FIG. 16D, the multi-layer circuit board, namely the top plate 110 and the bottom substrate 310, can be arranged on the surface of the plastic packaging layer, the structural strength of the inductor assembly is further improved, the thickness of welding spots and modules in the module is reduced, and the structural strength of the module is increased and larger.

Figure 17A:
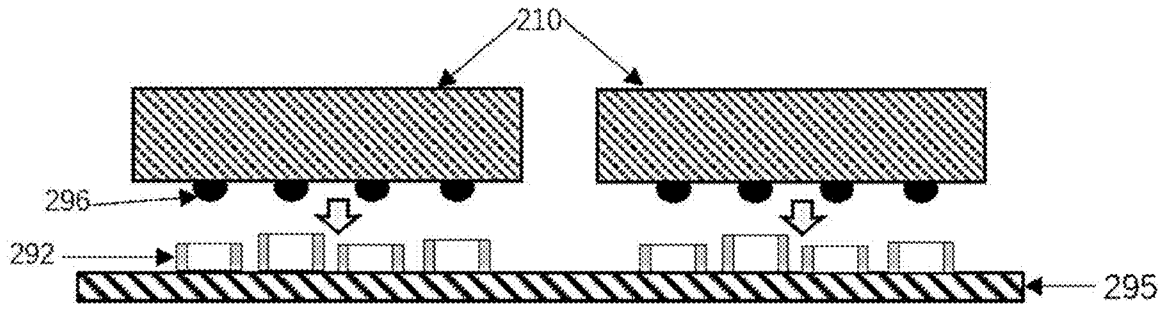

The production process flow of the structure disclosed by the embodiment is shown in FIG. 17A to FIG. 17I, S1 (placement capacitance): as shown in FIG. 17A, the input capacitor assembly 292 is arranged on a leveling carrier 295, so that the bonding surface of the capacitor assembly and the carrier 295 is leveled. Optionally, glue 296 is arranged at the position corresponding to the capacitor on the inductor assembly 210, and the amount of the glue 297 needs to be sufficient to keep the inductors balance.

Figure 17B:
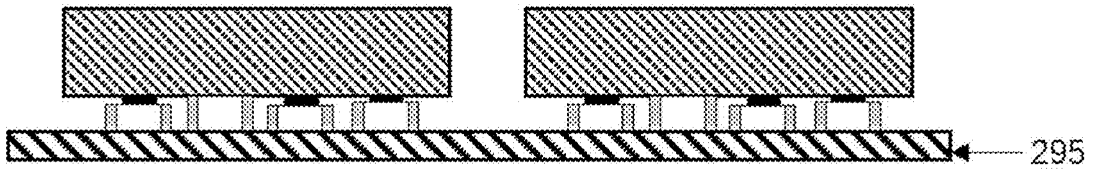

S2 (placing an inductor): as shown in FIG. 17B, the inductor assembly 210 is placed above the input capacitor assembly 292 and pressurized, so that the glue fixes the inductor assembly 210 and the input capacitor assembly 292 together; the glue 297 herein should be as thin as possible, so that the gap between the highest capacitor and the inductor in the input capacitor assembly 292 is as small as possible, and the gap between the highest capacitor and the inductor in the input capacitor assembly 292 is as small as possible, so that the height of the integrated assembly 600 is reduced.

Figure 17C:
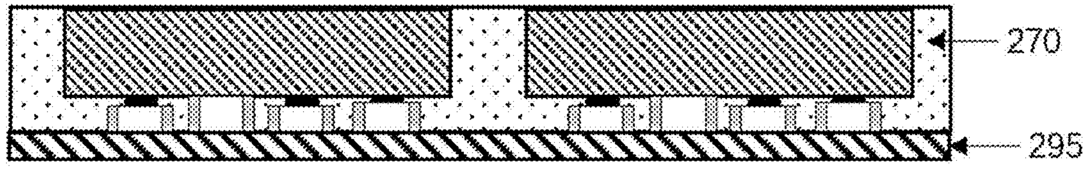

S3 (plastic packaging): as shown in FIG. 17C, carrying out plastic packaging on the carrier 295, the input capacitor assembly 292 and the inductor assembly 210, filling a gap between the input capacitor array 292 and the inductor assembly 210 with the plastic packaging material, and fixing the two together.

Figure 17D:
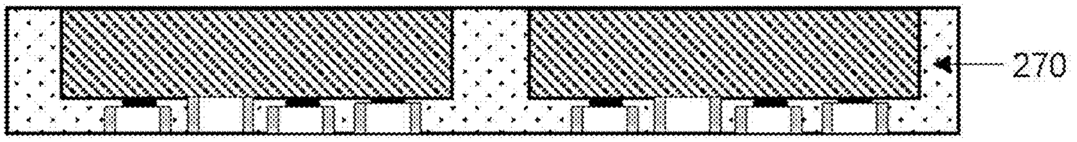

S4 (removing the carrier): as shown in FIG. 17D, removing the carrier 295, removing part of the plastic packaging material on the surface of the plastic packaging layer 270, and exposing the pins of the capacitor.

Figure 17E:
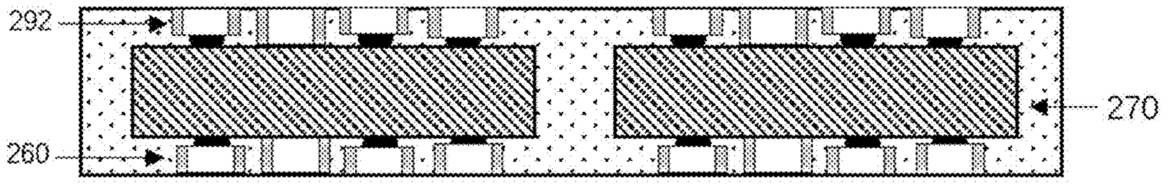

In the production process flow, as shown in FIG. 17E, S1 (placement capacitance) and S2 (placing an inductor) can be repeated after S2 (placing an inductor), an output capacitor assembly 260 is arranged on the other face of the inductor assembly 210, and then S3 (plastic packaging) and S4 (removing the carrier).

In the production process flow, the gap between the capacitor and the inductor assembly is reduced, and the plastic packaging material on the outer surface of the capacitor can also be very thin, so that the space utilization rate of the integrated body of the capacitor and the inductor assembly is extremely high. If the capacitor needs to be integrated on the multi-surface of the inductor assembly, the capacitor can be preset on the required surface of the inductor assembly before plastic packaging.

Figure 17F:
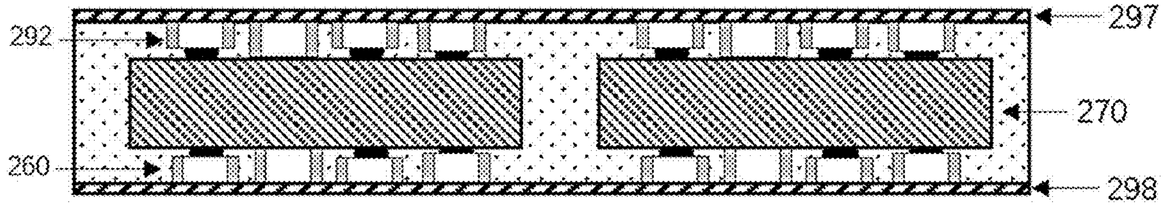

Furthermore, the production process flow disclosed by the application can also comprise:

S5 (coating): laminating thin film layers 297 and 298 on the surface of the plastic package 270, as shown in FIG. 17F.

Figure 17G:
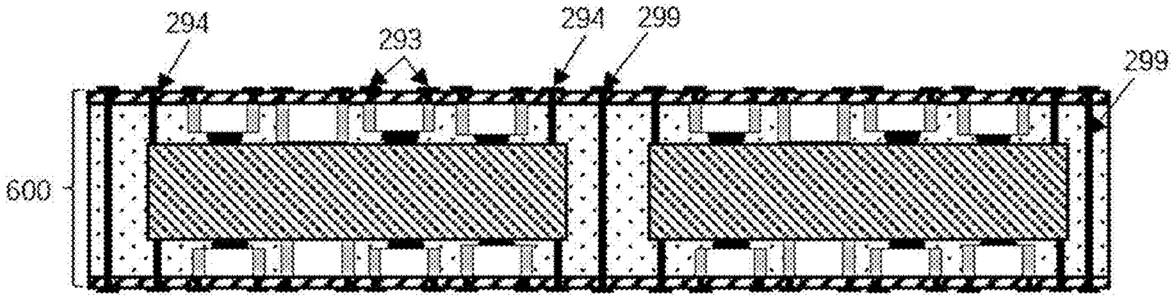

S6 (punching wiring): punching, electroplating, leading out the external electrodes 293 and 294 of the capacitor and the inductor winding and the signal pin 299 at positions corresponding to the capacitor electrode and the winding electrode, to form the inductor assembly 210, as shown in FIG. 17G.

Figure 17H:
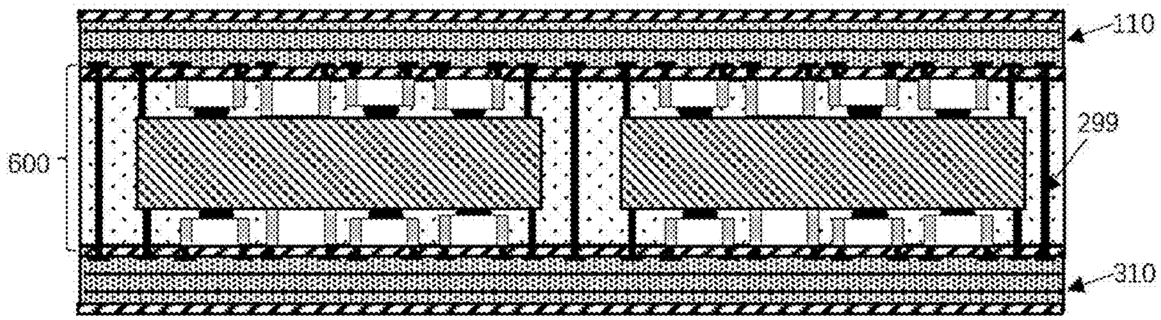

S7 (substrate): as shown in FIG. 17H, growing a top plate 110 and a bottom substrate 310 on the top surface and the bottom surface of the inductor assembly 210 according to a PCB process; forming a bonding pad on the upper surface of the top plate 110 and used for being electrically connected with an IPM unit or other chips; and forming a bonding pad on the lower surface of the bottom substrate 310 for electrically connecting to the system mainboard.

Figure 17I:
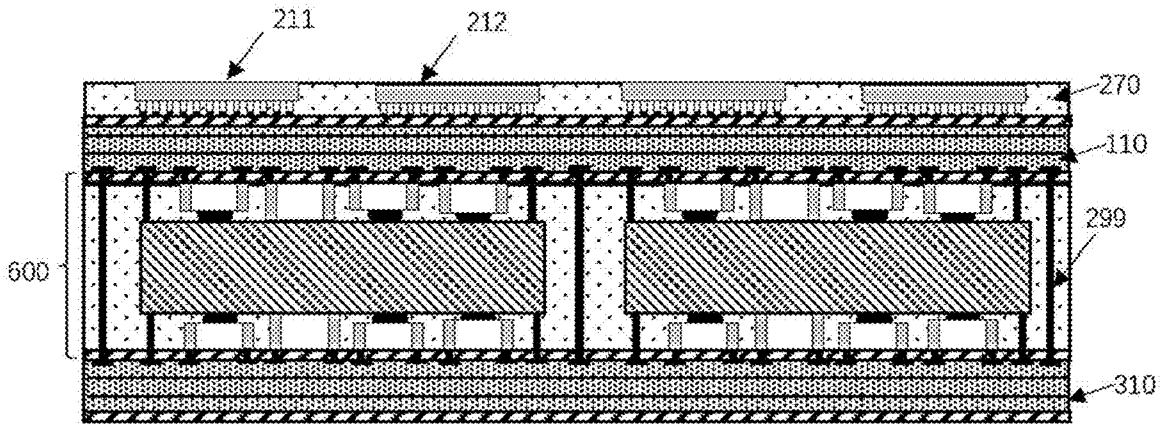

Then, IPM units 211 and 212 can be arranged on the upper surface of the top plate 110, as shown in FIG. 17I, but not limited thereto, and a silicon capacitor, an SPS/DrMOS, a controller, a driver, a Power IC and the like can also be arranged on the upper surface of the top plate 110. e, and an IC bare chip with a long copper column or a copper ball can also be arranged on it. Optionally, the upper surface of the top plate 110 and the components arranged on the upper surface are subjected to plastic packaging.

Figure 18:
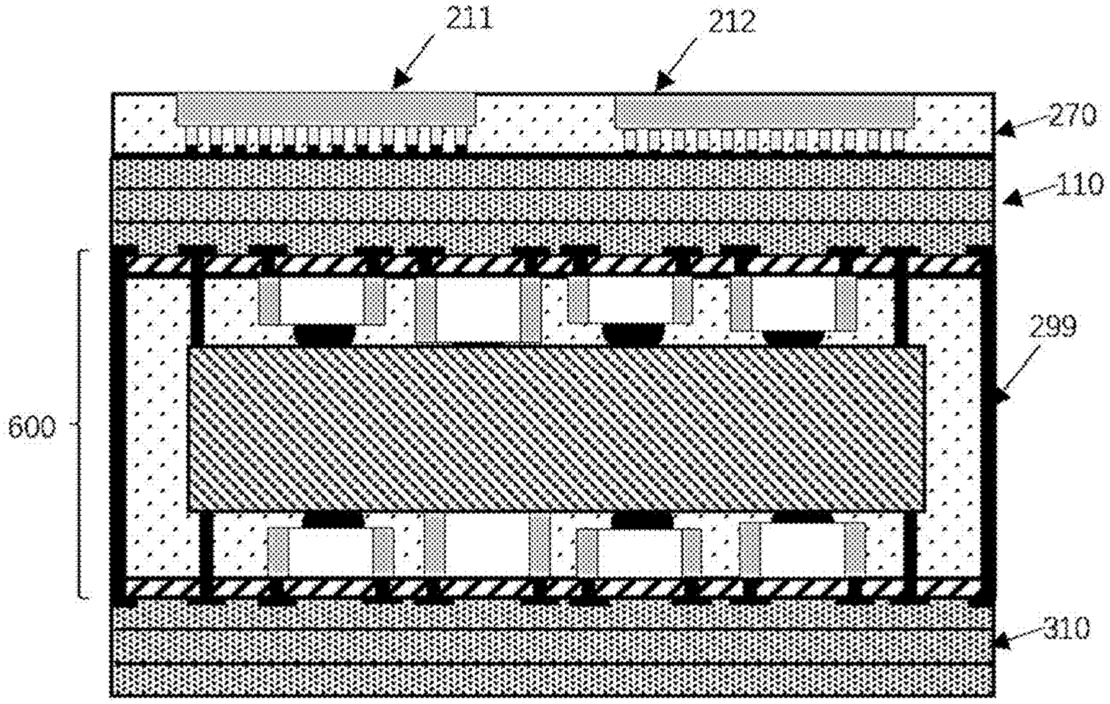

The eleventh embodiment to the thirteenth embodiment adopt two module splicing plates as an example for description, but are not limited thereto, and can also be used for carrying out the production process flow for three or more module splicing plates, and only the cutting and separating plates need to be carried out after the steps are finished; and the production process flow is also suitable for single module production. As shown in FIG. 18.

Embodiment 14

As the working frequency of the integrated power converter module becomes higher and higher, the requirement for the frequency characteristic of the input capacitor Cin is higher and higher, and the requirement on the capacitance value of the input capacitor Cin is lower and lower. Therefore, a practical semiconductor capacitor 215 (such as a silicon capacitor) needs to be used as a first-stage filter capacitor, that is, in the module, the input capacitor Cin comprises two types of ceramic capacitors and semiconductor capacitors.

Figure 19A:
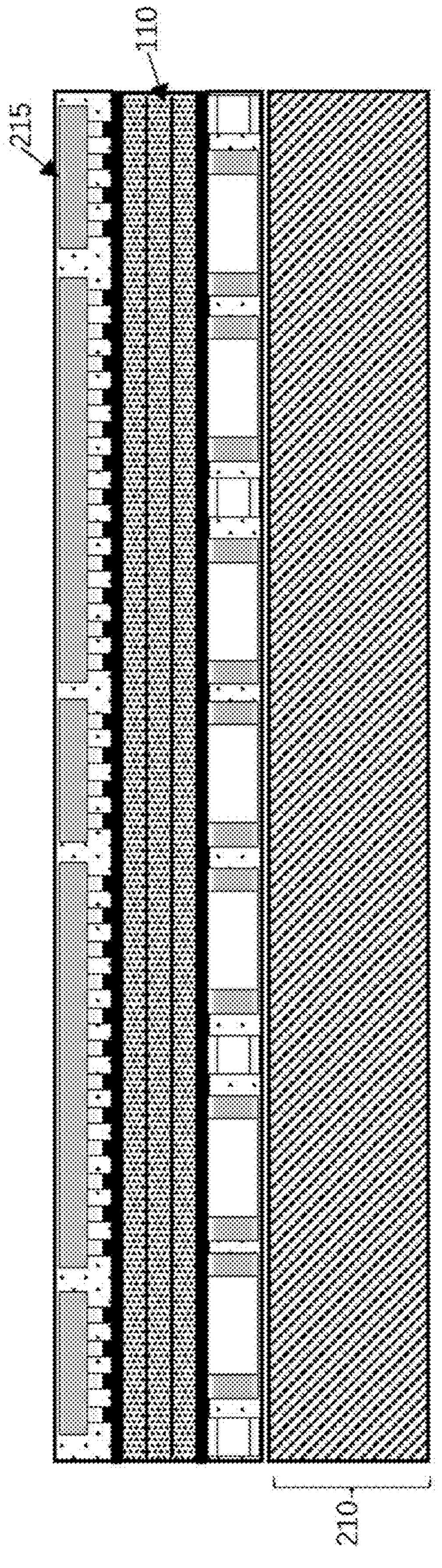
FIG. 19A to FIG. 19C are schematic diagrams of a fourteenth embodiment.

The input capacitor Cin and the output capacitor Co disclosed by the application are described by taking the ceramic capacitor as an example, but are not limited to the method, the semiconductor capacitor or other capacitors can adopt in the module structure and the production process flow disclosed by the application, and the same benefits can also be obtained. As shown in FIG. 19A, other semiconductor wafers can be arranged on the top surface of the top plate 110, such as intelligent power-level SPS, DrMOS, a controller, a driver, a Power IC and the like. The semiconductor capacitor can also be arranged at the position close to the semiconductor wafer, and the ceramic capacitor is arranged on the bottom surface of the top plate 210, so that a multi-stage decoupling mechanism is formed, and the high-frequency requirement of the module is met. In other aspects, the semiconductor capacitor 215 may also be disposed on the bottom surface of the top plate 210 to perform a desired function with the ceramic capacitor.

Figure 19B:
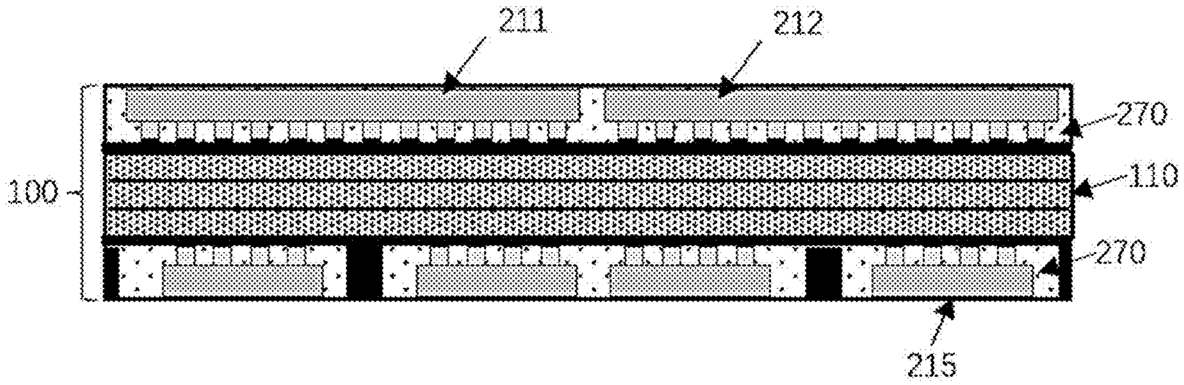
Figure 19C:
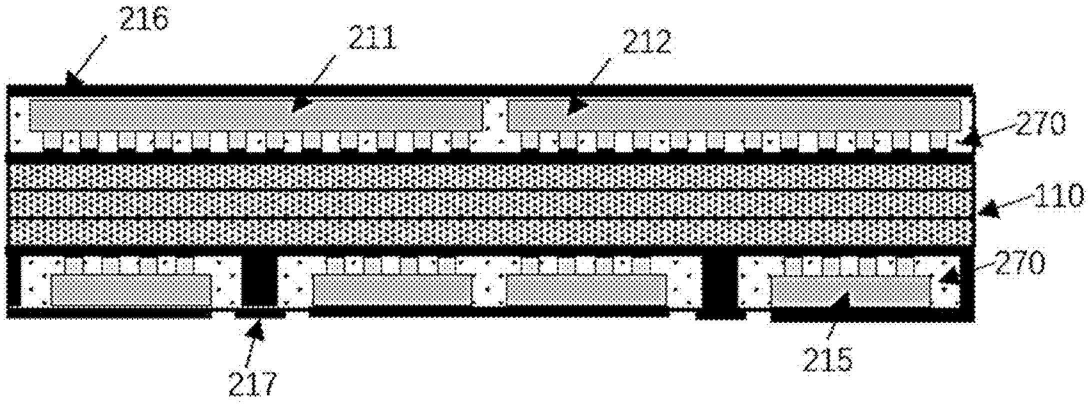

As shown in FIG. 19B, the bare chip of IPM unit 211/212 and the semiconductor capacitor 215 are respectively arranged on the top surface and the bottom surface of the top plate 210, then the plastic package is thinned after integral plastic packaging, and the thickness of the top component 100 can be 0.8 mm, so that the thickness of the module can reach 2.5 mm, and the module with the thickness can meet the application of all current occasions; the current density is large, the thickness is thin, and the double-sided heat dissipation function of the module can be achieved at the same time. In this embodiment, the top surface and the bottom surface of the plastic package 270 as shown in FIG. 19B can be electroplated to respectively form a protective layer 216 and a pad 217, as shown in FIG. 19C.

The embodiment of the application is mainly used for a buck-type circuit, can also be applied to a boost-type circuit or a buck-boost-type circuit, and is very suitable for applications including a high-frequency switch, a high-frequency capacitor and a high-frequency inductor even for Class D active power amplifiers.

It will be apparent to those skilled in the art that the present application is not limited to the details of the exemplary embodiments described above, and that the present application can be embodied in other specific forms without departing from the spirit or essential characteristics of the application. Therefore, regardless of which point the embodiments should be considered as exemplary and not restrictive, the scope of the application is defined by the appended claims rather than by the foregoing description, and therefore, it is intended that all changes which come within the meaning and range of equivalency of the claims are to be embraced within their scope. Any reference signs in the claims should not be regarded as limiting the involved claims.

In addition, it should be understood that although the description is described in terms of implementations, but not every implementation includes only one independent technical solution, the description is merely for clarity, a person skilled in the art should use the description as a whole, and the technical solutions in the embodiments may also be appropriately combined to form other embodiments that can be understood by a person skilled in the art.

What is claimed is:

1. An integrated assembly, comprising an inductor assembly and a first capacitor assembly, wherein a top surface pin is arranged on a top surface of the integrated assembly, a bottom surface pin is arranged on a bottom surface of the integrated assembly, wherein the inductor assembly comprises a magnetic core and a main winding passing through the magnetic core from a top surface of the magnetic core to a bottom surface of the magnetic core, wherein one surface of the magnetic core is provided with a capacitor setting area, wherein the first capacitor assembly is arranged in the capacitor setting area, wherein the bottom surface of an electrode of the first capacitor assembly is coplanar with the bottom surface pin of the inductor assembly, and the top surface of the first capacitor assembly is electrically isolated from the surface of the magnetic core.

2. The integrated assembly of claim 1, wherein the capacitor setting area is arranged on the bottom surface of the magnetic core, the bottom surface of the electrode of the first capacitor assembly is coplanar with the bottom surface pin of the inductor assembly.

3. The integrated assembly of claim 2, wherein the integrated assembly further comprises a second capacitor assembly, wherein the top surface of the magnetic core is provided with an another capacitor arrangement area, and the second capacitor assembly is arranged in the capacitor arrangement area at the top surface of the magnetic core, wherein the top surface of an electrode of the second capacitor component and the top surface pin of the inductor assembly are coplanar, a bottom surface of the second capacitor component is electrically isolated from the magnetic core, and the second capacitor component is electrically isolated from the main winding.

4. The integrated assembly of claim 1, wherein the first capacitor assembly is a layered capacitor, wherein the layered capacitor comprises a first electrical pole plate, a second electrical pole plate and a dielectric layer which are stacked layer by layer, a hole groove is formed in the position, corresponding to the main winding, of the layered capacitor, the first electrical pole plate is electrically connected with a first electrical bonding pad arranged around the hole groove, the second electrical pole plate is electrically connected with a second electrical bonding pad arranged on at least one side face of the layered capacitor, and the dielectric layer is arranged between the first electrical pole plate and the second electrical pole plate.

5. The integrated assembly of claim 4, wherein the layered capacitor is arranged in the capacitor setting area in a manner of firstly sintering and forming and then assembling.

6. The integrated assembly of claim 4, wherein the layered capacitor is formed by in-situ sintering forming through a capacitor blank.

7. The integrated assembly of claim 1, further comprising an integrated substrate, wherein the inductor assembly and the first capacitor assembly are buried in the integrated substrate, and the top surface pin and the bottom surface pin are arranged on a top surface of the integrated substrate and a bottom surface of the integrated substrate respectively.

8. The integrated assembly of claim 7, wherein the integrated substrate comprises a bottom wiring layer, wherein the bottom wiring layer is used for rearranging bottom surface pins of the integrated assembly, wherein the integrated substrate further comprises a vertical electrical connector, and/or, wherein a vertical electrical connector is arranged on a side face of the inductor assembly, wherein one end of the vertical electrical connector is electrically connected to the bottom wiring layer, wherein at least one part of the vertical electrical connector is a power electrical connector, and at least one part of the vertical electrical connector is a signal electrical connector.

9. The integrated assembly of claim 8, wherein the first capacitor assembly is an output assembly, the output capacitor assembly is arranged on the bottom surface of the magnetic core, one electrode of the output capacitor assembly is electrically connected with the main windings through the bottom wiring layer.

10. The integrated assembly of claim 7, wherein the integrated substrate comprises a top wiring layer and a bottom wiring layer, wherein the integrated assembly further comprises a top assembly, the top assembly comprises a top plate and IPM unit, wherein the top wiring layer is electrical connected with the top assembly, the bottom wiring layer is used for rearranging bottom surface pins of the integrated assembly, wherein the integrated assembly further comprises a vertical electrical connector, wherein the vertical electrical connector is arranged on a side face of the inductor assembly, wherein two ends of the vertical electrical connector are electrically connected to the top wiring layer and the bottom wiring layer.

11. The integrated assembly of claim 1, further comprising an insulated substrate, wherein one surface of the insulated substrate is adjacent to the capacitor setting area, the first capacitor assembly is arranged on the other surface of the insulated substrate, wherein the insulated substrate comprises two holes, wherein the main winding penetrates the two holes, the insulated substrate is used for electrical insulation between the first capacitor assembly and the magnetic core.

12. The integrated assembly of claim 1, wherein the capacitor setting area is a concave, the concave is connected with one side surface of the magnetic core.

13. The integrated assembly of claim 12, wherein the concave is connected with two opposite surfaces of the magnetic core.

14. The integrated assembly of claim 7, wherein the integrated substrate further comprises a vertical electrical connector, and/or, wherein a vertical electrical connector is arranged on the side face of the inductor assembly, wherein two ends of the vertical electrical connector have a top surface pin on the top surface of the magnetic core, and a bottom pin on the bottom surface of the magnetic core, wherein at least one part of the vertical electrical connector is a power electrical connector; and at least one part of the vertical electrical connector is a signal electrical connector.

15. The integrated assembly of claim 1, wherein the first capacitor assembly and the magnetic core are fixedly connected through adhesive glue.

16. The integrated assembly of claim 7, wherein the integrated assembly further comprises at least one middle plastic package, wherein the middle plastic package covers at least one part of the surface of the inductor assembly and the first capacitor assembly, and the middle plastic package is provided with an electrical connection window at a position corresponding to an electrode of the inductor assembly and an electrode of the first capacitor assembly.

17. The integrated assembly of claim 1, wherein the first capacitor assembly comprises an integrated silicon capacitor.

18. The integrated assembly of claim 1, wherein the first capacitor assembly comprises a plurality of capacitor elements, and electrodes of the plurality of capacitor elements are arranged in a triangle staggered array.

19. The integrated assembly of claim 1, further comprising an auxiliary winding corresponding to the main winding, wherein the auxiliary winding is arranged adjacent to the corresponding main winding side by side, the auxiliary winding is electrically isolated from the corresponding main winding and has magnetic coupling, and the auxiliary winding is used for realizing a TLVR technology.

20. The integrated assembly of claim 19, wherein the auxiliary winding and the main winding are respectively provided with a transverse detouring section, the auxiliary winding and the corresponding main winding have magnetic coupling in a transverse detour section, and two ends of the auxiliary winding are arranged on the bottom surface of the magnetic core.

21. The integrated assembly of claim 20, wherein an end face of the main winding located on the bottom surface of the magnetic core is provided with a chamfer or a corner notch, and one end face of the corresponding auxiliary winding is arranged at a position close to the chamfer or the corner notch.

22. The integrated assembly of claim 20, wherein a wiring conversion layer is further arranged on the bottom surface of the integrated assembly, and the wiring conversion layer is used for rearranging bottom pins of the integrated assembly, and a number of the main windings is two, and the auxiliary windings are connected in series through the wiring conversion layer to form a two-phase TLVR loop.

23. He integrated assembly of claim 1, wherein a number of the main windings is two, the main windings are respectively provided with a transverse detour section, and when a direction from the top surface of the magnetic core to the bottom surface of the magnetic core is a positive direction of the current, current directions in the two transverse detour sections are opposite, wherein the inductor assembly further comprises an auxiliary winding, the auxiliary winding is in a loop shape, at least two parts of the auxiliary winding are arranged adjacent to two transverse winding sections side by side respectively, and the auxiliary winding is used for realizing a TLVR technology.

24. The integrated assembly of claim 1, further comprising a metal shielding layer, wherein the metal shielding layer is arranged on a side surface of the integrated assembly.

* * * * *